(12) United States Patent
Koezuka et al.

(10) Patent No.: US 9,171,803 B2
(45) Date of Patent: Oct. 27, 2015

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventors: Junichi Koezuka, Tochigi (JP); Masami Jintyou, Tochigi (JP); Yukinori Shima, Gunma (JP); Takahiro Iguchi, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/306,862

(22) Filed: Jun. 17, 2014

(65) Prior Publication Data

US 2014/0374908 A1 Dec. 25, 2014

(30) Foreign Application Priority Data

Jun. 21, 2013 (JP) ................... 2013-130477

(51) Int. Cl.
| | |
|---|---|
| *H01L 29/15* | (2006.01) |
| *H01L 23/532* | (2006.01) |
| *H01L 21/768* | (2006.01) |
| *H01L 29/786* | (2006.01) |
| *H01L 51/00* | (2006.01) |
| *G02F 1/1333* | (2006.01) |
| *G02F 1/1362* | (2006.01) |

(52) U.S. Cl.
CPC ...... *H01L 23/53238* (2013.01); *H01L 21/7685* (2013.01); *H01L 29/786* (2013.01); *H01L 51/00* (2013.01); *G02F 1/133345* (2013.01); *G02F 1/136204* (2013.01); *G02F 2001/136295* (2013.01); *G02F 2201/50* (2013.01); *H01L 23/53223* (2013.01); *H01L 23/53252* (2013.01)

(58) Field of Classification Search
CPC ............... H01L 23/53238; H01L 21/7685; H01L 23/53223; H01L 23/53252
USPC ........................................... 257/72
See application file for complete search history.

(56) References Cited

U.S. PATENT DOCUMENTS

| | | | |
|---|---|---|---|
| 7,511,300 B2* | 3/2009 | Lee et al. .................. | 257/59 |
| 7,652,740 B2 | 1/2010 | Hwang et al. | |
| 7,919,795 B2* | 4/2011 | Lee et al. ................... | 257/288 |
| 8,344,374 B2 | 1/2013 | Yamazaki et al. | |

(Continued)

FOREIGN PATENT DOCUMENTS

JP 2004-133422 4/2004

*Primary Examiner* — Luan C Thai
(74) *Attorney, Agent, or Firm* — Husch Blackwell LLP

(57) ABSTRACT

To improve the reliability of a semiconductor device including a low-resistance material such as copper, aluminum, gold, or silver as a wiring. Provided is a semiconductor device including a pair of electrodes electrically connected to a semiconductor layer which has a stacked-layer structure including a first protective layer in contact with the semiconductor layer and a conductive layer containing the low-resistance material and being over and in contact with the first protective layer. The top surface of the conductive layer is covered with a second protective layer functioning as a mask for processing the conductive layer. The side surface of the conductive layer is covered with a third protective layer. With this structure, entry or diffusion of the constituent element of the pair of conductive layers containing the low-resistance material into the semiconductor layer is suppressed.

16 Claims, 22 Drawing Sheets

(56) References Cited

U.S. PATENT DOCUMENTS

| | | |
|---|---|---|
| 2012/0248450 A1 * | 10/2012 | Yaneda et al. ............... 257/59 |
| 2013/0032793 A1 | 2/2013 | Kim et al. |
| 2013/0207111 A1 | 8/2013 | Yamazaki |
| 2013/0302938 A1 | 11/2013 | Sato et al. |
| 2014/0021466 A1 | 1/2014 | Yamazaki et al. |
| 2014/0291672 A1 | 10/2014 | Yamazaki et al. |

* cited by examiner

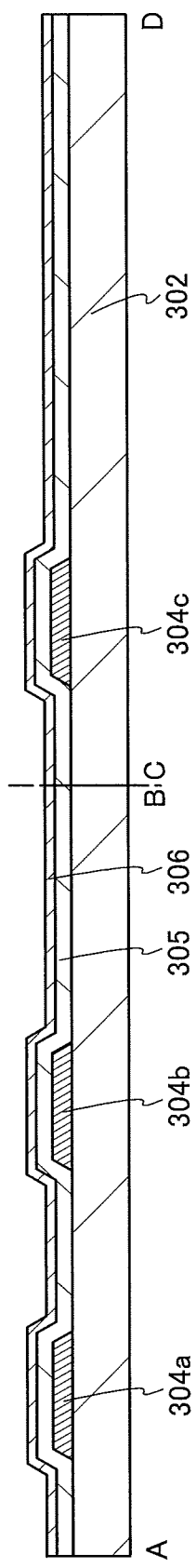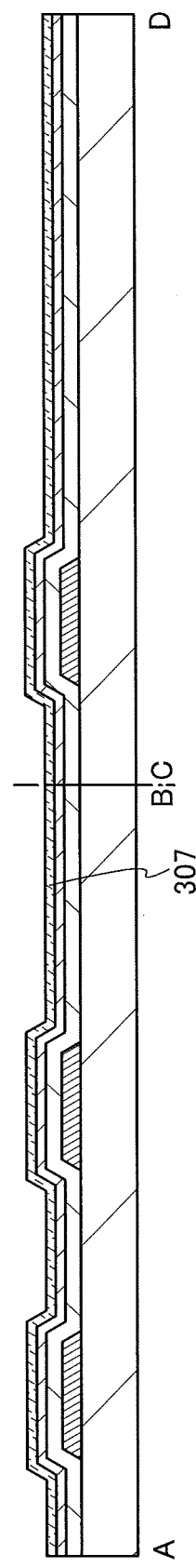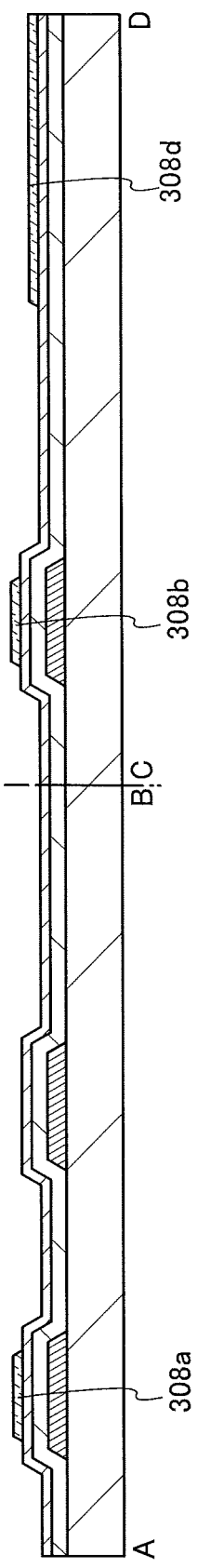

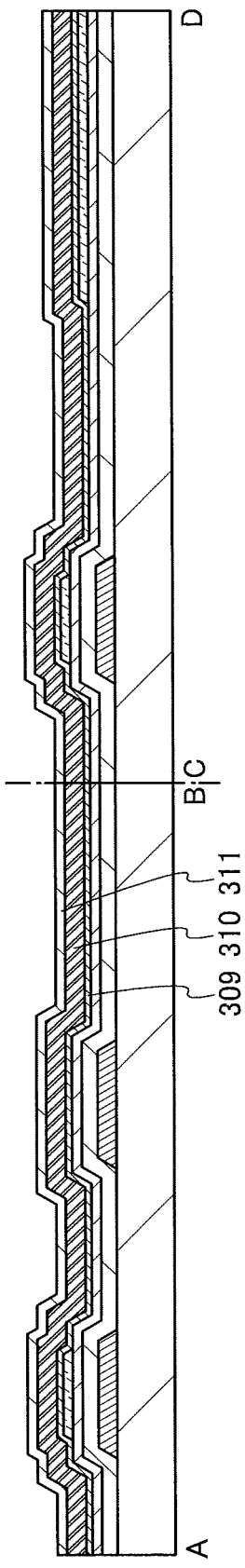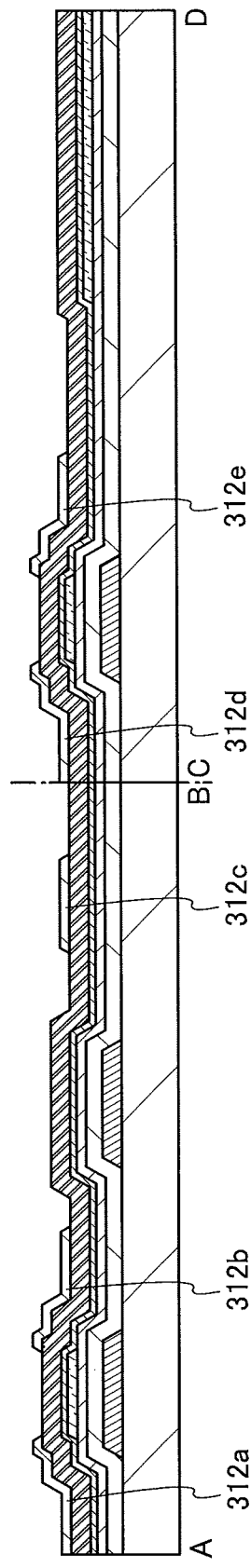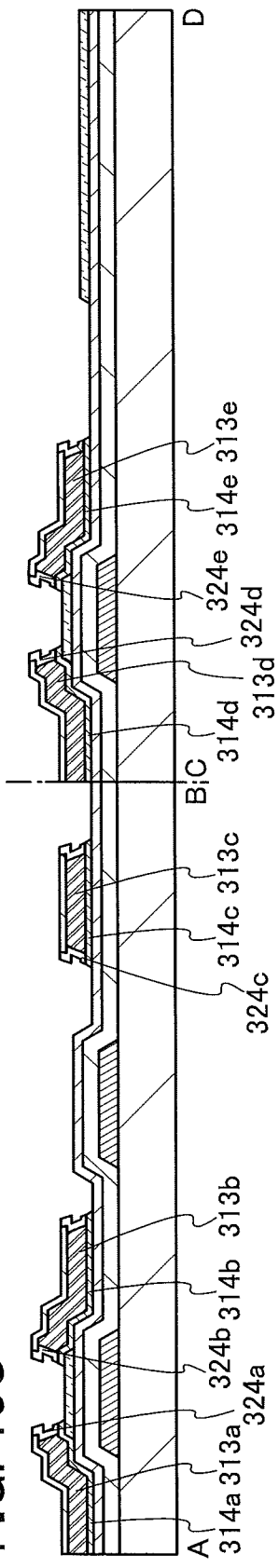

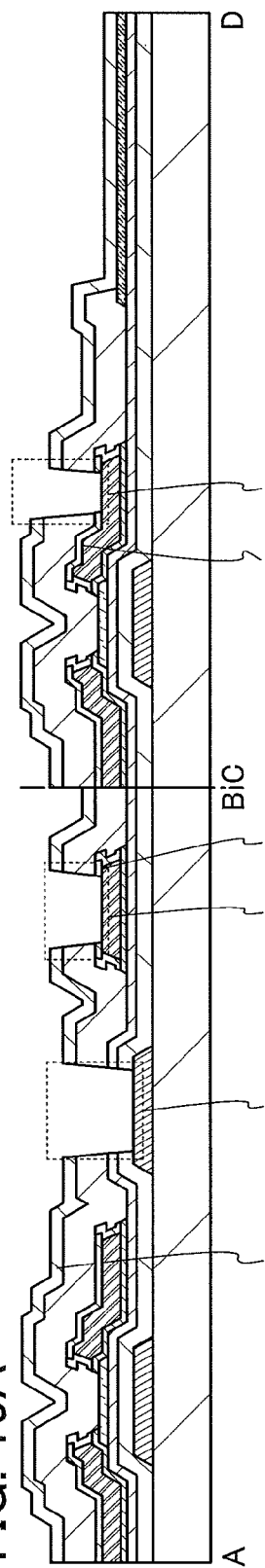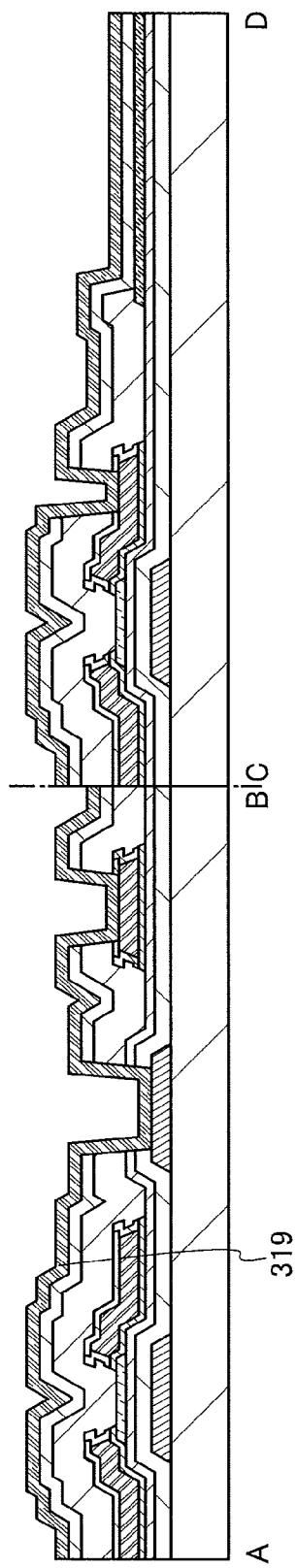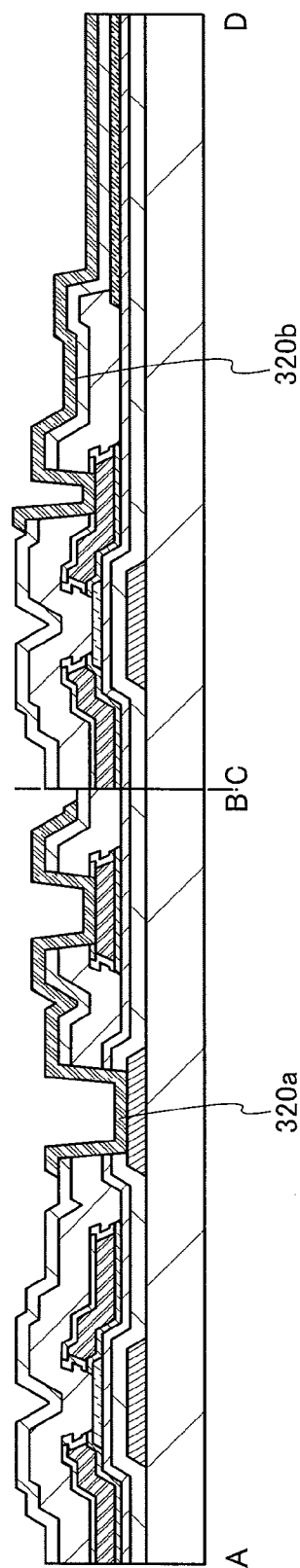

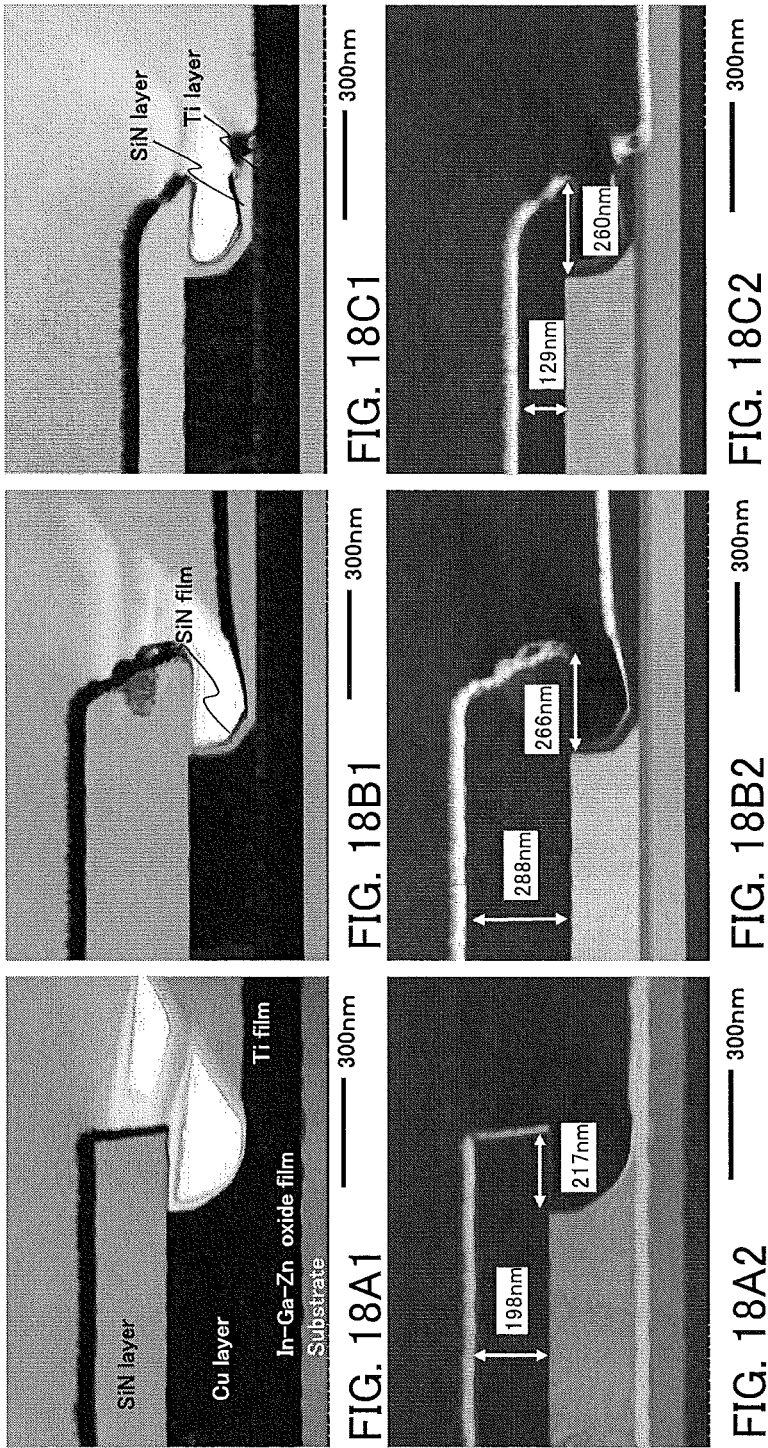

CAAC-OS nc-OS

Total amount of electron irradiation ($10^8 e^-/nm^2$)

as-sputtered | after heat treatment at 450 °C

☐ Proportion of non-CAAC  ▤ Proportion of CAAC as-sputtered after heat treatment at 450 °C

SEMICONDUCTOR DEVICE AND MANUFACTURING METHOD THEREOF

BACKGROUND OF THE INVENTION

1. Field of the Invention

One embodiment of the invention disclosed in this specification relates to a semiconductor device and a manufacturing method thereof.

2. Description of the Related Art

Transistors used for most flat panel displays typified by liquid crystal display devices and light-emitting display devices are formed using silicon semiconductors such as amorphous silicon, single crystal silicon, and polycrystalline silicon provided over glass substrates. Further, such a transistor employing such a silicon semiconductor is used in integrated circuits (ICs) and the like.

Further, the increase in size and definition of a flat panel display increases the driving frequency, the resistance, and the parasitic capacitance of a wiring, leading to wiring delay. In order to inhibit the wiring delay, a technique for forming a wiring using a low-resistance material such as copper, aluminum, gold, and silver has been studied (Patent Document 1).

REFERENCE

Patent Document

[Patent Document 1] Japanese Published Patent Application No. 2004-133422

SUMMARY OF THE INVENTION

However, there are problems in that copper, aluminum, gold, silver, or the like, which is a constituent element of the wiring, is difficult to process, and they are diffused in a semiconductor layer in the processing.

Copper, aluminum, gold, silver, and the like, which are constituent elements of the wiring, are impurities causing poor electrical characteristics of a transistor. Therefore, there is a problem in that entry of the impurities into the semiconductor layer reduces the resistance of the semiconductor layer and the amount of change in electrical characteristics, typically in threshold voltage, of the transistor is increased by change over time or a stress test.

An object of one embodiment of the present invention is to improve the reliability of a semiconductor device including a wiring containing a low-resistance material such as copper, aluminum, gold, or silver.

Note that the descriptions of these objects do not disturb the existence of other objects. In one embodiment of the present invention, there is no need to achieve all the objects. Objects other than the above objects will be apparent from and can be derived from the description of the specification and the like.

A semiconductor device of one embodiment of the present invention includes a pair of electrodes electrically connected to a semiconductor layer. Each of the pair of electrodes has a stacked-layer structure including a first protective layer in contact with the semiconductor layer and a conductive layer containing a low-resistance material and being over and in contact with the first protective layer. The top surface of the conductive layer is covered with a second protective layer functioning as a mask for processing the conductive layer. The side surface of the conductive layer is covered with a third protective layer. With this structure, entry or diffusion of the constituent element of the pair of conductive layers containing a low-resistance material into the semiconductor layer is suppressed.

In a formation step of the electrodes, the first protective layer and the conductive layer containing a low-resistance material are processed in different etching steps. When the conductive layer is processed, the semiconductor layer is covered with a film to be the first protective layer. When the first protective layer is processed, the top surface of the processed conductive layer is covered with the second protective layer, and the side surface of the processed conductive layer is covered with the third protective layer. With this structure, entry or diffusion of the constituent element of the conductive layer into the semiconductor layer can be suppressed in the foimation step of the electrodes.

In addition, the first and third protective layers can be formed in a self-aligned manner by anisotropic etching using the second protective layer as an etching protective film. Consequently, the protective layers (the first, second, and third protective layers) surrounding the conductive layer can be formed without increasing the number of photomasks for the formation step of the pair of electrodes. Accordingly, a highly reliable semiconductor device can be provided with high productivity.

More specifically, the following structures can be employed for example.

One embodiment of the present invention is a semiconductor device including a semiconductor layer, a conductive layer, a first protective layer, a second protective layer, and a third protective layer. The bottom surface of the conductive layer is in contact with the first protective layer. The top surface of the conductive layer is in contact with the second protective layer. The side surface of the conductive layer is in contact with the third protective layer. The semiconductor layer is in contact with the first protective layer. The conductive layer contains copper, aluminum, gold, or silver. The bottom edge of the side surface of the third protective layer coincides with the top edge of the side surface of the first protective layer.

One embodiment of the present invention is a semiconductor device including a semiconductor layer, a conductive layer, a first protective layer, a second protective layer, and a third protective layer. The bottom surface of the conductive layer is in contact with the first protective layer. The top surface of the conductive layer is in contact with the second protective layer. The side surface of the conductive layer is in contact with the third protective layer. The semiconductor layer is in contact with the first protective layer. The conductive layer contains copper, aluminum, gold, or silver. The bottom edge of the side surface of the third protective layer coincides with the top edge of the side surface of the first protective layer. The top surface of the first protective layer is in contact with the conductive layer and the third protective layer. The bottom surface of the second protective layer is in contact with the conductive layer and the third protective layer.

In the above, the first protective layer is a layer having conductivity. The conductive layer is preferably formed using titanium, tantalum, tungsten, molybdenum, an alloy of any of these materials, titanium nitride, tantalum nitride, tungsten nitride, or molybdenum nitride.

In any one of the above semiconductor devices, the thickness of the semiconductor layer in a region being in contact with the first protective layer may be larger than the thickness of the semiconductor layer in the other regions.

In any one of the above semiconductor devices, the semiconductor layer is preferably an oxide semiconductor layer containing indium, gallium, or zinc.

Another embodiment of the present invention is a method of manufacturing a semiconductor device including the steps of: forming, over a semiconductor layer, a first protective film as a first protective layer, a conductive film containing copper, aluminum, gold, or silver, and a second protective film as a second protective layer; forming a first mask over the second protective film; processing the second protective film using the first mask to form the second protective layer; processing the conductive film using the second protective layer as a mask to form a conductive layer; forming a third protective film in contact with the side surface and the top surface of the second protective layer, the side surface of the conductive layer, and a region of the first protective film exposed from the conductive layer; and processing the third protective film and the first protective film by anisotropic etching to form the first protective layer between the conductive layer and the semiconductor layer and form a third protective layer in contact with the side surface of the conductive layer.

According to one embodiment of the present invention, the reliability of a semiconductor device including a low-resistance material such as copper, aluminum, gold, or silver as a wiring.

BRIEF DESCRIPTION OF THE DRAWINGS

FIGS. 12A to 12C are cross-sectional views illustrating one embodiment of a method of manufacturing a semiconductor device.

FIGS. 13A to 13C are cross-sectional views illustrating one embodiment of a method of manufacturing a semiconductor device.

FIGS. 15A to 15C are cross-sectional views illustrating one embodiment of a method of manufacturing a semiconductor device.

FIGS. 18A1 and 18A2, FIGS. 18B1 and 18B2, and FIGS. 18C1 and 18C2 are cross-sectional images of electrodes fabricated in Example.

DETAILED DESCRIPTION OF THE INVENTION

Figure 1A:
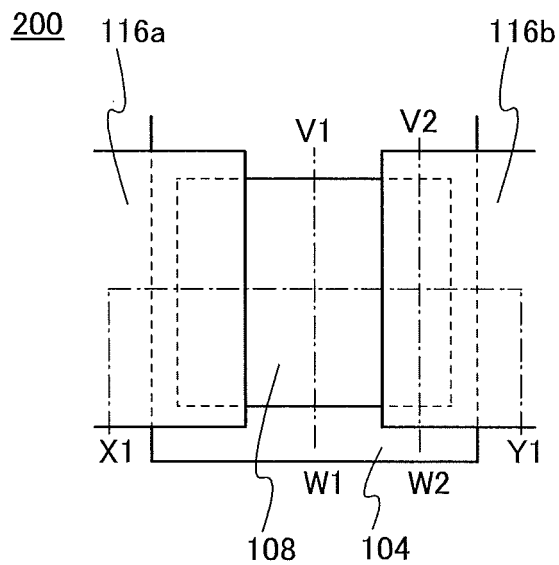
FIG. 1A is a plan view and FIGS. 1B to 1D are cross-sectional views illustrating a semiconductor device of one embodiment of the present invention.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be interpreted as being limited to the description of the embodiments and examples given below. In addition, in the following embodiments and example, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In this specification, ordinal numbers such as "first", "second", and "third" are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification and the like.

Furthermore, a voltage refers to a difference between potentials of two points, and a potential refers to electrostatic energy (electric potential energy) of unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, a structure and a manufacturing method of a semiconductor device of one embodiment of the present invention will be described with reference to FIGS. 1A to 1D, FIGS. 2A to 2D, FIGS. 3A to 3D, and FIGS. 4A to 4E.

Figure 1C:
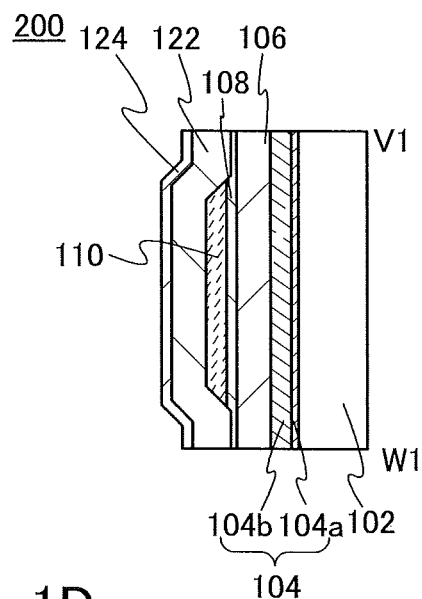
Figure 1B:
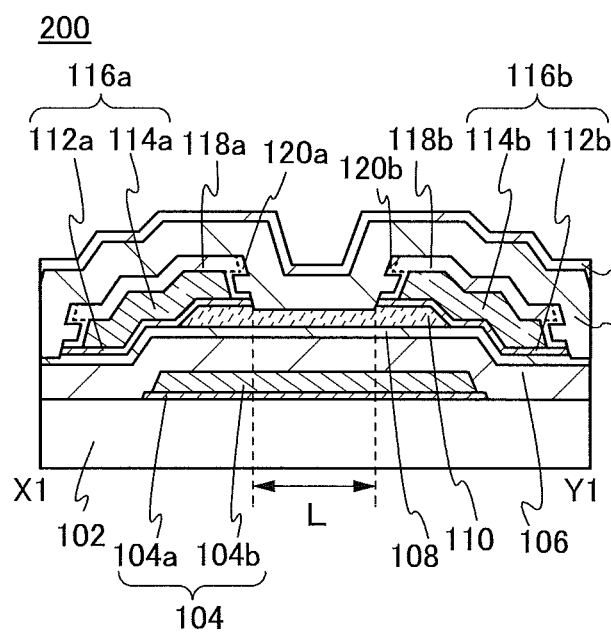
Figure 1D:
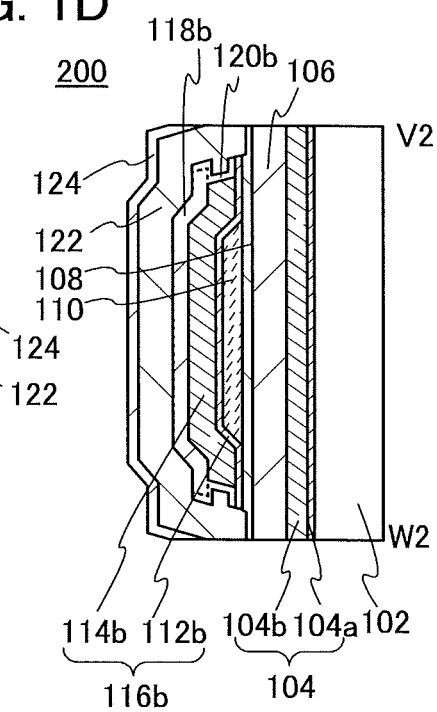

FIGS. 1A to 1D illustrate a structure example of a transistor 200 included in a semiconductor device. FIG. 1A is a plan view of the transistor 200. FIG. 1B is a cross-sectional view taken along dashed-dotted line X1-Y1 in FIG. 1A. FIG. 1C is a cross-sectional view taken along dashed-dotted line V1-W1 in FIG. 1A. FIG. 1D is a cross-sectional view taken along dashed-dotted line V2-W2 in FIG. 1A. Note that some components (e.g., an insulating film 124) of the transistor 200 are not illustrated in FIG. 1A for simplicity.

The transistor 200 in FIGS. 1A to 1D includes a gate electrode 104 over a substrate 102, insulating films 106 and 108 over the gate electrode 104, a semiconductor layer 110 overlapping the gate electrode 104 with the insulating films 106 and 108 provided therebetween, a pair of electrodes 116a and 116b in contact with the semiconductor layer 110, a pair of second protective layers 118a and 118b in contact with the top surfaces of the pair of electrodes 116a and 116b, and a pair of third protective layers 120a and 120b in contact with the side surfaces of the pair of electrodes 116a and 116b.

In the transistor 200, the insulating films 106 and 108 between the gate electrode 104 and the semiconductor layer 110 function as gate insulating films. In the transistor 200, the gate electrode 104 has a stacked-layer structure of gate electrodes 104a and 104b.

The pair of electrodes 116a and 116b functions as a source electrode and a drain electrode. The electrode 116a includes at least a stacked-layer structure of a first protective layer 112a that is in contact with the semiconductor layer 110 and a conductive layer 114a. The electrode 116b includes at least a stacked-layer structure of a first protective layer 112b that is in contact with the semiconductor layer 110 and a conductive layer 114b.

The pair of second protective layers 118a and 118b are in contact with top surfaces of the pair of conductive layers 114a and 114b constituting the pair of electrodes 116a and 116b, respectively. The pair of third protective layers 120a and 120b cover at least part of side surfaces of the pair of conductive layers 114a and 114b and at least part of side surfaces of the pair of second protective layers 118a and 118b, respectively.

The pair of first protective layers 112a and 112b are conductive layers having a function of preventing diffusion of the metal element constituting the pair of conductive layers 114a and 114b into the semiconductor layer 110. The pair of first protective layers 112a and 112b are formed using titanium, tantalum, molybdenum, tungsten, an alloy of any of these materials, titanium nitride, tantalum nitride, molybdenum nitride, tungsten nitride, or the like as appropriate.

The pair of conductive layers 114a and 114b have a single-layer structure or a stacked-layer structure formed using a low-resistance material such as copper, aluminum, gold, or silver, an alloy containing any of these materials, or a compound containing any of these materials as a main component. For example, as the pair of conductive layers 114a and 114b, a single-layer structure of an aluminum film containing silicon, a two-layer structure in which a titanium film is stacked over an aluminum film, a two-layer structure in which a copper film, a silver film, or a gold film is stacked over a copper-magnesium-aluminum alloy film, a two-layer structure in which a titanium film or a titanium nitride film is formed over an aluminum film, a copper film, a silver film, or a gold film, a three-layer structure in which an aluminum film, a copper film, a silver film, or a gold film is stacked over a molybdenum film or a molybdenum nitride film, and a molybdenum film or a molybdenum nitride film is stacked over the aluminum, copper, silver, or gold film, and the like can be used.

The pair of electrodes 116a and 116b also functions as a wiring. Thus, with the use of a low-resistance material such as copper, aluminum, gold, or silver, for the pair of conductive layers 114a and 114b constituting the pair of electrodes 116a and 116b, a semiconductor device in which wiring delay is suppressed can be manufactured even if a long wiring is needed to use a large-area substrate as the substrate 102, for example.

The pair of second protective layers 118a and 118b in contact with the top surfaces of the pair of conductive layers 114a and 114b and the pair of third protective layer 120a and 120b in contact with the side surfaces of the pair of conductive layers 114a and 114b have a function of preventing diffusion of the metal element constituting the pair of conductive layers 114a and 114b. Thus, the pair of second protective layers 118a and 118b and the pair of third protective layers 120a and 120b are formed using a material having barrier properties to the metal element constituting the pair of conductive layers 114a and 114b.

The pair of second protective layers 118a and 118b is formed using a material capable of withstanding the etching of the pair of conductive layers 114a and 114b. Thus, the pair of second protective layers 118a and 118b functions as an etching protective film when the pair of conductive layers 114a and 114b is etched.

The pair of third protective layers 120a and 120b cover the side surfaces of the pair of second protective layers 118a and 118b, the side surfaces of the pair of conductive layers 114a and 114b, and the top surfaces of the pair of first protective layers 112a and 112b protruding from the pair of conductive layers 114a and 114b. As shown in the cross-sectional views of FIGS. 1B and 1D, the bottom edges of the side surfaces of the pair of third protective layers 120a and 120b coincide with the top edges of the side surfaces of the pair of first protective layers 112a and 112b, respectively.

The pair of second protective layers 118a and 118b and the pair of third protective layers 120a and 120b can be formed using a nitride insulating film formed of silicon nitride, silicon nitride oxide, aluminum nitride, aluminum nitride oxide, or the like as appropriate. Note that in this specification and the like, the silicon nitride oxide layer and the aluminum nitride oxide layer have a high nitrogen content compared with an oxygen content (in atomic ratio), and the silicon oxynitride layer and the aluminum oxynitride layer have a high oxygen content compared with a nitrogen content (in atomic ratio).

Alternatively, the pair of second protective layers 118a and 118b and the pair of third protective layers 120a and 120b can be formed using a light-transmitting conductive film formed of a conductive material such as indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

Note that when the light-transmitting conductive film is used for the pair of second protective layers 118a and 118b or the pair of third protective layers 120a and 120b, the light-transmitting conductive film also function as the pair of electrodes 116a and 116b.

Alternatively, the pair of second protective layers 118a and 118b and the pair of third protective layers 120a and 120b may be formed using an oxide semiconductor containing In, Ga, or Zn, as appropriate. Note that the oxide semiconductor containing In, Ga, or Zn can be used for the semiconductor layer 110.

In the transistor 200, the pair of second protective layers 118a and 118b and the pair of third protective layers 120a and 120b are formed using the same material, for example. In that case, the boundary between the pair of second protective layers 118a and 118b and the pair of third protective layers 120a and 120b might be unclear. The boundary is schematically indicated by dashed line in FIGS. 1A to 1D. The same applies to other drawings referred to below.

In the transistor 200, an insulating film 122 is provided to cover the pair of second protective layers 118a and 118b and the semiconductor layer 110, and an insulating film 124 is provided over the insulating film 122. The insulating film 122 and/or the insulating film 124 may be included as a component of the transistor 200. Although the insulating films 122 and 124 are stacked in this order in FIGS. 1A to 1D, a single-layer of an insulating film or a stack of three or more insulating films may be used instead of the insulating films 122 and 124.

As shown in the cross-sectional views of the transistor 200 in FIGS. 1B and 1D, the conductive layer 114a is placed between both side surfaces of the first protective layer 112a and between both side surfaces of the second protective layer 118a; and the conductive layer 114b is placed between both side surfaces of the first protective layer 112b and between both side surfaces of the second protective layer 118b. Accordingly, the top surface of the first protective layer 112a is in contact with the conductive layer 114a and the third protective layer 120a, and the bottom surface of the second protective layer 118a is in contact with the conductive layer 114a and the third protective layer 120a. Furthermore, the top surface of the first protective layer 112b is in contact with the conductive layer 114b and the third protective layer 120b, and the bottom surface of the second protective layer 118b is in contact with the conductive layer 114b and the third protective layer 120b. A channel region of the transistor 200 is formed between the first protective layers 112a and 112b. Thus, when the conductive layers 114a and 114b are positioned as described above, the conductive layers 114a and 114b can be apart from a channel region. Consequently, diffusion of the metal element constituting the conductive layers 114a and 114b, which can be impurities for the semiconductor layer 110, can be further prevented.

Further, the pair of electrodes 116a and 116b near the channel region has a single-layer structure of the pair of first protective layers 112a and 112b, whereby the resistance of these regions (the regions where only the pair of first protective layers 112a and 112b are provided) can be higher than the other regions (the regions where the pair of conductive layers 114a and 114b are stacked over the pair of first protective layers 112a and 112b). Consequently, an electric field between the source and the drain can be relaxed.

As described above, in the transistor 200, the bottom surface, the top surface, and the side surfaces of the pair of conductive layers 114a and 114b are covered with the first, second, and third protective layers, respectively, which can serve as barrier layers. Consequently, wiring delay can be suppressed by using the pair of conductive layers 114a and 114b containing a low-resistance material as a wiring, and entry and diffusion of impurities into the semiconductor layer 110 can be suppressed. The transistor 200 including the semiconductor layer 110 with a reduced amount of impurities has high reliability, in which a change in electrical characteristics is suppressed.

Note that, as an impurity, the metal element constituting the pair of conductive layers 114a and 114b might enter the pair of first protective layers 112a and 112b, the pair of second protective layers 118a and 118b, and the pair of third protective layers 120a and 120b which serve as barrier layers of the pair of conductive layers 114a and 114b. It is preferable that the concentration of the metal element which might enter the protective layers as an impurity be the highest in a region that is in contact with the pair of conductive layers 114a and 114b and decrease with distance from the pair of conductive layers 114a and 114b.

Details of other components of the transistor 200 are described below.

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Further alternatively, a flexible substrate may be used as the substrate 102, and the transistor 200 may be provided directly on the flexible substrate. Alternatively, a separation layer may be provided between the substrate 102 and the transistor 200. The separation layer can be used when part or the whole of a semiconductor device formed over the separation layer is separated from the substrate 102 and transferred onto another substrate. In that case, the transistor 200 can be transferred to a substrate having low heat resistance or a flexible substrate.

The gate electrode 104 has a stacked-layer structure of the gate electrodes 104a and 104b. The gate electrode 104a can be formed using a material similar to that of the first protective layers 112a and 112b, as appropriate. The gate electrode 104b can be formed using a material similar to that of the conductive layers 114a and 114b, as appropriate. By providing the gate electrode 104a, the adhesion between the substrate 102 and the gate electrode 104b can be increased.

The gate electrode 104b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added. It is also possible to have a layered structure formed using the above light-transmitting conductive material and the above metal element.

The insulating films 106 and 108 serving as gate insulating films can be formed using, for example, silicon oxide, silicon oxynitride, silicon nitride oxide, silicon nitride, aluminum oxide, aluminum oxynitride, aluminum nitride, aluminum nitride oxide, hafnium oxide, gallium oxide, a Ga—Zn-based metal oxide, or the like. Although an example in which a gate insulating film has a stacked-layer structure of the insulating films 106 and 108 is shown in this embodiment, the gate insulating film may have a single-layer structure or a stacked-layer structure including three or more layers.

Note that in the gate insulating film, a nitride insulating film using silicon nitride, silicon nitride oxide, aluminum nitride, aluminum nitride oxide, or the like is preferably formed as the insulating film 106 in contact with the gate electrode 104, in which case diffusion of the metal element contained in the gate electrode 104b constituting the gate electrode 104 can be prevented.

Furthermore, a silicon nitride film or a silicon nitride oxide film is preferably used as the insulating film 106. In addition, a silicon nitride film or a silicon nitride oxide film has a higher dielectric constant than a silicon oxide film and needs a larger thickness for capacitance equivalent to that of the silicon oxide. Thus, the physical thickness of the gate insulating film can be increased. For example, the insulating film 106 has a thickness greater than or equal to 300 nm and less than or equal to 400 nm. Accordingly, a reduction in withstand voltage of the transistor 200 is prevented and the withstand voltage is improved, whereby electrostatic breakdown of the semiconductor device can be prevented.

A nitride insulating film which is preferably used as the insulating film 106 can be formed dense and suppress diffusion of the metal element of the gate electrode 104b. However, the defect level density and internal stress of the nitride insulating film are large and consequently the threshold voltage may be changed when the interface between the insulating film 106 and the semiconductor layer 110 is formed. For this reason, when a nitride insulating film is formed as the insulating film 106, an oxide insulating film formed of silicon oxide, silicon oxynitride, aluminum oxide, aluminum oxynitride, or the like is preferably formed as the insulating film 108 between the insulating film 106 and the semiconductor layer 110. When the insulating film 108 formed of an oxide insulating film is formed between the semiconductor layer 110 and the insulating film 106 formed of a nitride insulating film, the interface between the gate insulating film and the semiconductor layer 110 can be stable.

The insulating film 108 can have a thickness of greater than or equal to 25 nm and less than or equal to 150 nm, for example. Note that when an oxide semiconductor described later is used for the semiconductor layer 110, an oxide insulating film is used as the insulating film 108 which is in contact with the semiconductor layer 110; consequently, oxygen can be supplied to the semiconductor layer 110. Oxygen vacancies contained in an oxide semiconductor make the conductivity of the oxide semiconductor n-type and change in electrical characteristics. Thus, supplying oxygen from the insulating film 108 to fill the oxygen defects is effective in increasing reliability.

The insulating film 106 or 108 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage of the transistor can be reduced.

The semiconductor layer 110 can be formed using a semiconductor element such as silicon, germanium, gallium arsenide, or gallium nitride as appropriate. The semiconductor layer 110 can have a single crystal structure or a non-single-crystal structure as appropriate. Non-single-crystal structures include a polycrystalline structure, a microcrystalline structure, and an amorphous structure, for example.

In the case where a semiconductor element such as silicon, germanium, gallium arsenide, or gallium nitride is used for the semiconductor layer 110, the thickness of the semiconductor layer 110 is set to greater than or equal to 20 nm and less than or equal to 500 nm, preferably greater than or equal to 50 nm and less than or equal to 200 nm, more preferably greater than or equal to 70 nm and less than or equal to 150 nm.

The semiconductor layer 110 can be formed using an oxide semiconductor containing In, Ga, or Zn. Typical examples of the oxide semiconductor containing In, Ga, or Zn include an In—Ga oxide, an In—Zn oxide, and an In-M-Zn oxide (M represents Ti, Ga, Y, Zr, La, Ce, Nd, or Hf).

When the oxide semiconductor is an In-M-Zn oxide (M represents Ti, Ga, Y, Zr, La, Ce, Nd, or Hf), the atomic ratio of metal elements of a sputtering target used for depositing the In-M-Zn oxide preferably satisfies In≥M and Zn≥M. As the atomic ratio of metal elements of such a sputtering target, In:M:Zn=1:1:1 and In:M:Zn=3:1:2 are preferable. Note that the atomic ratios of metal elements in the oxide semiconductor layer formed vary from those in the above-described sputtering target, within a range of ±30% as an error.

When an In-M-Zn oxide is used as the oxide semiconductor, the proportion of In and the proportion of M, with the exception of Zn and O, are preferably greater than or equal to 25 atomic % and less than 75 atomic %, respectively, further preferably greater than or equal to 34 atomic % and less than 66 atomic %, respectively.

Further, the energy gap of the oxide semiconductor is 2 eV or more, preferably 2.5 eV or more, more preferably 3 eV or more. With the use of an oxide semiconductor having such a wide energy gap for the semiconductor layer 110, the off-state current of the transistor 200 can be reduced.

The oxide semiconductor can have a single crystal structure or a non-single-crystal structure as appropriate. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

When an oxide semiconductor is used for the semiconductor layer 110, the thickness of the semiconductor layer 110 is set to greater than or equal to 3 nm and less than or equal to 200 nm, preferably greater than or equal to 3 nm and less than or equal to 100 nm, more preferably greater than or equal to 3 nm and less than or equal to 50 nm.

Note that it is preferable to use, as the oxide semiconductor, an oxide semiconductor in which the impurity concentration is low and the density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic".

A highly purified intrinsic or substantially highly purified intrinsic oxide semiconductor has few carrier generation sources, and thus has a low carrier density in some cases. Thus, a transistor in which a channel region is formed in the semiconductor layer 110 including the oxide semiconductor rarely has negative threshold voltage (is rarely normally on).

The oxide semiconductor preferably has a carrier density of $1 \times 10^{17}/\text{cm}^3$ or less, more preferably $1 \times 10^{15}/\text{cm}^3$ or less, still more preferably $1 \times 10^{13}/\text{cm}^3$ or less, yet more preferably $1 \times 10^{11}/\text{cm}^3$ or less.

A highly purified intrinsic or substantially highly purified intrinsic oxide semiconductor has a low density of defect states and accordingly has a low density of trap states in some cases.

Furthermore, a transistor including a highly purified intrinsic or substantially highly purified intrinsic oxide semiconductor has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Thus, the transistor in which a channel region is formed in the oxide semiconductor has a small variation in electrical characteristics and high reliability in some cases. A charge trapped by the trap states in the oxide semiconductor takes a long time to disappear and may behave like a fixed charge. The trapped charge may behave like a fixed charge. Thus, the transistor in which a channel region is formed in the oxide semiconductor having a high density of defect states may have unstable electrical characteristics. As examples of the impurities, hydrogen, nitrogen, alkali metal, alkaline earth metal, and the like are given.

Hydrogen contained in the oxide semiconductor reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is sometimes generated. Further, bonding of part of hydrogen to oxygen bonded to a metal atom might cause generation of an electron serving as a carrier. Thus, a transistor including an oxide semiconductor which contains hydrogen is likely to be normally on. For this reason, it is preferable that hydrogen contained in an oxide semiconductor be reduced as much as possible. Specifically, in the oxide semiconductor, the concentration of hydrogen which is measured by secondary ion mass spectrometry (SIMS) is set to $2\times10^{20}$ atoms/cm$^3$ or lower, preferably $5\times10^{19}$ atoms/cm$^3$ or lower, preferably $1\times10^{19}$ atoms/cm$^3$ or lower, more preferably lower than $5\times10^{18}$ atoms/cm$^3$, more preferably $1\times10^{18}$ atoms/cm$^3$ or lower, still more preferably $5\times10^{17}$ atoms/cm$^3$ or lower, $1\times10^{16}$ atoms/cm$^3$ or lower.

When silicon or carbon, which is assigned to Group 14, is contained in the oxide semiconductor, oxygen vacancies are increased and consequently the oxide semiconductor becomes n-type. Thus, the concentration of silicon or carbon of the oxide semiconductor is lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. For this reasons, it is preferable to reduce the concentration of alkali metal or alkaline earth metal of the oxide semiconductor.

Furthermore, when nitrogen is contained in the oxide semiconductor, electrons serving as carriers are generated and carrier density is increased, so that the oxide semiconductor film easily becomes n-type. Thus, a transistor including an oxide semiconductor which contains nitrogen is likely to be normally on. For this reason, nitrogen in the oxide semiconductor is preferably reduced as much as possible; the concentration of nitrogen which is measured by SIMS is preferably set to, for example, lower than or equal to $5\times10^{18}$ atoms/cm$^3$.

In the semiconductor layer 110, the concentration of copper, aluminum, gold, or silver is less than or equal to $1\times10^{18}$ atoms/cm$^3$. When the concentration of copper, aluminum, gold, or silver in the semiconductor layer 110 is set to the above concentration, the electrical characteristics of the transistor can be improved. In addition, reliability of the transistor can be improved.

Note that when a conductive material which is easily bonded to oxygen, such as titanium, tantalum, molybdenum, or an alloy thereof, is used for the pair of first protective layers 112a and 112b, oxygen contained in the oxide semiconductor and the conductive material contained in the pair of first protective layers 112a and 112b are bonded to each other, so that an oxygen deficient region is formed in the semiconductor layer 110 including the oxide semiconductor. Further, in some cases, part of constituent elements of the conductive material that forms the pair of first protective layers 112a and 112b is mixed into the semiconductor layer 110 including the oxide semiconductor. Consequently, low-resistance regions are formed in the vicinity of regions of the semiconductor layer 110 including the oxide semiconductor which are in contact with the pair of first protective layers 112a and 112b. The low-resistance regions are formed between the insulating film 108 and the pair of first protective layers 112a and 112b so as to be in contact with the first protective layers 112a and 112b. Since the low-resistance regions have high conductivity, contact resistance between the semiconductor layer 110 including the oxide semiconductor and the pair of first protective layers 112a and 112b can be reduced, and thus, the on-state current of the transistor can be increased.

For the insulating films 122 and 124, an oxide insulating film or a nitride insulating film can be used as appropriate.

Here, an oxide semiconductor is used for the semiconductor layer 110, an oxide insulating film which can reduce oxygen vacancies in the oxide semiconductor is used as the insulating film 122, and a nitride insulating film which can prevent impurities from moving to the semiconductor layer 110 from the outside is used as the insulating film 124. Details of the oxide insulating film and the nitride insulating film which can be used as the insulating film 122 and the insulating film 124, respectively, are described below.

The oxide insulating film is formed using an oxide insulating film whose oxygen content is in excess of that in the stoichiometric composition. Part of oxygen is released by heating from the oxide insulating film containing more oxygen than that in the stoichiometric composition. The oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film which can be used as the oxide insulating film 122.

The nitride insulating film which can be used as the insulating film 124 has a blocking effect against oxygen, hydrogen, water, alkali metal, alkaline earth metal, and the like, may be provided. It is possible to prevent outward diffusion of oxygen from the semiconductor layer 110 and entry of hydrogen, water, or the like into the semiconductor layer 110 from the outside by providing the nitride insulating film as the insulating film 124. As the nitride insulating film, a silicon nitride film, a silicon nitride oxide film, an aluminum nitride film, an aluminum nitride oxide film, or the like is used. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An example of a manufacturing method of the transistor 200 in this embodiment will be described with reference to FIGS. 2A to 2D and FIGS. 3A to 3D.

Figure 2A:
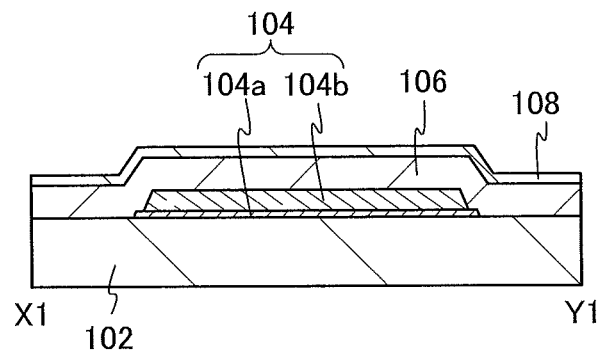
FIGS. 2A to 2D are cross-sectional views illustrating one embodiment of a method of manufacturing a semiconductor device.

First, the gate electrode 104 having a stacked-layer structure of the gate electrodes 104a and 104b is formed over the substrate 102 and then the insulating film 106 and the insulating film 108 are stacked over the gate electrode 104 (see FIG. 2A).

A formation method of the gate electrode 104 is described below. Conductive films for the gate electrodes 104a and 104b are formed by sputtering, chemical vapor deposition (CVD), vapor deposition, or the like and then a mask is formed over the conductive films by photolithography. Then, the conductive films for the gate electrodes 104a and 104b are partly etched with the use of the mask to form the gate electrode 104 composed of the gate electrodes 104a and 104b. After that, the mask is removed.

Note that the gate electrode 104 may be formed by an electrolytic plating method, a printing method, an inkjet method, or the like instead of the above formation method.

Here, a 35-nm-thick tantalum film and a 200-nm-thick copper film are formed in this order by a sputtering method. Next, a mask is formed by a photolithography process. Then, part of the copper film and part of the titanium film are dry-etched with the use of the mask to form the gate electrode 104a of the titanium film and the gate electrode 104b of the copper film.

Although the gate electrode 104 has a stacked-layer structure in this embodiment, the gate electrode 104 may have a single-layer structure. For example, the gate electrode 104 may be composed of only the gate electrode 104b.

The insulating films 106 and 108 that functions as gate insulating films are formed by a sputtering method, a CVD method, an evaporation method, or the like.

When a silicon oxide film, a silicon oxynitride film, or a silicon nitride oxide film is formed as the insulating films 106 and 108, a deposition gas containing silicon and an oxidizing gas are preferred to be used as source gases. Typical examples of the deposition gas containing silicon include silane, disilane, trisilane, and silane fluoride. As the oxidizing gas, oxygen, ozone, dinitrogen monoxide, and nitrogen dioxide can be given as examples.

When a gallium oxide film is formed as the insulating film 106 or 108, metal organic chemical vapor deposition (MOCVD) can be used.

Figure 2B:
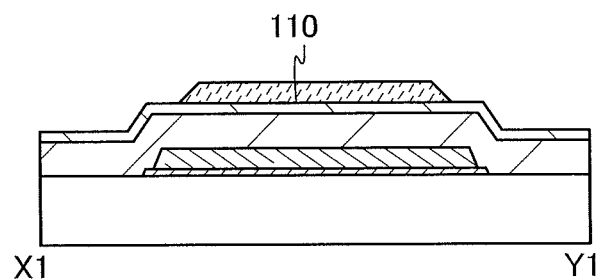

Next, the island-shaped semiconductor layer 110 is formed over the insulating film 108 (see FIG. 2B).

A method of forming the semiconductor layer 110 is described below. A semiconductor film to be the semiconductor layer 110 is formed over the insulating film 108. Then, a mask is formed over the semiconductor film by a photolithography process. Part of the semiconductor film is etched using the mask to form the semiconductor layer 110 subjected to element isolation as illustrated in FIG. 2B. After that, the mask is removed.

The semiconductor film to be the semiconductor layer 110 can be formed by a sputtering method, a coating method, a pulsed laser deposition method, a laser ablation method, a CVD method, or the like.

Note that when an oxide semiconductor layer is formed as the semiconductor layer 110, a power supply device for generating plasma in a sputtering method can be an RF power supply device, an AC power supply device, a DC power supply device, or the like as appropriate.

As a sputtering gas, a rare gas (typically argon), oxygen, or a mixed gas of a rare gas and oxygen is used as appropriate. When the mixed gas of a rare gas and oxygen is used, the proportion of oxygen to a rare gas is preferably high.

A target is selected as appropriate depending on the compositions of the oxide semiconductor layer.

In order to obtain a highly purified intrinsic or substantially highly purified intrinsic oxide semiconductor layer, it is necessary to highly purify a sputtering gas as well as to evacuate a chamber to a high vacuum. As an oxygen gas or an argon gas used for a sputtering gas, a gas which is highly purified to have a dew point of $-40°$ C. or lower, preferably $-80°$ C. or lower, further preferably $-100°$ C. or lower, still further preferably $-120°$ C. or lower is used, whereby entry of moisture or the like into the oxide semiconductor film can be prevented as much as possible.

Here, a 35-nm-thick In—Ga—Zn oxide film is formed as the oxide semiconductor layer by sputtering using an In—Ga—Zn oxide target (In:Ga:Zn=1:1:1). Next, a mask is formed over the oxide semiconductor layer, and part of the oxide semiconductor layer is selectively etched to form the semiconductor layer 110.

Then, a first heat treatment may be performed. When the oxide semiconductor layer is formed as the semiconductor layer 110, the first heat treatment can reduce the concentrations of hydrogen and water contained in the oxide semiconductor layer by releasing hydrogen, water, and the like from the semiconductor layer 110. The heat treatment is performed typically at a temperature of higher than or equal to $300°$ C. and lower than or equal to $400°$ C., preferably higher than or equal to $320°$ C. and lower than or equal to $370°$ C.

An electric furnace, a rapid thermal annealing (RTA) apparatus, or the like can be used for the first heat treatment. With the use of an RTA apparatus, the heat treatment can be performed at a temperature of higher than or equal to the strain point of the substrate if the heating time is short. Therefore, the heat treatment time can be shortened.

The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the semiconductor layer 110 and oxygen can be supplied to the semiconductor layer 110 at the same time. Consequently, the amount of oxygen vacancies in the semiconductor layer 110 can be reduced.

The first heat treatment may be performed before the semiconductor layer 110 is processed to have an island shape.

Figure 2C:
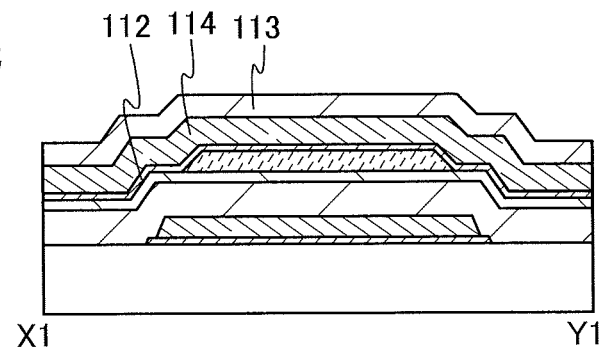

Next, a first protective film 112 to be the first protective layer, a conductive film 114, and a second protective film 113 to be the second protective layer are formed in this order (see FIG. 2C).

The first protective film 112, the conductive film 114, and the second protective film 113 are formed by a sputtering method, a CVD method, an evaporation method, or the like.

Here, a 35-nm-thick titanium film is formed by a sputtering method as the first protective film 112. A 200-nm-thick copper film is formed by a sputtering method as the conductive film 114. A 230-nm-thick silicon nitride film is formed by a plasma CVD method as the second protective film 113.

Then, masks 115a and 115b are formed over the second protective film 113. Part of the second protective film 113 is etched with the use of the masks 115a and 115b to form a pair of the second protective layers 113a and 113b (see FIG. 2D). As the masks 115a and 115b, a mask formed of an organic resin (typically, a resist mask) can be used.

The second protective film 113 can be etched by dry etching, wet etching, or the like, as appropriate. The pair of second protective layers 113a and 113b serve as hard masks in a later step. In addition, the distance between the pair of first protective layers 112a and 112b, which are formed with the use of the pair of second protective layers 113a and 113b as hard masks, is the channel length L of the transistor. For these reasons, the second protective film 113 is preferably processed by dry etching capable of anisotropic etching.

Figure 3A:
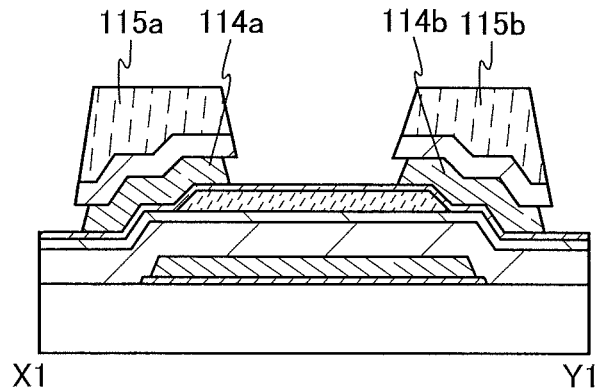
FIGS. 3A to 3D are cross-sectional views illustrating one embodiment of a method of manufacturing a semiconductor device.

Next, part of the conductive film 114 is etched with the use of the second protective layers 113a and 113b to form a pair of conductive layers 114a and 114b (see FIG. 3A). Here, conditions are determined such that the first protective film 112 is not etched and the conductive film 114 is selectively etched. Consequently, the semiconductor layer 110 is not exposed in this etching step. Thus, entry of the metal element constituting the conductive film 114 into the semiconductor layer 110 can be suppressed in etching the conductive film 114.

In addition, the conductive film 114 is isotropically etched by a wet etching method, so that the conductive layer 114a is formed between both side surfaces of a first protective layer 112a to be formed later and between both side surfaces of the second protective layer 118a, and the conductive layer 114b is formed between both side surfaces of a first protective layer 112b to be formed later and between both side surfaces of the second protective layer 118b. For the etching conditions in which the first protective film 112 is not etched and the conductive film 114 is selectively etched, acetic acid, perchloric acid, a mixed solution of phosphoric acid, acetic acid, and nitric acid (an aluminum etchant), or the like can be used as appropriate.

Here, the conductive film 114 is selectively etched by a wet etching method using a mixed solution of hydrogen peroxide, ammonium acetate, malonic acid, ethylenediaminetetraacetic acid, and 5-amino-1H-tetrazole monohydrate as an etchant.

Next, the masks 115a and 115b are removed. Here, the masks are decomposed in a gas phase by plasma (hereinafter, referred to as ashing) to make removal of the masks 115a and 115b easy, and then, the masks 115a and 115b are removed with a remover solution.

Note that removal of the masks 115a and 115b can be performed before etching of the conductive film 114. Note that the conductive layers 114a and 114b obtained by processing the conductive film 114 is less likely to be exposed to plasma (e.g., oxygen plasma) in ashing of the masks 115a and 115b because the side surfaces of the pair of conductive layers 114a and 114b are placed between both side surfaces of the pair of second protective layers 113a and 113b. When the pair of conductive layers 114a and 114b are exposed to plasma, the metal element constituting the pair of conductive layers 114a and 114b reacts with oxygen to generate a compound (metal oxide). The compound is highly reactive and serves as an impurity when diffused into the semiconductor layer 110. For this reason, removal of the masks 115a and 115b is preferably performed after the conductive film is processed into the pair of conductive layers 114a and 114b.

Figure 3B:
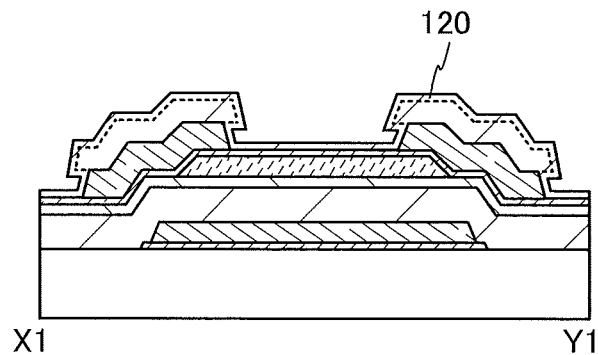

Next, the third protective film 120 is formed so as to cover the exposed first protective film 112, the side surfaces of the conductive layers 114a and 114b, and the second protective layers 113a and 113b (see FIG. 3B).

The third protective film 120 is formed by sputtering, CVD, vapor deposition, or the like.

Here, as the third protective film 120, a 230-nm-thick silicon nitride film is fog led by plasma CVD.

Figure 3C:
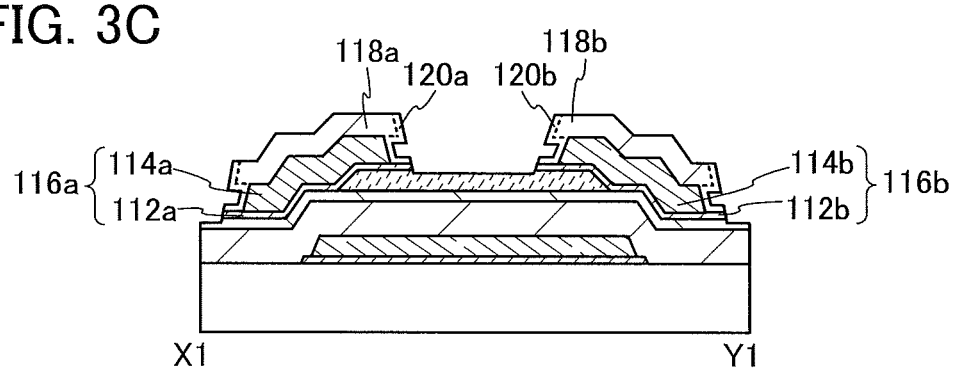

Next, the third protective film 120 and the first protective film 112 are etched by anisotropic etching to form the pair of third protective layers 120a and 120b covering the pair of second protective layers 118a and 118b, the pair of first protective layers 112a and 112b, the side surfaces of the pair of second protective layers 118a and 118b, and the side surfaces of the pair of conductive layers 114a and 114b (see FIG. 3C).

By this anisotropic etching, the electrode 116a composed of the first protective layer 112a and the conductive layer 114a and the electrode 116b composed of the first protective layer 112b and the conductive layer 114b are formed.

Films over the substrate 102 are reduced by a thickness of the third protective film 120 and the first protective film 112 by anisotropic etching that is performed in a direction substantially perpendicular to the substrate 102. In this embodiment, the third protective film 120 and the first protective film 112 are etched by dry etching using a chlorine-based gas such as chlorine, boron chloride, silicon chloride, and carbon tetrachloride.

Note that the pair of second protective layers 113a and 113b are also exposed to the etching gas in the step of etching the first protective film 112; consequently, parts of the surfaces of the pair of second protective layers 113a and 113b are etched and the pair of second protective layers 118a and 118b with reduced thickness are formed. The pair of second protective layers 118a and 118b serve as barrier layers for the pair of conductive layers 114a and 114b. Thus, the material and thickness or etching conditions for the pair of second protective layers 113a and 113b need to be determined so as not to remove the pair of second protective layers 118a and 118b in the etching of the first protective film 112. Specifically, the following equation needs to be satisfied: $t1/ER1 < t2/ER2$, where $ER1$ and $t1$ represent the etching rate and the thickness of the first protective film 112, respectively, and $ER2$ and $t2$ represent the etching rate and the thickness of the pair of second protective layers 113a and 113b, respectively.

In the step of etching the third protective film 120 and the first protective film 112, the top surfaces of the pair of conductive layers 114a and 114b are covered with the pair of second protective layers 118a and 118b, respectively; and the side surfaces of the pair of conductive layers 114a and 114b are covered with the pair of third protective layers 120a and 120b. Thus, the pair of conductive layers 114a and 114b is not exposed to plasma used in the etching step and generation of a compound of the metal element constituting the pair of conductive layers 114a and 114b is prevented. Even if the surface of the semiconductor layer 110 is exposed by this etching step, diffusion of the metal element (or the compound) constituting the pair of conductive layers 114a and 114b into the semiconductor layer 110 can be suppressed. As a result, the concentration of impurities in the semiconductor layer 110 can be reduced.

Furthermore, in the step of etching the first protective film 112, part of the semiconductor layer 110 and/or part of the insulating film 108 (specifically, regions not covered with the pair of first protective layers 112a and 112b) may be etched and reduced in thickness.

Note that if the metal element (e.g., copper) constituting the conductive film 114 that is diffused in the step of etching the conductive film 114 remains on the surface of the first protective film 112, the metal element might attach the surface of the semiconductor layer 110 in the step of etching the first protective film 112. For this reason, cleaning treatment is preferably performed on the semiconductor layer 110 not covered with the pair of first protective layers 112a and 112b after the pair of first protective layers 112a and 112b are formed.

The cleaning treatment can be performed using an alkaline solution such as a tetramethylammonium hydroxide (TMAH) solution or an acidic solution such as a diluted hydrofluoric acid, an oxalic acid solution, or a phosphoric acid solution. Alternatively, plasma treatment (oxygen plasma treatment) may be used. Note that by the cleaning treatment, parts of the semiconductor layer 110 which are not covered with the pair of first protective layers 112a and 112b may be etched and reduced in thickness.

When an oxide semiconductor layer is used as the semiconductor layer 110, after the cleaning treatment, the semiconductor layer 110 may be exposed to plasma generated in an oxygen atmosphere to be supplied with oxygen. As the oxidizing gas, oxygen, ozone, dinitrogen monoxide, and nitrogen dioxide can be used. Furthermore, it is preferable that in the plasma treatment, the semiconductor layer 110 be exposed to plasma generated without applying bias on the substrate 102 side. This is because oxygen can be supplied without damaging the semiconductor layer 110. In addition, the plasma treatment can remove etching residuals (e.g., a halogen such as fluorine or chlorine) and the like on the semiconductor film, which can remain of the surface of the semiconductor layer 110. When the plasma treatment is performed while heating is performed at 300° C. or higher, oxygen and hydrogen contained in the semiconductor layer 110 are combined to become water and be released. Consequently, the amount of hydrogen and water in the semiconductor layer 110 can be reduced.

Note that if plasma treatment is used as cleaning treatment or oxygen supplying treatment after the cleaning treatment, the surfaces of the pair of conductive layers 114a and 114b are not exposed to plasma. This is because the bottom, top, and side surfaces of the pair of conductive layers 114a and 114b are covered with the pair of first protective layers 112a and 112b, the pair of second protective layers 118a and 118b, and the pair of third protective layers 120a and 120b, respectively. Thus, entry of impurities to the semiconductor layer 110 can be prevented.

Figure 3D:
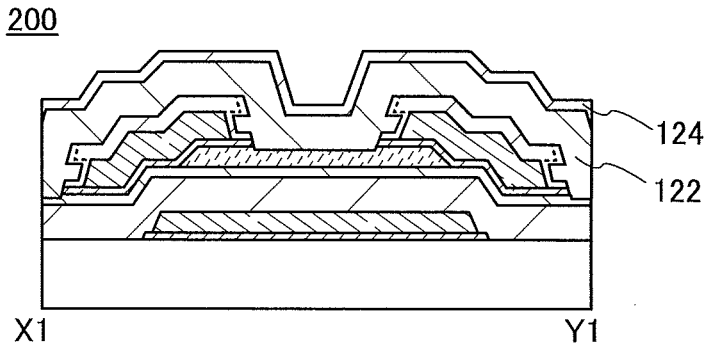

Next, the insulating films 122 and 124 are formed over the semiconductor layer 110, the pair of electrodes 116a and 116b, and the pair of second protective layers 118a and 118b (see FIG. 3D).

The insulating films 122 and 124 can be formed by plasma CVD or sputtering.

When the insulating films 122 and 124 over the pair of electrodes 116a and 116b are formed, the bottom, top, and side surfaces of the pair of conductive layers 114a and 114b containing copper, aluminum, gold, or silver are covered with the first to third protective layers. For this reason, if plasma is used when the insulating film 122 and/or the insulating film 124 is deposited, the surfaces of the pair of conductive layers 114a and 114b are not exposed to plasma. Thus, generation of a compound (e.g., metal oxide) by reacting the metal element constituting the pair of conductive layers 114a and 114b and plasma is suppressed, and at the same time, entry or diffusion of the metal element constituting the pair of conductive layers 114a and 114b into the semiconductor layer 110 can be suppressed.

The insulating films 122 and 124 can be formed using a single layer or a stack of layers of two or more of the following films, a silicon oxide film, a gallium oxide film, an aluminum oxide film, a silicon nitride film, a silicon oxynitride film, an aluminum oxynitride film, a silicon nitride oxide film, and the like. Note that when an oxide semiconductor layer is used as the semiconductor layer 110, an oxide insulating layer is preferably formed as the insulating film 122 in contact with the semiconductor layer 110, in which case the oxide insulating film can supply oxygen to the oxide semiconductor layer.

For example, a silicon oxide film or a silicon oxynitride film may be formed under the following conditions: the substrate placed in a deposition chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the deposition chamber is greater than or equal to 30 Pa and less than or equal to 250 Pa, preferably greater than or equal to 40 Pa and less than or equal to 200 Pa with introduction of a source gas into the deposition chamber, and high-frequency power is supplied to an electrode provided in the deposition chamber. Under the above conditions, an oxide insulating film from which oxygen is released can be formed.

After the formation of the oxide insulating film from which oxygen is released, a silicon oxide film or a silicon oxynitride film may be formed under the following conditions: the substrate placed in a treatment chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the treatment chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, the bonding strength of silicon and oxygen is weak in the above substrate temperature range; therefore, part of oxygen is released by heating. Thus, it is possible to form an oxide insulating film which contains oxygen at a higher proportion than the stoichiometric composition and from which part of oxygen is released by heating.

As the insulating film 124 over the insulating film 122, a nitride insulating film is preferably used. The nitride insulating film serving as the insulating film 124 can prevent oxygen from diffusing outward from the semiconductor layer 110 and hydrogen, water, and the like from entering the semiconductor layer 110 from the outside. As the nitride insulating film, a silicon nitride film, a silicon nitride oxide film, an aluminum nitride film, an aluminum nitride oxide film, or the like can be used.

Note that when the nitride insulating film is formed by a plasma CVD method, the substrate placed in the treatment chamber of the plasma CVD apparatus that is vacuum-evacuated is preferably set to be higher than or equal to 300° C. and lower than or equal to 400° C., preferably higher than or equal to 320° C. and lower than or equal to 370° C., so that a dense nitride insulating film can be formed.

When the oxide semiconductor layer is used as the semiconductor layer 110, heat treatment may be performed at a timing which is after the insulating film 122 is formed and before the insulating film 124 is formed. The heat treatment is performed typically at a temperature of higher than or equal to 150° C. and lower than or equal to 300° C., preferably higher than or equal to 200° C. and lower than or equal to 250° C. The heat treatment can be performed in a manner similar to that of the first heat treatment. By the heat treatment, part of oxygen contained in the insulating film 122 can be moved to the semiconductor layer 110, so that oxygen vacancies contained in the oxide semiconductor used for the semiconductor layer 110 can be reduced. Consequently, the amount of oxygen vacancies in the semiconductor layer 110 can be reduced.

When the insulating film 124 having a function of blocking water, hydrogen, or the like is formed over the insulating film 122 and then heating treatment is performed, water, hydrogen, or the like contained in the insulating film 122 can move to the semiconductor layer 110 and consequently defects might be caused in the semiconductor layer 110. However, by performing the heating treatment before the insulating film 124 is formed, water, hydrogen, or the like contained in the insulating film 122 can be released; thus, variation in electrical characteristics of the transistor 200 can be reduced, and change in threshold voltage can be inhibited.

Note that when oxide insulating film 122 is formed while the substrate 102 is heated, oxygen can move to the semiconductor layer 110 and oxygen vacancies in the semiconductor layer 110 can be reduced. For this reason, the heat treatment is not necessarily performed.

Furthermore, when the heat treatment is performed at a temperature higher than or equal to 150° C. and lower than or equal to 300° C., preferably higher than or equal to 200° C. and lower than or equal to 250° C., diffusion of copper, aluminum, gold, silver, or the like can be inhibited.

Furthermore, when the pair of electrodes 116a and 116b are formed, the semiconductor layer 110 might be damaged by etching of the pair of first protective layers 112a and 112b, so that oxygen vacancies can be generated on the back channel side of the semiconductor layer 110. However, with the use of the oxide insulating film containing oxygen at a higher proportion than the stoichiometric composition as the insulating film 122, the oxygen vacancies generated on the back channel side can be repaired by heat treatment. Consequently, defects contained in the semiconductor layer 110 can be reduced, and thus, the reliability of the transistor 200 can be improved.

Note that heat treatment may be performed after the formation of the insulating film 124. The heat treatment is performed typically at a temperature of higher than or equal to 150° C. and lower than or equal to 300° C., preferably higher than or equal to 200° C. and lower than or equal to 250° C.

Through the above-described steps, the transistor 200 can be manufactured.

FIGS. 4A to 4E are partial enlarged cross-sectional views in a channel length direction of the electrode 116a included in the transistor of this embodiment. FIGS. 4A to 4E are enlarged views of the electrode 116a and components around the electrode 116a, in the vicinity of a channel region. Although FIGS. 4A to 4E show enlarged view of the electrode 116a and components around it, the electrode 116b and components around the electrode 116b have the same structure.

Figure 4A:
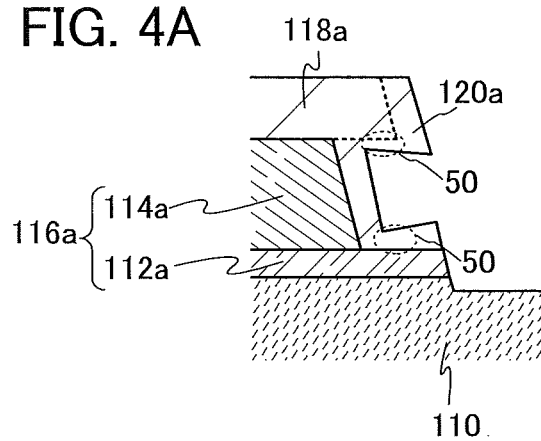
FIGS. 4A to 4E are cross-sectional views illustrating components of a semiconductor device of one embodiment of the present invention.

FIG. 4A shows an example in which the third protective layer 120a covering part of the top surface of the first protective layer 112a, the side surface of the conductive layer 114a, and the side surface of the second protective layer 118a have different thicknesses for the respective regions. Specifically, in the third protective layer 120a, the thickness of regions 50 overlapping the second protective layer 118a is smaller than that of other regions (e.g., a region in contact with the side surface of the second protective layer 118a). The third protective layer 120a is formed such that the thickness is increased stepwise with decreasing distance from a channel region.

In the cross section, the side surface of the conductive layer 114a is on the inner side than the side surface of the second protective layer 118a (the width of the conductive layer 114a is shorter than the width of the second protective layer 118a). Thus, in the formation step of the third protective film 120, the third protective film 120 is less likely to be deposited in a region overlapping with the second protective layer 118a which is protruded from the side surface of the conductive layer 114a. Consequently, the third protective layer 120a having different thicknesses for the respective regions can be formed as shown in FIG. 4A.

Figure 4B:
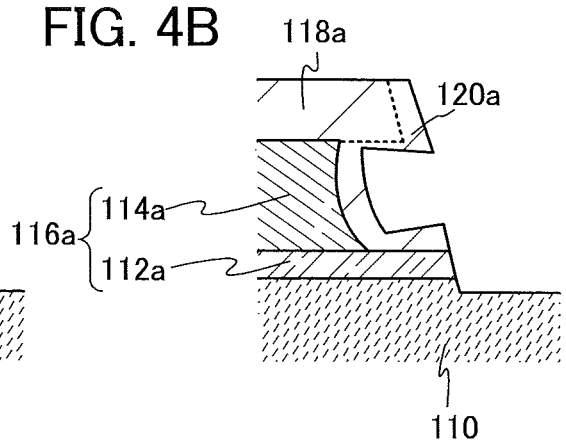

In FIG. 4B, the side surface of the conductive layer 114a is curved. The conductive layer 114a can be curved depending on etching conditions for the conductive film 114. When the conductive layer 114a has a curved side surface, coverage with the third protective layer 120a in contact with the curved side surface can be improved.

Figure 4C:
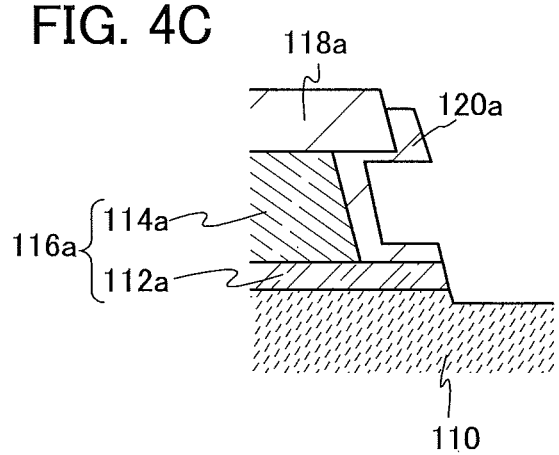
Figure 4D:
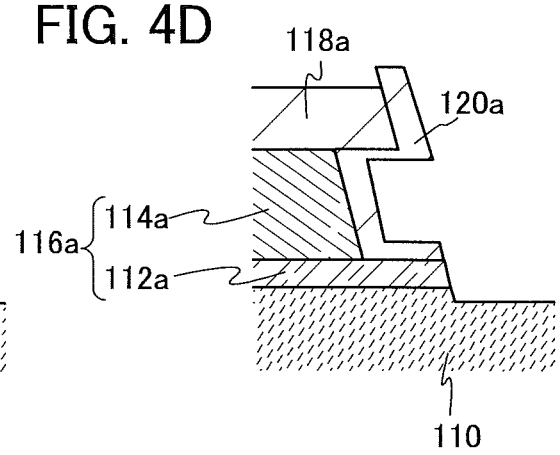

In FIGS. 4C and 4D, materials having different etching rates are used for the second and third protective layers 118a and 120a. In FIG. 4C, a material having an etching rate larger than that of the second protective layer 118a is used for the third protective layer 120a. In the structure of FIG. 4C, the third protective layer 120a is more likely to be etched than the second protective layer 118a. Thus, the top surface of the third protective layer 120a is closer to the surface of the substrate 102 than the top surface of the second protective layer 118a.

In FIG. 4D, a material having an etching rate smaller than that of the second protective layer 118a is used for the third protective layer 120a. In the structure of FIG. 4D, the third protective layer 120a is less likely to be etched than the second protective layer 118a. Thus, the top surface of the second protective layer 118a is closer to the surface of the substrate 102 than the top surface of the third protective layer 120a.

Figure 4E:
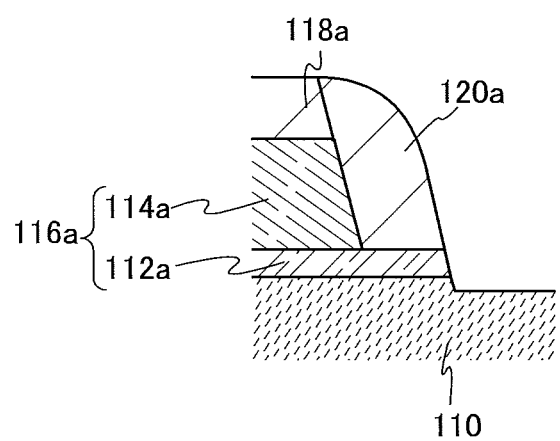

FIG. 4E shows an example in which, in the cross section, the top edge of the side surface of the conductive layer 114a coincides with the bottom edge of the side surface of the second protective layer 118a. With this structure, in the third protective layer 120a, the side surface facing the second protective layer 118a and the conductive layer 114a can be curved. When the side surface of the third protective layer 120a is curved, coverage with the insulating film 122 in contact with the third protective layer 120a can be high.

The structures in FIGS. 4A to 4E can be used in combination with any of the structures described in the other embodiments as appropriate.

The wiring of the semiconductor device in this embodiment is formed using a low-resistance material, such as copper, aluminum, gold, or silver, and consequently, a semiconductor device in which wiring delay is suppressed can be manufactured using a large-sized substrate. As a result, the semiconductor device can be sophisticated.

In addition, the semiconductor device in this embodiment includes protective layers serving as barrier layers so as to cover the bottom, top, and side surfaces of the conductive layer containing a low-resistance material. Consequently, entry and diffusion of impurities into the semiconductor layer which is in contact with the wiring including the conductive layer can be suppressed. As a result, a semiconductor device in which variation in the electrical characteristics of a transistor is suppressed and the reliability is high can be provided.

Furthermore, in the semiconductor device in this embodiment, the protective layers on the bottom, top, and side surfaces of the conductive layer containing a low-resistance material can be formed in a self-aligned manner without increasing the number of masks, compared to the case where the protective layers are not provided. Thus, a semiconductor device with excellent electrical characteristics can be manufactured with high yield at low cost. Further, the margin for alignment which is associated with an increase of the number of photomasks is unnecessary; thus, a transistor with a short channel length can be fabricated.

The structures, methods, and the like described in this embodiment can be combined as appropriate with any of the other structures, methods, and the like described in the other embodiments.

Embodiment 2

In this embodiment, a structure of a semiconductor device of one embodiment of the present invention, which is different from that in Embodiment 1, will be described. Note that Embodiment 1 can be referred to for the portion similar to that in Embodiment 1 and detailed description of the portion is omitted.

Figure 5A:
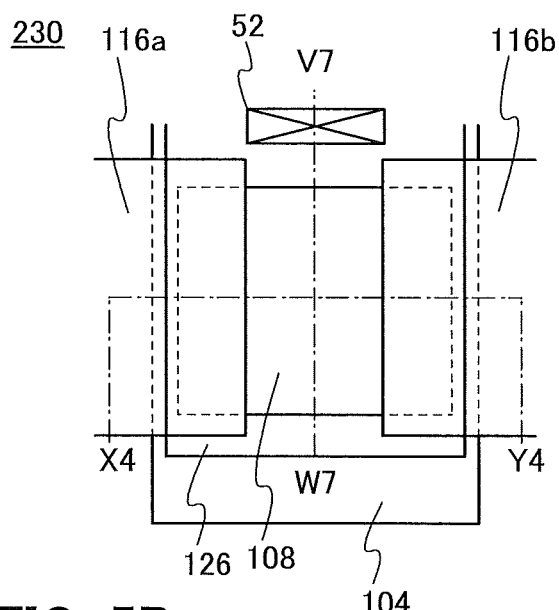
FIG. 5A is a plan view and FIGS. 5B and 5C are cross-sectional views illustrating a semiconductor device of one embodiment of the present invention.
Figure 5C:
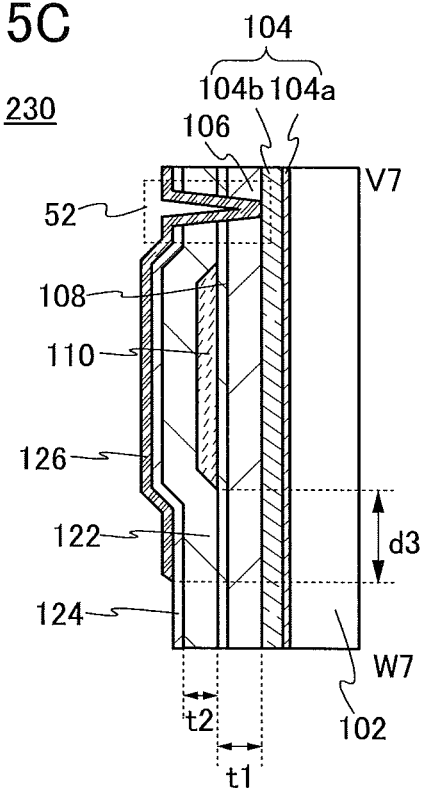
Figure 5B:
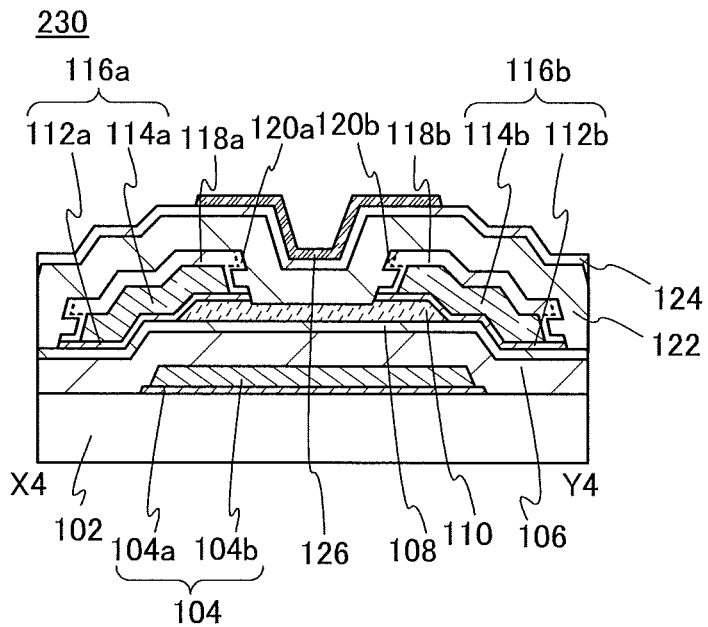

FIGS. 5A to 5C show a transistor 230 included in a semiconductor device of this embodiment. FIG. 5A is a plan view of the transistor 230, FIG. 5B is a cross-sectional view taken along dashed-dotted line X4-Y4 in FIG. 5A, and FIG. 5C is a cross-sectional view taken along dashed-dotted line V7-W7 in FIG. 5A. Note that some components (e.g., the insulating film 124) of the transistor 230 are not illustrated in FIG. 5A for simplicity.

The transistor 230 in FIGS. 5A to 5C is a channel-etched transistor and includes the gate electrode 104 over the substrate 102, the insulating films 106 and 108 over the gate electrode 104, the semiconductor layer 110 overlapping the gate electrode 104 with the insulating films 106 and 108 provided therebetween, the pair of electrodes 116a and 116b in contact with the semiconductor layer 110, the pair of second protective layers 118a and 118b in contact with the upper surfaces of the pair of electrodes, the pair of third protective layers 120a and 120b in contact with parts of the side surfaces of the pair of electrodes 116a and 116b, the insulating film 122 over the pair of electrodes 116a and 116b, the insulating film 124 over the insulating film 122, and a gate electrode 126 overlapping the semiconductor layer 110 with the insulating film 124 provided therebetween.

In the transistor 230 in this embodiment, for example, an oxide semiconductor layer is used as the semiconductor layer 110.

In the transistor 230, the insulating films 106 and 108 function as first gate insulating films. The insulating films 122 and 124 function as second gate insulating films.

The transistor 230 is different from the transistor 200 in that the transistor 230 includes the gate electrode 126 over the insulating film 124. The other structures are the same as those in Embodiment 1 and the effect similar to that of Embodiment 1 can be obtained. That is, the transistor 230 includes the first to third protective layers serving as barrier layers so as to cover the bottom, top, and side surfaces of the pair of conductive layers 114a and 114b containing a low-resistance material. Consequently, entry and diffusion of impurities into the semiconductor layer 110 which is in contact with the wiring including the pair of conductive layers 114a and 114b can be suppressed. Thus, the transistor 230 has high reliability in which variation in the electrical characteristics is suppressed.

In the top view of the transistor 230 as illustrated in FIG. 5A, the gate electrode 126 overlaps with the side surface of the semiconductor layer 110 with the insulating films 122 and 124 provided therebetween.

Further, as shown in the cross-sectional view of FIG. 5C, the insulating films 124, 122, 108, and 106 have an opening 52. The opening 52 is formed outside one side surface of the semiconductor layer 110 when seen in the channel width direction. The gate electrodes 104 and 126 are in contact with each other through the opening 52. In this case, the gate electrode 126 in the opening 52 includes a region over the semiconductor layer 110 and a region below the semiconductor layer 110. Further, the gate electrode 126 overlaps from one end of the semiconductor layer 110 in the channel width direction to the other end.

Although the opening is outside the one side surface of the semiconductor layer 110 in the channel width direction in FIGS. 5A to 5C, this embodiment is not limited to this. Openings may be outside both the side surfaces of the semiconductor layer 110 when seen in the channel width direction. In this case, the gate electrode 126 at each opening includes a region over the semiconductor layer 110 and a region below the semiconductor layer 110.

As illustrated in FIG. 5C, a distance d3 along with the channel width direction between the edge of the semiconductor layer 110 and the edge of the gate electrode 126 is preferably 1 times as long as the sum of the thickness t1 of the first gate insulating film (the insulating films 106 and 108) and the thickness t2 of the second gate insulating film (the insulating films 122 and 124). In this case, an electric field generated from the gate electrode 126 affects the side surface of the semiconductor layer 110 or the end portion including the side surface and the vicinity of the side surface, and consequently generation of a parasitic channel at the side surface or the end portion including the side surface and the vicinity of the side surface can be suppressed. When the distance d3 is smaller than or equal to 7.5 times the sum of the thickness t1 and the thickness t2, the area of the transistor can be decreased.

In the transistor 230 of this embodiment, the channel length is greater than or equal to 0.5 μm and less than or equal to 6 μm, preferably greater than 1 μm and less than or equal to 4 μm, further preferably greater than 1 μm and less than or equal to 3.5 μm, still further preferably greater than 1 μm and less than or equal to 2.5 μm. Because the on-state current of a transistor increases as the ratio of the channel length to the channel width (L/W) becomes shorter, the on-state current of the transistor 230 can be improved when the channel length is reduced to about the above ranges.

As described in Embodiment 1, the pair of first to third protective layers covering the pair of conductive layers 114a and 114b can be formed in a self-aligned manner and the margin for alignment which is associated with an increase of the number of photomasks is unnecessary. Thus, a transistor with a short channel length in the above range can be fabricated with high yield.

The semiconductor layer 110 included in the transistor 230 has a structure in which the side surfaces in the channel length direction overlap with the pair of electrodes 116a and 116b, and one side surface in the channel width direction overlaps with the gate electrode 126. When the semiconductor layer 110 is exposed to plasma in the step of etching the semiconductor layer 110 into an island shape, the end portions of the semiconductor layer 110 easily react with chlorine radicals, fluorine radicals, and the like generated from an etching gas. When an oxide semiconductor layer is used as the semiconductor layer 110, the metal element constituting the oxide semiconductor is easily bonded to the radical. Thus, in the end portions of the island-shaped oxide semiconductor layer, oxygen bonded to the metal element is easily eliminated, so that an oxygen vacancy is easily formed and the end portions easily become n-type in some cases. In the transistor 230, the side surfaces of the semiconductor layer 110 overlap with the pair of electrodes 116a and 116b and the gate electrode 126, so that an electric field applied to the end portions can be controlled by controlling the potential of the gate electrode 126 (including the gate electrode 104 at the same potential as the gate electrode 126). Accordingly, even when the end portions of an oxide semiconductor layer used as the semiconductor layer 110 are n-type, leakage current which might flow between the pair of electrodes 116a and 116b through the n-type portions can be controlled by a potential applied to the pair of gate electrodes.

Specifically, when a potential with which the transistor 230 is turned off is applied to the pair of gate electrodes, off-state current that flows between the pair of electrodes 116a and 116b can be low. Thus, even when the channel length of the transistor 230 is made short to obtain high on-state current, which causes the distance between the pair of electrodes 116a and 116b in the end portions of the semiconductor layer 110 to be short, off-state current can be low. That is, high on-state current can be obtained when the transistor 230 is on, and off-state current can be low when the transistor 230 is off.

In the transistor 230, the gate electrodes 104 and 126 are included and have the same potential and the side surfaces in the channel width direction of the semiconductor layer 110 face the gate electrode 126. With such a structure, carriers flow not only at the interfaces between the semiconductor layer 110 and the first and the second gate insulating films but also in the bulk of the semiconductor layer 110, which results in an increase in the amount of carriers that move in the transistor 230. As a result, the on-state current of the transistor 230 is increased and the field-effect mobility becomes higher, typically becomes higher than or equal to 10 $cm^2/V \cdot s$, or higher than or equal to 20 $cm^2 V \cdot s$. Note that here, the field-effect mobility is not an approximate value of the mobility as the physical property of the oxide semiconductor film but the field-effect mobility in a saturation region of a transistor.

Further, the transistor 230 includes the gate electrodes 104 and 126, which can block an electric field from the outside; thus, charges of charged particles and the like that are formed between the substrate 102 and the gate electrode 104 and/or over the gate electrode 126 do not affect the semiconductor layer 110. Therefore, degradation in a stress test (e.g., a negative gate bias temperature (−GBT) stress test in which negative potentials are applied to a gate electrode) can be suppressed, and changes in the rising voltages of on-state current at different drain voltages can be suppressed.

The BT stress test is one kind of accelerated test and can evaluate, in a short time, change in characteristics (i.e., change over time) of transistors, which is caused by long-term use. In particular, the amount of change in threshold voltage of a transistor between before and after the BT stress test is an important indicator when examining the reliability of the transistor. If the amount of change in the threshold voltage between before and after the BT stress test is small, the transistor has higher reliability.

Note that a light-transmitting conductive film can be used for the gate electrode 126 of the transistor 230. The light-transmitting conductive film can be formed using a conductive material such as ITO, indium zinc oxide, indium oxide containing tungsten oxide, indium zinc oxide containing tungsten oxide, indium oxide containing titanium oxide, indium tin oxide containing titanium oxide, indium tin oxide containing titanium oxide, or indium tin oxide containing silicon oxide.

The structures, methods, and the like described in this embodiment can be combined as appropriate with any of the other structures, methods, and the like described in the other embodiments.

Embodiment 3

In this embodiment, a semiconductor device having a transistor in which an oxide semiconductor layer is used as a semiconductor layer and the number of defects in the oxide semiconductor layer can be reduced is described with reference to drawings. Transistors described in this embodiment are different from those in Embodiment 1 or 2 in that the transistor of this embodiment includes a multilayer film including a plurality of oxide semiconductor layers. Here, details of the transistors are described using the semiconductor device shown in FIGS. 1A to 1D in Embodiment 1.

FIGS. 6A to 6D are a top view and cross-sectional views of a transistor 210 included in a semiconductor device.

Figure 6A:
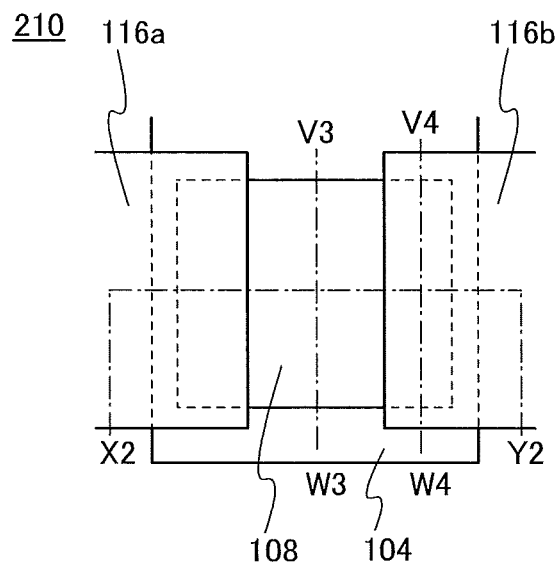
FIG. 6A is a plan view and FIGS. 6B to 6D are cross-sectional views illustrating a semiconductor device of one embodiment of the present invention.
Figure 6B:
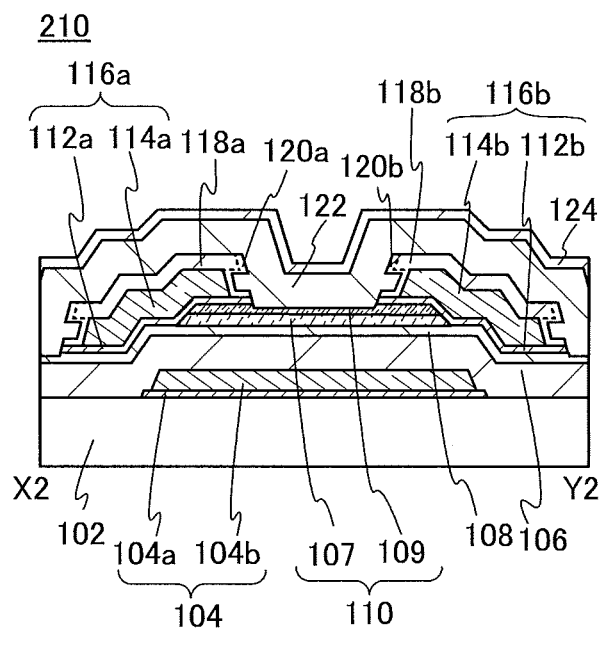
Figure 6C:
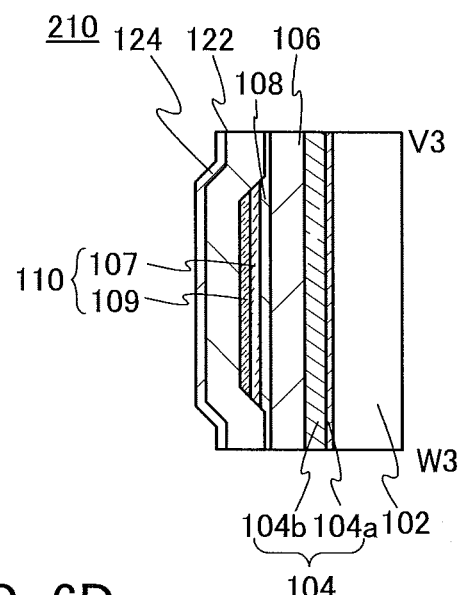
Figure 6D:
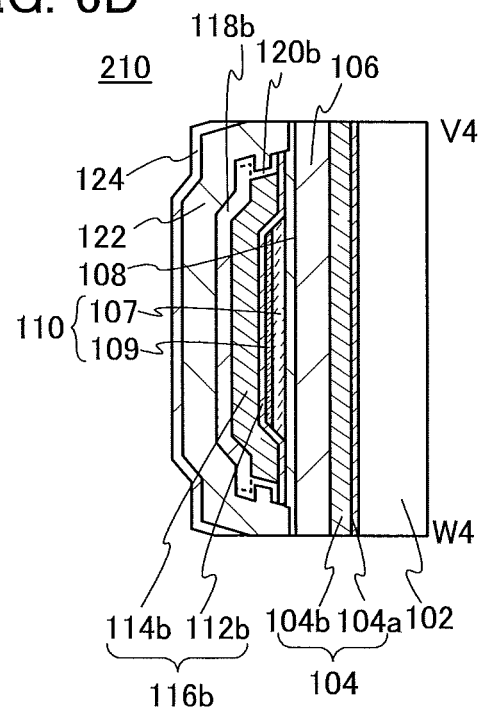

FIG. 6A is a plan view of the transistor 210. FIG. 6B is a cross-sectional view taken along dashed-dotted line X2-Y2 in FIG. 6A. FIG. 6C is a cross-sectional view taken along dashed-dotted line V3-W3 in FIG. 6A. FIG. 6D is a cross-sectional view taken along dashed-dotted line V4-W4 in FIG. 6A. Note that some components (e.g., the insulating film 124) of the transistor 210 are not illustrated in FIG. 6A for simplicity.

The transistor 210 in FIGS. 6A to 6D is different from the transistor 200 in FIGS. 1A to 1D in that the semiconductor layer 110 included in the transistor 210 between the insulating films 108 and 122 has a stacked-layer structure. The other components are the same as those in FIGS. 1A to 1D; hence, the above description can be referred to.

In the transistor 210 in this embodiment, an oxide semiconductor layer is used as the semiconductor layer 110 which includes oxide semiconductor layers 107 and 109, and a channel region is formed in the oxide semiconductor layer 107.

The oxide semiconductor layer 109 is an oxide semiconductor layer containing one or more metal elements constituting the oxide semiconductor layer 107 in which a channel region is formed. Thus, interface scattering is less likely to occur at the interface between the oxide semiconductor layers 107 and 109. Consequently, the transistor can have high field-effect mobility because the movement of carriers is not hindered at the interface.

An oxide semiconductor layer used as the oxide semiconductor layer 109 is formed using metal oxide containing at least In or An. Typically, In—Ga oxide, In—Zn oxide, or In-M-Zn oxide (M represents Al, Ga, Y, Zr, La, Ce, or Nd). The energy at the conduction band bottom thereof is closer to a vacuum level than that of an oxide semiconductor layer used as the oxide semiconductor layer 107 is. Specifically, the difference between the energy at the conduction band bottom of the oxide semiconductor layer 109 and the energy at the conduction band bottom of the oxide semiconductor layer 107 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor layer 109 and the electron affinity of the oxide semiconductor layer 107 is greater than or equal to 0.05 eV, greater than or equal to 0.07 eV, greater than or equal to 0.1 eV, or greater than or equal to 0.15 eV and also less than or equal to 2 eV, less than or equal to 1 eV, less than or equal to 0.5 eV, or less than or equal to 0.4 eV.

The oxide semiconductor layer 109 preferably contains In because carrier mobility (electron mobility) can be increased. When the oxide semiconductor layer 109 contains a higher proportion of Al, Ga, Y, Zr, La, Ce, or Nd, in an atomic ratio than the proportion of In in an atomic ratio, any of the following effects may be obtained: (1) the energy gap of the oxide semiconductor layer 109 is widened; (2) the electron affinity of the oxide semiconductor layer 109 decreases; (3) scattering of impurities from the outside is reduced; (4) an insulating property increases as compared to the oxide semiconductor layer 107.

Furthermore, oxygen vacancies are less likely to be generated in the oxide semiconductor layer 109 containing a larger amount of Ga, Y, Zr, La, Ce, or Nd in an atomic ratio than the amount of In in an atomic ratio because Ga, Y, Zr, La, Ce, or Nd is a metal element which is strongly bonded to oxygen.

For example, in the case of using In-M-Zn oxide for the oxide semiconductor layer 109, when Zn and O are eliminated from consideration, the proportion of In and the proportion of M are preferably less than 50 atomic % and greater than or equal to 50 atomic %, respectively, further preferably less than 25 atomic % and greater than or equal to 75 atomic %, respectively.

When each of the oxide semiconductor layers 107 and 109 is In-M-Zn oxide (M represents Ga, Y, Zr, La, Ce, or Nd), the proportion of M atoms (M represents Ga, Y, Zr, La, Ce, or Nd) in the oxide semiconductor layer 109 is higher than that in the oxide semiconductor layer 107. Typically, the proportion of M in the oxide semiconductor layer 109 is 1.5 or more times, twice or more, or three or more times as high as that in the oxide semiconductor layer 107.

Furthermore, when each of the oxide semiconductor layers 107 and 109 is an In-M-Zn oxide (M represents Al, Ga, Y, Zr, La, Ce, or Nd), when In:M:Zn=$x_1$:$y_1$:$z_1$ [atomic ratio] is satisfied in the oxide semiconductor layer 109 and In:M:Zn=$x_2$:$y_2$:$z_2$ [atomic ratio] is satisfied in the oxide semiconductor layer 107, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$. However, when $y_2$ is larger than or equal to three or more times $x_2$, the field-effect mobility of the transistor including the oxide semiconductor layer is reduced. However, when $y_2$ is larger than or equal to three or more times $x_2$, the field-effect mobility of the transistor including the oxide semiconductor layer is reduced. Thus, it is preferable that $y_2$ be lower than three times $X_2$.

When the oxide semiconductor layer 107 is an In-M-Zn oxide (M is Ga, Y, Zr, La, Ce, or Nd) and a target having the atomic ratio of metal elements of In:MZn=$x_2$:$y_2$:$z_2$ is used for forming the oxide semiconductor layer 107, $x_2/y_2$ is preferably greater than or equal to ⅓ and less than or equal to 6, further preferably greater than or equal to 1 and less than or equal to 6, and $z_2/y_2$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor layer 107 is easily formed. Typical examples of the atomic ratio of the metal elements of the target are In:M:Zn=1:1:1, In:M:Zn=1:1:1.2, and In:M:Zn=3:1:2.

When the oxide semiconductor layer 109 is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor layer 109, $x_2/y_2$ is less than $x_1/y_1$, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, CAAC-OS films to be described later are easily formed as the oxide semiconductor layer 109. Typical examples of the atomic ratio of the metal elements of the target are In:M:Zn=1:3:2, In:M:Zn=1:3:4, In:M:Zn=1:3:6, In:M:Zn=1:3:8, and the like.

Note that a proportion of each atom in the atomic ratio of the oxide semiconductor layers 107 and 109 varies within a range of ±40% as an error.

The thickness of the oxide semiconductor layer 109 is greater than or equal to 3 nm and less than or equal to 100 nm, preferably greater than or equal to 3 nm and less than or equal to 50 nm.

The transistor 210 includes the oxide semiconductor layer 109 between the oxide semiconductor layer 107 in which a channel region is formed and the insulating film 122. Thus, if trap levels are formed between the oxide semiconductor layer 109 and the insulating film 122 owing to impurities and defects electrons flowing in the oxide semiconductor layer 107 are less likely to be captured by the trap levels because there is a distance between the trap levels and the oxide semiconductor layer 107. Accordingly, the amount of on-state current of the transistor can be increased, and the field-effect mobility can be increased. When the electron is captured by the trap level, the electron becomes a negative fixed electric charge, so that the threshold voltage of the transistor is changed. However, with the oxide semiconductor layer 109 included, capture of the electrons by the trap levels can be reduced, and accordingly a change in the threshold voltage in the transistor 210 can be reduced.

Furthermore, impurities from the outside can be blocked by the oxide semiconductor layer 109, and accordingly, the amount of impurities which move from the outside to the oxide semiconductor layer 107 can be reduced. An oxygen vacancy is less likely to be formed in the oxide semiconductor layer 109. Consequently, the impurity concentration and the amount of oxygen vacancies in the oxide semiconductor layer 107 can be reduced.

Note that the oxide semiconductor layer 107 and the oxide semiconductor layer 109 are not formed by simply stacking each film, but are formed to form a continuous junction (here, in particular, a structure in which the energy of the conduction band bottom is changed continuously between each film). In other words, a staked structure in which an impurity which forms a defect level such as a trap center or a recombination center does not exist at the interface between the films is formed. If an impurity exists between the oxide semiconductor layer 107 and the oxide semiconductor layer 109 which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. It is preferable that each chamber of the sputtering apparatus be evacuated to a high vacuum (the pressure is approximately higher than or equal to $5 \times 10^{-7}$ Pa and lower than or equal to $1 \times 10^{-4}$ Pa) by an adsorption vacuum pump such as a cryopump so that water and the like acting as impurities of the oxide semiconductor layer are removed as much as possible. Alternatively, a turbo molecular pump and a cold trap are preferably combined so as to prevent a backflow of a gas, especially a gas containing carbon or hydrogen from an exhaust system to the inside of the chamber.

Another structure example of a transistor including a staked-layer semiconductor layer is shown in FIGS. 7A to 7D.

Figure 7A:
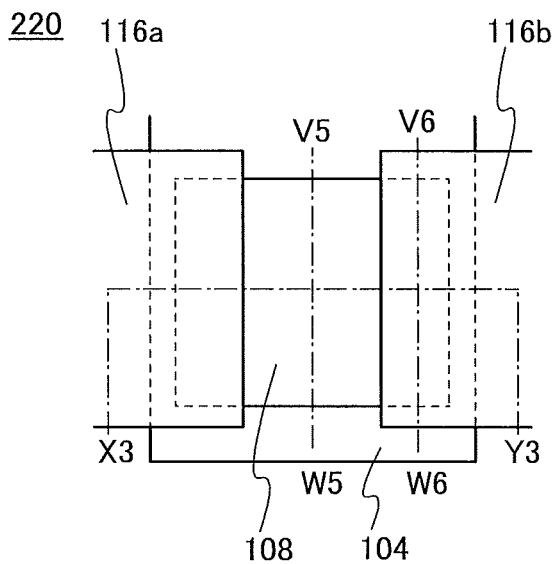
FIG. 7A is a plan view and FIGS. 7B to 7D are cross-sectional views illustrating a semiconductor device of one embodiment of the present invention.
Figure 7C:
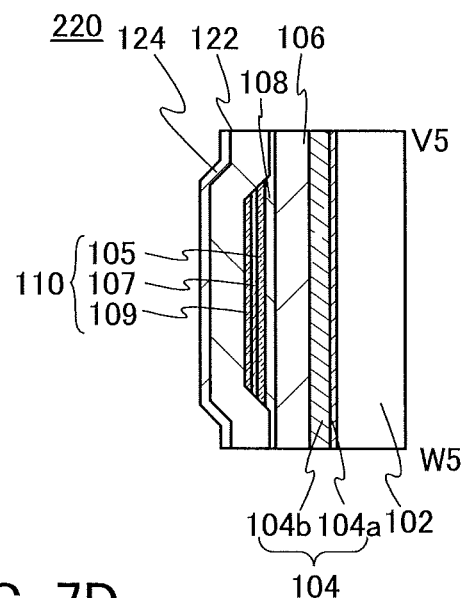
Figure 7B:
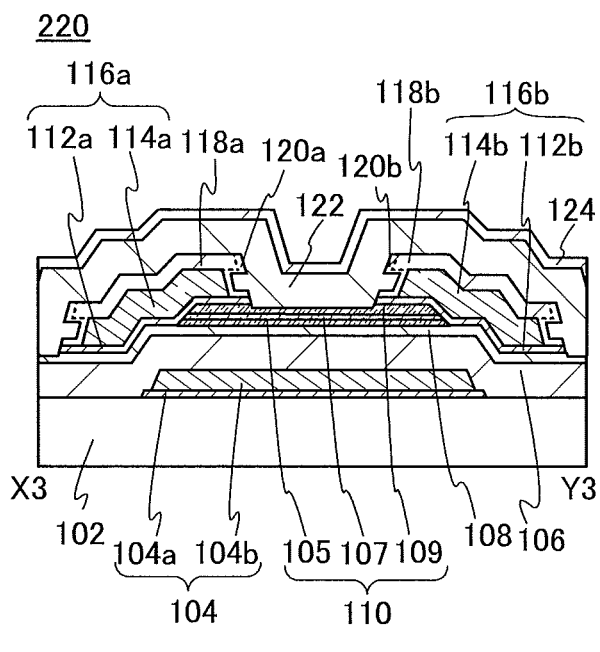
Figure 7D:
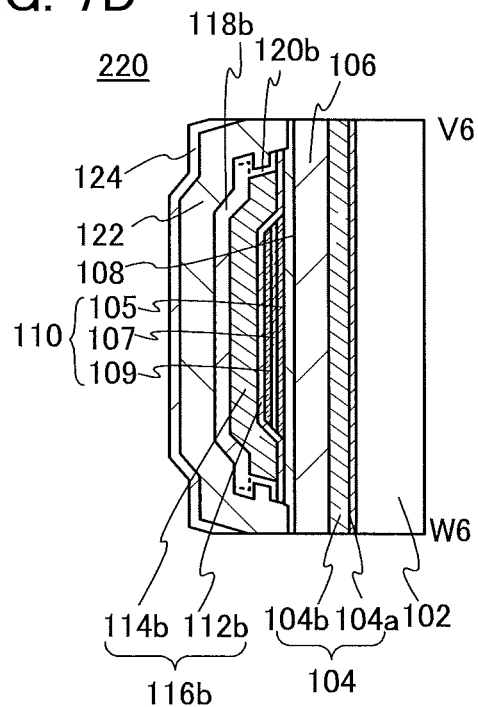

FIG. 7A is a plan view of a transistor 220. FIG. 7B is a cross-sectional view taken along dashed-dotted line X3-Y3 in FIG. 7A. FIG. 7C is a cross-sectional view taken along dashed-dotted line V5-W5 in FIG. 7A. FIG. 7D is a cross-sectional view taken along dashed-dotted line V6-W6 in FIG. 7A. Note that some components (e.g., the insulating film 124) of the transistor 220 are not illustrated in FIG. 7A for simplicity.

The transistor 220 included in the semiconductor device shown in FIGS. 7A to 7D is different from the transistor in FIGS. 6A to 6D in that the semiconductor layer 110 between the insulating films 108 and 122 has a stacked-layer structure of the oxide semiconductor layers 105, 107, and 109. The other components are the same as those in FIGS. 6A to 6D; hence, the above description can be referred to.

In the transistor 220, the oxide semiconductor layers 105, 107, and 109 are stacked in this order over the insulating film 108, and a channel region is formed in the oxide semiconductor layer 107.

An oxide semiconductor layer used as the oxide semiconductor layer 105 can be formed using a material and a formation method of the oxide semiconductor layer 109.

It is preferable that the oxide semiconductor layers 105 and 109 each have a smaller thickness than the oxide semiconductor layer 107 which is sandwiched between the oxide semiconductor layers 105 and 109 and in which a channel region is formed. When each of the thicknesses of the oxide semiconductor layers 105 and 109 is greater than or equal to 1 nm and less than or equal to 5 nm, preferably greater than or equal to 1 nm and less than or equal to 3 nm, the amount of change in the threshold voltage of the transistor can be reduced.

In the transistor 220, the oxide semiconductor layer 105 is provided between the insulating film 108 and the oxide semiconductor layer 107, and the oxide semiconductor layer 109 is provided between the oxide semiconductor layer 107 and the insulating film 122. With this structure, the concentration of silicon or carbon in the vicinity of the interface with the oxide semiconductor layer 107 can be reduced.

Since the transistor having such a structure according to this embodiment includes very few defects in the multilayer film including the oxide semiconductor layer in which a channel region is formed, the electrical characteristics of the transistor can be improved, and typically, the on-state current can be increased and the field-effect mobility can be improved. Further, in a BT stress test and a BT photostress test which are examples of a stress test, the amount of change in threshold voltage is small, and thus, reliability is high.

<Band Structure of Transistor>

Next, the stacked-layer structure in the transistor 210 shown in FIGS. 6A to 6D and a band structure of the stacked-layer structure shown in the transistor 220 in FIGS. 7A to 7D will be described with reference to FIGS. 8A and 8B.

For example, the oxide semiconductor layer 107 was formed using an In—Ga—Zn-based oxide having an energy gap of 3.15 eV, and the oxide semiconductor layer 109 was formed using an In—Ga—Zn-based oxide having an energy gap of 3.5 eV. The energy gaps were measured using a spectroscopic ellipsometer (UT-300 manufactured by HORIBA JOBIN YVON S.A.S.).

The energy difference between the vacuum level and the top of the valence band (also called ionization potential) of the oxide semiconductor layer 107 and the energy difference therebetween of the oxide semiconductor layer 109 were 8 eV and 8.2 eV, respectively. Note that the energy difference between the vacuum level and the top of the valence band was measured with an ultraviolet photoelectron spectroscopy (UPS) device (VersaProbe manufactured by ULVAC-PHI, Inc.).

Thus, the energy difference between the vacuum level and the conduction band bottom (also called electron affinity) of the oxide semiconductor layer 107 and the energy difference therebetween of the oxide semiconductor layer 109 were 4.85 eV and 4.7 eV, respectively.

Figure 8A:
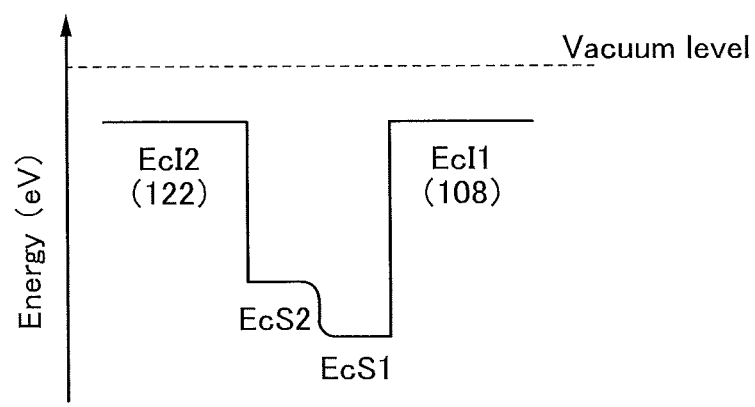
FIGS. 8A and 8B illustrate band structures of a stacked-layer structure of a semiconductor device according to one embodiment of the present invention.

FIG. 8A schematically shows part of the band structure of the stacked-layer structure included in the transistor 210. Here, the insulating films 108 and 122 are silicon oxide films, and the silicon oxide films are in contact with the semiconductor layer 110. In FIG. 8A, EcI1 denotes the energy of the conduction band bottom in the silicon oxide film; EcS1 denotes the energy of the conduction band bottom in the oxide semiconductor layer 107; EcS2 denotes the energy of the conduction band bottom in the oxide semiconductor layer 109; and EcI2 denotes the energy of the conduction band bottom in the silicon oxide film. EcI1 and EcI2 denote energy of the insulating films 108 and 122, respectively.

As illustrated in FIG. 8A, there is no energy barrier between the oxide semiconductor layers 107 and 109, and the energy of the conduction band bottom gradually changes therebetween, that is, continuously changes. This is because the oxide semiconductor layers 107 and 109 contain a common element and oxygen is transferred between the oxide semiconductor layers 107 and 109, so that a mixed layer is formed.

As shown in FIG. 8A, the energy EcS1 of the conduction band bottom of the oxide semiconductor layer 107 in the semiconductor layer 110 forms a well and a channel region is formed in the oxide semiconductor layer 107 in the transistor using the stacked-layer semiconductor layer 110.

Although trap levels due to impurities or defects might be formed in the vicinity of the interface between the oxide semiconductor layer 109 and the insulating film 122 as shown in FIG. 8A, the oxide semiconductor layer 107 can be distanced from the trap levels owing to existence of the oxide semiconductor layer 109. However, when the energy difference between EcS1 and EcS2 and the energy difference between EcS2 and EcS3 is small, an electron in the oxide semiconductor layer 107 might reach the trap level by passing over the energy difference. When the electron is captured by the trap level, it become negative fixed electric charge, so that the threshold voltage of the transistor is shifted to the positive side. Therefore, it is preferable that the energy difference between EcS1 and EcS2 be 0.1 eV or more, more preferably 0.15 eV or more because a change in the threshold voltage of the transistor is prevented and stable electrical characteristics are obtained.

Figure 8B:
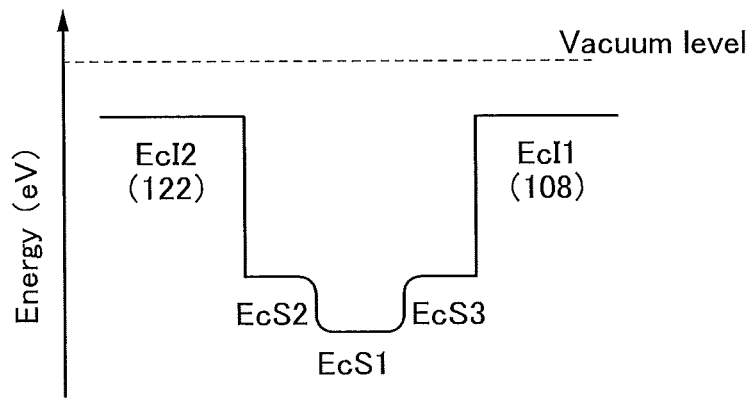

FIG. 8B schematically shows a part of the band structure of the stacked structure included in the transistors 220. Here, the insulating films 108 and 122 are silicon oxide films, and the silicon oxide films are in contact with the semiconductor layer 110. In FIG. 8B, EcI1 denotes the energy of the conduction band bottom in the silicon oxide film; EcS1 denotes the energy of the conduction band bottom in the oxide semiconductor layer 107; EcS2 denotes the energy of the conduction band bottom in the oxide semiconductor layer 109; EcS3 denotes the energy of the conduction band bottom in the oxide semiconductor layer 105; and EcI2 denotes the energy of the conduction band bottom in the silicon oxide film. EcI1 and EcI2 denote energy of the insulating films 108 and 122, respectively.

As illustrated in FIG. 8B, there is no energy barrier between the oxide semiconductor layers 105, 107, and 109, and the energy level of the bottom of the conduction band gradually changes therebetween, that is, continuously changes. This is because the oxide semiconductor layers 105, 107, and 109 contain a common element and oxygen is transferred between the stacked oxide semiconductor layers, so that a mixed layer is formed.

As shown in FIG. 8B, the energy EcS1 of the conduction band bottom of the oxide semiconductor layer 107 forms a well and a channel region of the transistor 220 is formed in the oxide semiconductor layer 107.

Although trap levels due to defects or impurities might be formed in the vicinity of the interface between the semiconductor layer 110 and the insulating film 108 and/or 122, owing to the oxide semiconductor layers 105 and 109 as shown in FIG. 8B, the oxide semiconductor layer 107 can be distanced from the trap levels. However, when the energy difference between EcS1 and EcS2 and the energy difference between EcS1 and EcS3 is small, an electron in the oxide semiconductor layer 107 might reach the trap level by passing over the energy difference. Therefore, it is preferable that the energy difference between EcS1 and EcS2 and the energy difference between EcS1 and EcS3 each be 0.1 eV or more or 0.15 eV or more. Consequently, a change in the threshold voltage of the transistor is reduced and stable electrical characteristics are obtained.

Note that the structures, methods, and the like described in this embodiment can be used as appropriate in combination with any of the structures, methods, and the like described in the other embodiments.

Embodiment 4

In this embodiment, one embodiment applicable to an oxide semiconductor film in the transistor included in the semiconductor device described in the above embodiment when an oxide semiconductor film is used as a semiconductor film will be described.

In the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°. In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

First of all, a CAAC-OS film is described.

The CAAC-OS film is an oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (IBM), a plurality of crystal parts is seen. However, a boundary between crystal parts, that is, a grain boundary is not clearly observed even in the high-resolution TEM image. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In the high-resolution planar TEM image of the CAAC-OS film observed in a direction substantially perpendicular to the sample surface, metal atoms arranged in a triangular or hexagonal configuration are seen in the crystal parts. However, there is no regularity in arrangement of metal atoms between different crystal parts.

Figure 19A:
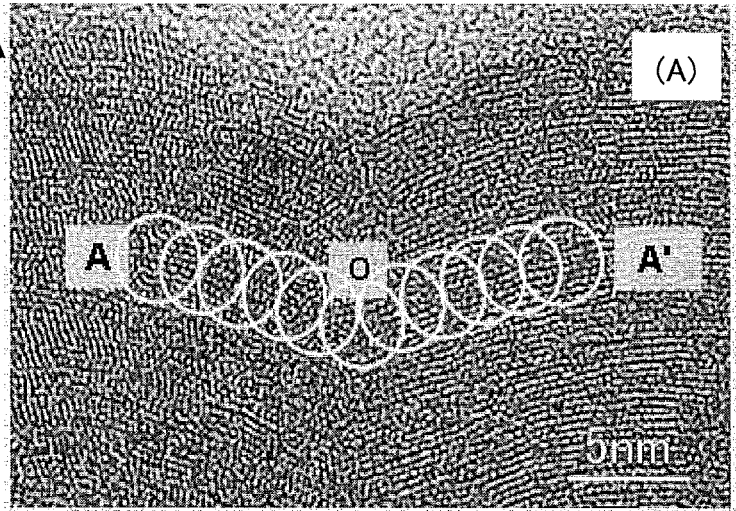
FIGS. 19A and 19B are high-resolution cross-sectional TEM images and FIG. 19C is a local Fourier transform image of an oxide semiconductor.
Figure 19B:
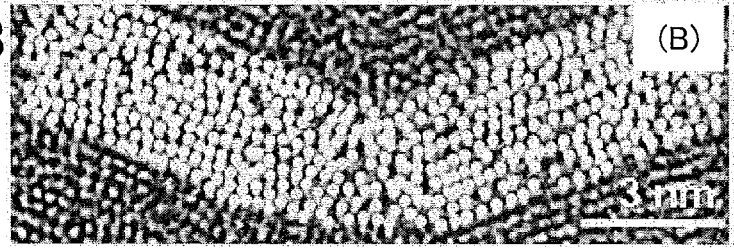

FIG. 19A is a high-resolution cross-sectional TEM image of a CAAC-OS film. FIG. 19B is a high-resolution cross-sectional TEM image obtained by enlarging the image of FIG. 19A. In FIG. 19B, atomic arrangement is highlighted for easy understanding.

Figure 19C:
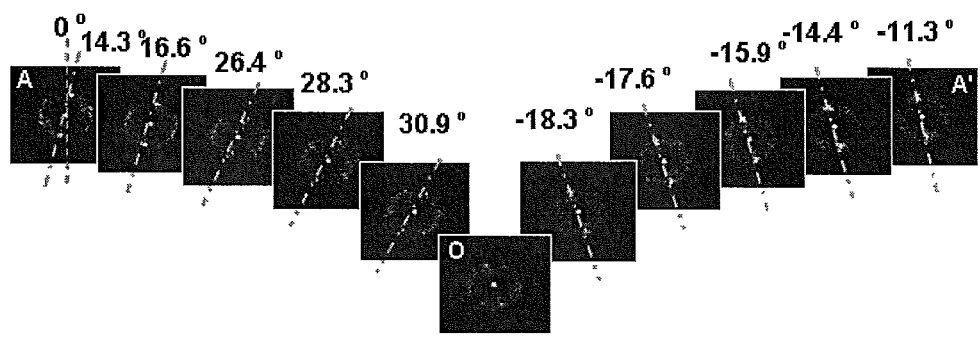

FIG. 19C is local Fourier transform images of regions each surrounded by a circle (the diameter is about 4 nm) between A and O and between O and A' in FIG. 19A. As seen in FIG. 19C, c-axis alignment can be observed in each region. The c-axis direction between A and O is different from that between O and A', which indicates that a grain in the region between A and O is different from that between O and A'. In addition, the angle of the c-axis between A and O continuously and gradually changes, for example, from 14.3°, 16.6° to 26.4°. Similarly, the angle of the c-axis between O and A' continuously changes from −18.3°, −17.6°, to −15.9°.

Figure 20A:
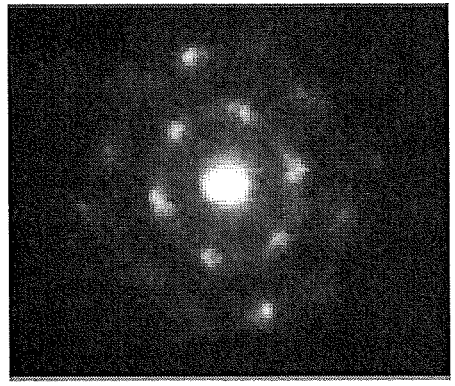
FIGS. 20A and 20B show nanobeam electron diffraction patterns of oxide semiconductor films and FIGS. 20C and 20D illustrate an example of a transmission electron diffraction measurement apparatus.

Note that in an electron diffraction pattern of the CAAC-OS film, spots (bright spots) having orientation characteristics are shown. For example, when electron diffraction with an electron beam having a diameter of, for example, 1 nm or more and 30 nm or less (such electron diffraction is also referred to as nanobeam electron diffraction) is performed on the top surface of the CAAC-OS film, the spots are observed (see FIG. 20A).

From the high-resolution cross-sectional TEM image and the high-resolution planar TEM image, orientation characteristics are found in the crystal parts in the CAAC-OS film.

Most of the crystal parts included in the CAAC-OS film each fit inside a cube whose one side is less than 100 nm. Thus, the crystal part included in the CAAC-OS film can fit inside a cube whose one side is less than 10 nm, less than 5 nm, or less than 3 nm Note that one large crystal region can be formed if a plurality of crystal parts included in the CAAC-OS film are connected to each other. For example, a crystal region with an area of 2500 $nm^2$ or more, 5 $mm^2$ or more, or 1000 $mm^2$ or more can be observed in the high-resolution planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of InGaZnO$_4$, six peaks appear. The six peaks are derived from crystal planes equivalent to the (110) plane. In contrast, when the sample is the CAAC-OS film, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, if crystal growth leading to the crystal parts of the CAAC-OS film occurs from the vicinity of the top surface of the film, the proportion of the c-axis aligned crystal parts in the vicinity of the top surface may be higher than that in the vicinity of the formation surface. Furthermore, when an impurity is added to the CAAC-OS film, a region to which the impurity is added is altered, and the proportion of the c-axis aligned crystal parts in the CAAC-OS film can vary depending on regions.

Note that when the CAAC-OS film with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS film. It is preferable that a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

With the use of the CAAC-OS film in a transistor, variation in the electrical characteristics of the transistor due to irradiation with visible light or ultraviolet light is small.

<Polycrystalline Oxide Semiconductor Film>

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a boundary between crystals may be observed.

The polycrystalline oxide semiconductor film may include a plurality of crystal grains, and the crystal orientation may be different in the plurality of crystal grains. The polycrystalline oxide semiconductor film including an InGaZnO$_4$ crystal is subjected to structural analysis with an XRD apparatus by an out-of-plane method, peaks of 2θ may appear at around 31°, 36°, and the like.

The polycrystalline oxide semiconductor film has high crystallinity and thus can have high electron mobility. Accordingly, a transistor including the polycrystalline oxide semiconductor film has high field-effect mobility. Note that an impurity might be segregated at the grain boundary between the crystals in the polycrystalline oxide semiconductor film. Moreover, the grain boundary of the polycrystalline oxide semiconductor film becomes a defect state. Because the grain boundary of the polycrystalline oxide semiconductor film may serve as a carrier trap or a carrier generation source, a transistor including the polycrystalline oxide semiconductor film can have larger variation in electrical characteristics and lower reliability than a transistor including a CAAC-OS film.

<Microcrystalline Oxide Semiconductor Film>

Next, a microcrystalline oxide semiconductor film is described.

In the high-resolution TEM image of the microcrystalline oxide semiconductor film, there are a region where a crystal part is clearly observed and a region where a crystal part is not observed. In most cases, the crystal part size in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, a crystal grain cannot be clearly observed sometimes.

Figure 20B:
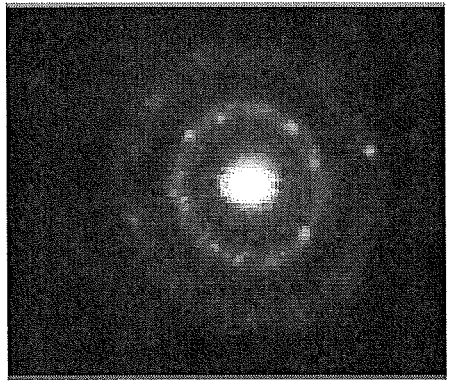

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, the nc-OS film sometimes cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, regions with high luminance in a circular (ring) pattern may be shown. Furthermore, in a nanobeam electron diffraction pattern of the nc-OS film, a plurality of circumferentially distributed spots may be observed (see FIG. 20B).

The nc-OS film is an oxide semiconductor film that has high regularity as compared to an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity.

<Amorphous Oxide Semiconductor Film>

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, such an amorphous oxide semiconductor layer can be applied to a transistor which needs to be normally on. Because the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

<Single Crystal Oxide Semiconductor Film>

Next, a single-crystal oxide semiconductor film is described.

The single-crystal oxide semiconductor film has a lower impurity concentration and a lower density of defect states (few oxygen vacancies); thus, the carrier density can be decreased and a transistor including the single-crystal oxide semiconductor film is unlikely to be normally on. Moreover, because the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of crystal part of the amorphous-like OS film and the nc-OS film. Note that the crystal part whose size is 0.8 nm or larger is selectively evaluated.

Figure 21:
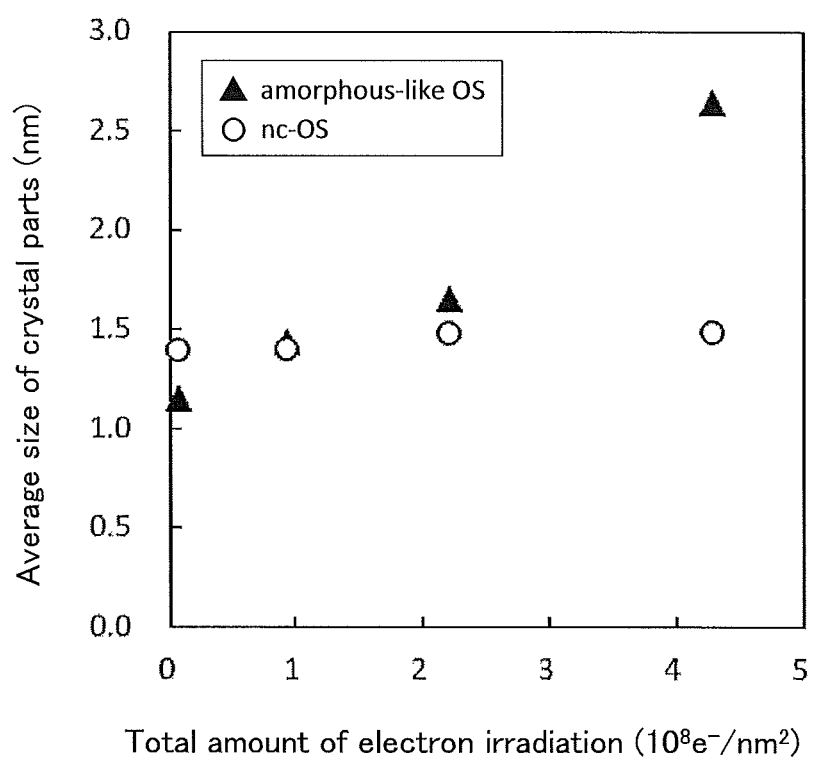
FIG. 21 shows a change in crystal parts by electron beam irradiation.

FIG. 21 shows examination results of change in average size of crystal parts (20-40 points) in the amorphous-like OS film and the nc-OS film using the high-resolution TEM images. As in FIG. 21, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8$ $e^-/nm^2$. In contrast, the crystal part size in the good-quality nc-OS film shows little change from the start of electron irradiation to the total amount of electron irradiation of $4.2 \times 10^8$ $e^-/nm^2$ regardless of the amount of electron irradiation.

Furthermore, in FIG. 21, by linear approximation of the change in the crystal part size in the amorphous-like OS film and the nc-OS film and extrapolation to the total amount of electron irradiation of 0 $e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures may be analyzed using nanobeam electron diffraction.

Figure 20C:
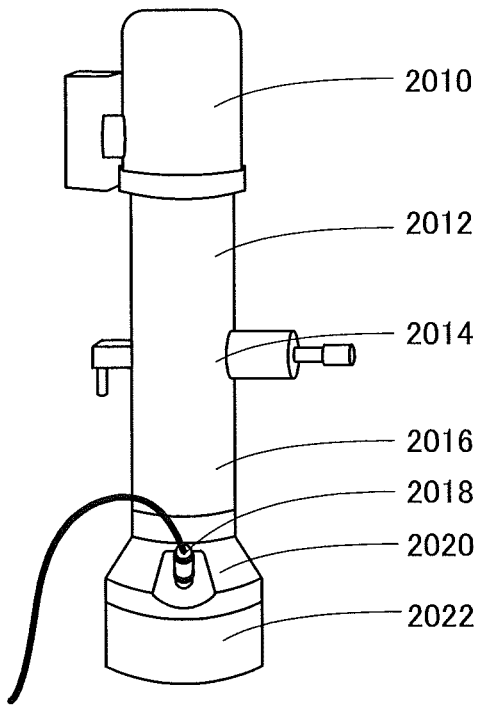

FIG. 20C illustrates a transmission electron diffraction measurement apparatus which includes an electron gun chamber 2010, an optical system 2012 below the electron gun chamber 2010, a sample chamber 2014 below the optical system 2012, an optical system 2016 below the sample chamber 2014, an observation chamber 2020 below the optical system 2016, a camera 2018 installed in the observation chamber 2020, and a film chamber 2022 below the observation chamber 2020. The camera 2018 is provided to face toward the inside of the observation chamber 2020. Note that the film chamber 2022 is not necessarily provided.

Figure 20D:
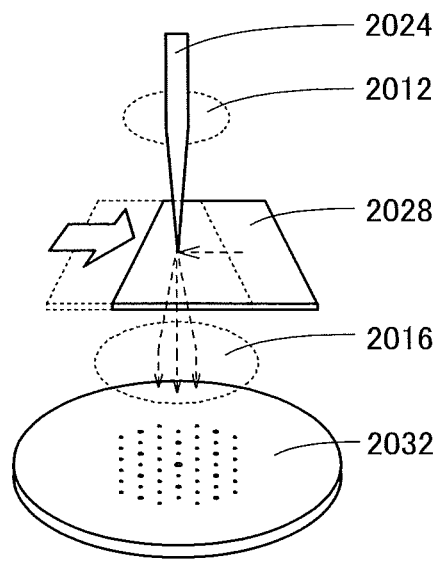

FIG. 20D illustrates an internal structure of the transmission electron diffraction measurement apparatus illustrated in FIG. 20C. In the transmission electron diffraction measurement apparatus, a substance 2028 provided in the sample chamber 2014 is irradiated with electrons ejected from an electron gun provided in the electron gun chamber 2010 through the optical system 2012. Electrons passing through the substance 2028 enter a fluorescent plate 2032 provided in the observation chamber 2020 through the optical system 2016. A pattern which depends on the intensity of the incident electrons appears in the fluorescent plate 2032, so that the transmitted electron diffraction pattern can be measured.

The camera 2018 is set toward the fluorescent plate 2032 so that a pattern on the fluorescent plate 2032 can be taken. An angle formed by a straight line which passes through the center of a lens of the camera 2018 and the center of the fluorescent plate 2032 and an upper surface of the fluorescent plate 2032 is, for example, 15° or more and 80° or less, 30° or more and 75° or less, or 45° or more and 70° or less. As the angle is reduced, distortion of the transmission electron diffraction pattern taken by the camera 2018 becomes larger. Note that if the angle is obtained in advance, the distortion of an obtained transmission electron diffraction pattern can be corrected. Note that the film chamber 2022 may be provided with the camera 2018. For example, the camera 2018 may be set in the film chamber 2022 so as to be opposite to the incident direction of electrons 2024. In this case, a transmission electron diffraction pattern with less distortion can be taken from the rear surface of the fluorescent plate 2032.

A holder for fixing the substance 2028 that is a sample is provided in the sample chamber 2014. Electrons which passes through the substance 2028 penetrate the holder. Furthermore, the holder may have a function of transferring the substance 2028 along the x-axis, the y-axis, the z-axis, or the like, for example. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. These ranges may be optimized depending on the structure of the substance 2028.

Then, a method of measuring a transmission electron diffraction pattern of a substance by the transmission electron diffraction measurement apparatus described above will be described.

For example, changes in the structure of a substance can be observed by changing (scanning) the irradiation position of the electrons 2024 that are a nanobeam in the substance, as illustrated in FIG. 20D. At this time, when the substance 2028 is a CAAC-OS film, a diffraction pattern shown in FIG. 20A can be observed. When the substance 2028 is an nc-OS film, a diffraction pattern shown in FIG. 20B can be observed.

Even when the substance 2028 is a CAAC-OS film, a diffraction pattern similar to that of an nc-OS film or the like may be partly observed. Therefore, quality of a CAAC-OS film can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of not-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 22A:
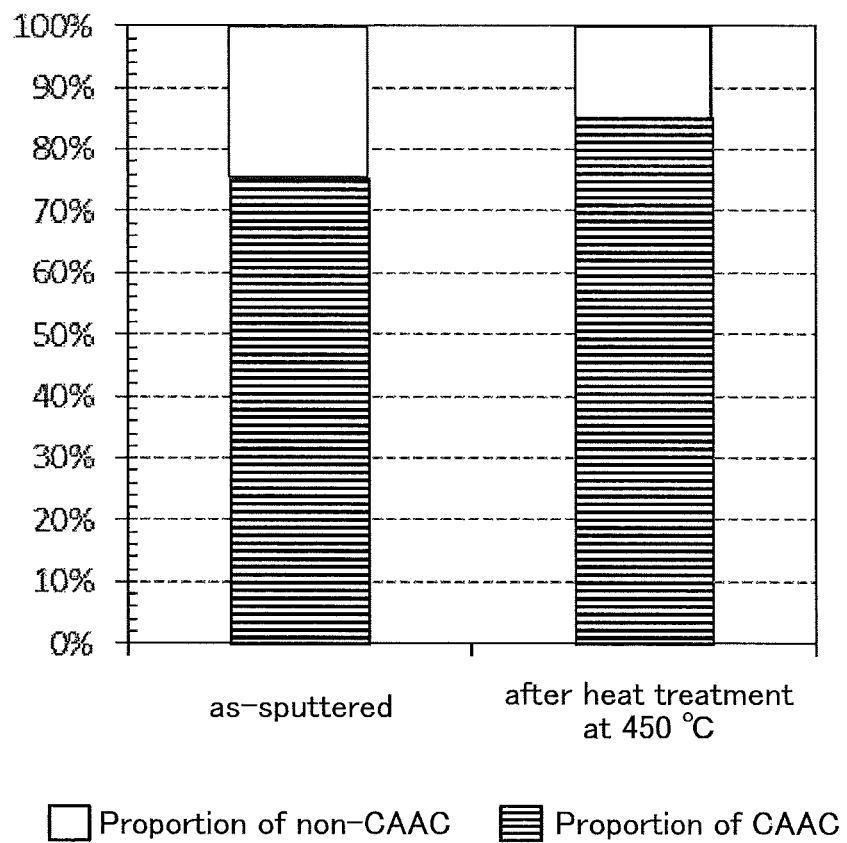
FIG. 22A shows an example of structural analysis by transmission electron diffraction measurement and FIGS. 22B and 22C show high-resolution planar TEM images.

FIG. 22A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. The above results suggest that the region having a structure similar to that of an nc-OS film is rearranged by the heat treatment owing to the influence of the structure of the adjacent region, whereby the region becomes CAAC.

Figure 22B:
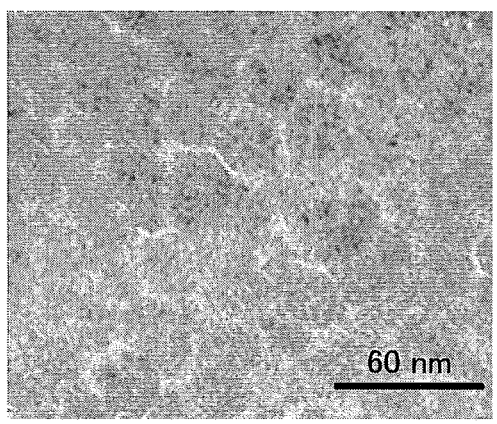
Figure 22C:
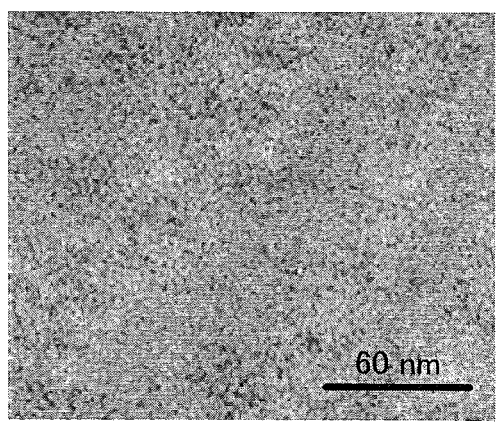

FIGS. 22B and 22C are high-resolution planar TEM images of the CAAC-OS film obtained just after the deposition and the CAAC-OS film subjected to the heat treatment at 450° C., respectively. Comparison between FIGS. 22B and 22C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

Embodiment 5

In this embodiment, a semiconductor device that is one embodiment of the present invention is described with reference to drawings. In this embodiment, a semiconductor device of one embodiment of the present invention is described taking a display device as an example. An oxide semiconductor layer is used as a semiconductor layer in this embodiment.

Figure 9A:
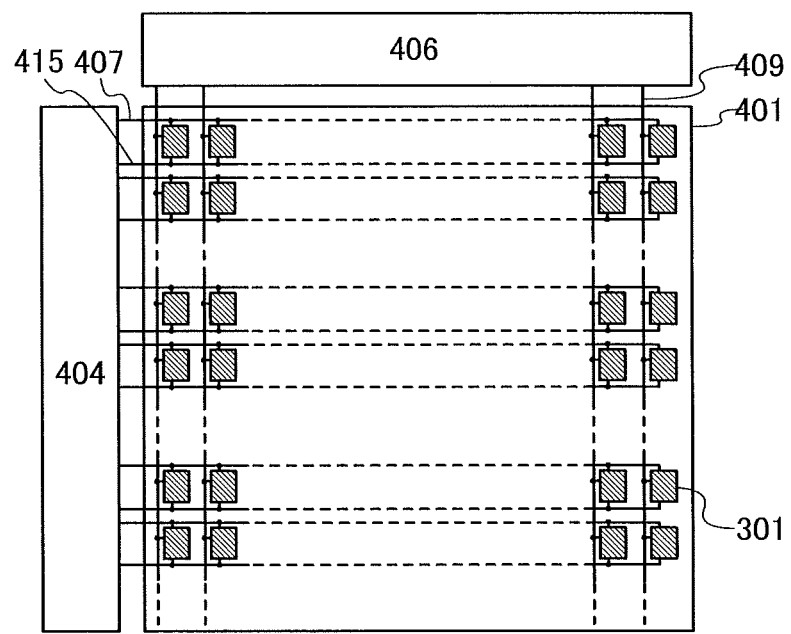
FIG. 9A is a conceptual diagram and FIGS. 9B and 9C are circuit diagrams of a semiconductor device of one embodiment of the present invention.

FIG. 9A illustrates an example of a semiconductor device. The semiconductor device in FIG. 9A includes a pixel portion 401, a scan line driver circuit 404, a signal line driver circuit 406, m scan lines 407 that are arranged in parallel or substantially in parallel and whose potentials are controlled by the scan line driver circuit 404, and n signal lines 409 that are arranged in parallel or substantially in parallel and whose potentials are controlled by the signal line driver circuit 406. Furthermore, the pixel portion 401 includes a plurality of pixels 301 arranged in a matrix. Furthermore, capacitor lines 415 arranged in parallel or substantially in parallel are provided along the scan lines 407. Note that the capacitor lines 415 may be arranged in parallel or substantially in parallel along the signal lines 409. The scan line driver circuit 404 and the signal line driver circuit 406 are collectively referred to as a driver circuit portion in some cases.

Each scan line 407 is electrically connected to the n pixels 301 in the corresponding row among the pixels 301 arranged in m rows and n columns in the pixel portion 401. Each signal line 409 is electrically connected to the m pixels 301 in the corresponding column among the pixels 301 arranged in m rows and n columns. Note that in and n are each an integer of 1 or more. Each capacitor line 415 is electrically connected to the n pixels 301 in the corresponding row among the pixels 301 arranged in m rows and n columns. Note that in the case where the capacitor lines 415 are arranged in parallel or substantially in parallel along the signal lines 409, each capacitor line 415 is electrically connected to the m pixels 301 in the corresponding column among the pixels 301 arranged in m rows and n columns.

Figure 9B:
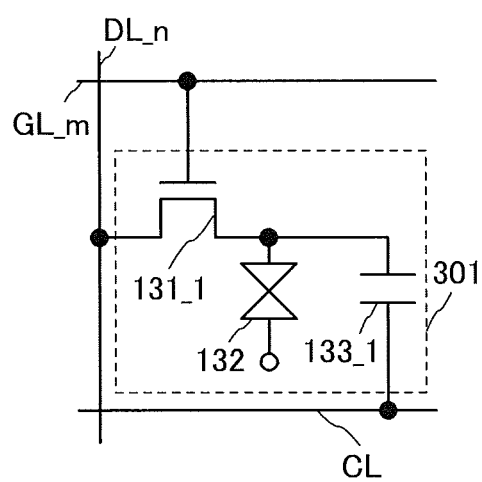
Figure 9C:
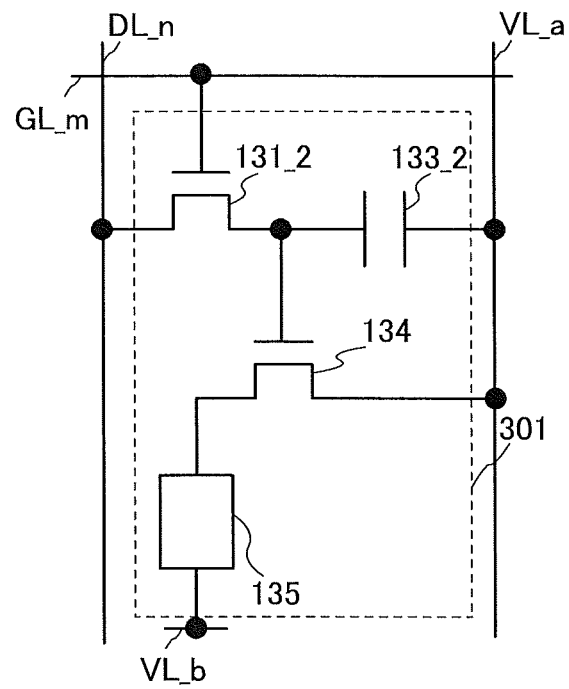

FIGS. 9B and 9C illustrate circuit configurations that can be used for the pixels 301 in the display device illustrated in FIG. 9A.

The pixel 301 illustrated in FIG. 9B includes a liquid crystal element 132, a transistor 131_1, and a capacitor 133_1.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Furthermore, the potential supplied to one of a pair of electrodes of the liquid crystal element 132 in the pixel 301 in one row may be different from the potential supplied to one of a pair of electrodes of the liquid crystal element 132 in the pixel 301 in another row.

As examples of a driving method of the display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 ms or less and is optically isotropic, which makes the alignment process unneeded and the viewing angle dependence small.

In the pixel 301 in the m-th row and the n-th column, one of a source electrode and a drain electrode of the transistor 131_1 is electrically connected to a signal line DL_n, and the other is electrically connected to the other of a pair of electrodes of the liquid crystal element 132. A gate electrode of the transistor 131_1 is electrically connected to a scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a capacitor line CL), and the other is electrically connected to the other of the pair of electrodes of the liquid crystal element 132. The potential of the capacitor line CL is set in accordance with the specifications of the pixel 301 as appropriate. The capacitor 133_1 functions as a storage capacitor for storing written data.

For example, in the display device including the pixel 301 in FIG. 9B, the pixels 301 are sequentially selected row by row by the scan line driver circuit 404, whereby the transistors 131_1 are turned on and a data signal is written.

When the transistors 131_1 are turned off, the pixels 301 in which the data has been written are brought into a holding state. This operation is sequentially performed row by row; thus, an image is displayed.

The pixel 301 illustrated in FIG. 9C includes a transistor 131_2, a capacitor 133_2, a transistor 134, and a light-emitting element 135.

One of a source electrode and a drain electrode of the transistor 1312 is electrically connected to a wiring to which a data signal is supplied (hereinafter referred to as signal line DL_n). A gate electrode of the transistor 131_2 is electrically connected to a wiring to which a gate signal is supplied (hereinafter referred to as scan line GL_m).

The transistor 1312 has a function of controlling whether to write a data signal by being turned on or off.

One of a pair of electrodes of the capacitor 133_2 is electrically connected to a wiring to which a potential is supplied (hereinafter referred to as a potential supply line VL_a), and the other is electrically connected to the other of the source electrode and the drain electrode of the transistor 1312.

The capacitor 133_2 functions as a storage capacitor for storing written data.

One of a source electrode and a drain electrode of the transistor 134 is electrically connected to the potential supply line VL_a. Furthermore, a gate electrode of the transistor 134 is electrically connected to the other of the source electrode and the drain electrode of the transistor 1312.

One of an anode and a cathode of the light-emitting element 135 is electrically connected to a potential supply line VL_b, and the other is electrically connected to the other of the source electrode and the drain electrode of the transistor 134.

As the light-emitting element 135, an organic electroluminescent element (also referred to as an organic EL element) or the like can be used, for example. Note that the light-emitting element 135 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

In the display device including the pixel 301 in FIG. 9C, the pixels 301 are sequentially selected row by row by the scan line driver circuit 404, whereby the transistors 131_2 are turned on and a data signal is written.

When the transistors 131_2 are turned off, the pixels 301 in which the data has been written are brought into a holding state. Further, the amount of current flowing between the source electrode and the drain electrode of the transistor 134 is controlled in accordance with the potential of the written data signal. The light-emitting element 135 emits light with a luminance corresponding to the amount of flowing current. This operation is sequentially performed row by row; thus, an image is displayed.

Figure 10:
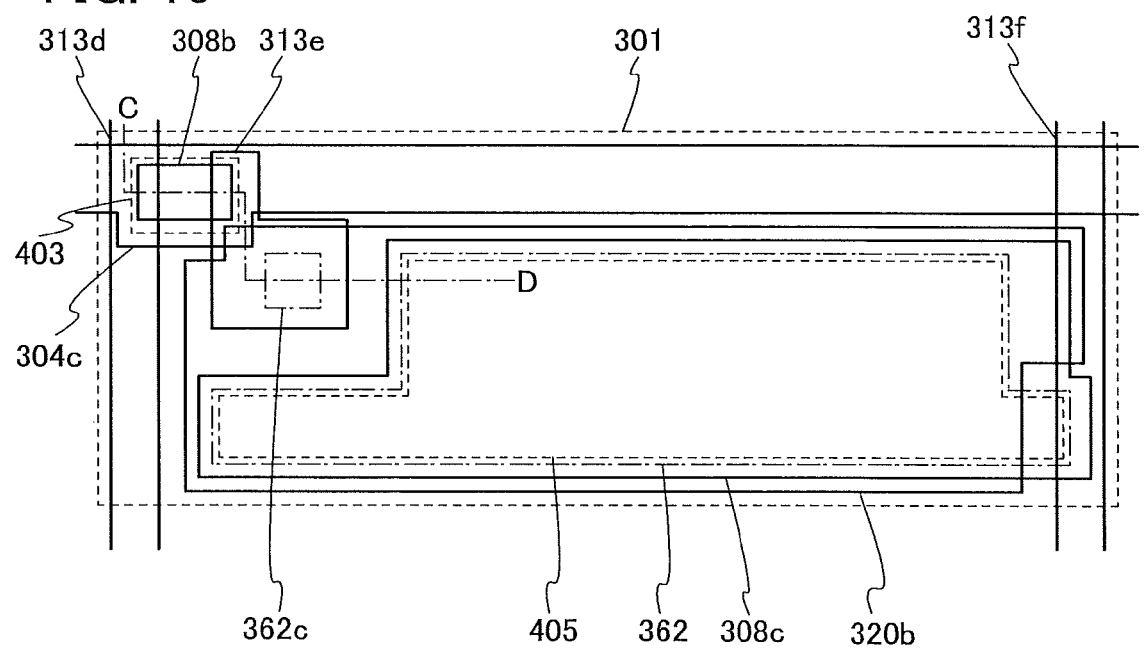
FIG. 10 illustrates an example of a layout of a pixel.

Next, a specific example of a liquid crystal display device including a liquid crystal element in the pixel 301 is described. FIG. 10 is a top view of the pixel 301 illustrated in FIG. 9B. Note that in FIG. 10, a counter electrode, a liquid crystal element, and first protective layers 314d and 314e are omitted.

In FIG. 10, a conductive layer 304c serving as a scan line extends substantially perpendicularly to the signal line (in the horizontal direction in the drawing). A conductive layer 313d serving as a signal line extends substantially perpendicularly to the scan line (in the vertical direction in the drawing). A conductive layer 313f serving as a capacitor line extends in parallel to the signal line. Note that the conductive layer 304c serving as a scan line is electrically connected to the scan line driver circuit 404 (see FIG. 9A), and the conductive layer 313d serving as a signal line and the conductive layer 313f serving as a capacitor line are electrically connected to the signal line driver circuit 406 (see FIG. 9A).

The transistor 403 is provided at a region where the scan line and the signal line cross each other. The transistor 403 includes the conductive layer 304c serving as a gate electrode; a gate insulating film (not illustrated in FIG. 10); a semiconductor layer 308b where a channel region is formed, over the gate insulating film; and the conductive layers 313d and 313e serving as a source electrode and a drain electrode. The conductive layer 304c also serves as a scan line, and a region of the conductive layer 304c that overlaps with the oxide semiconductor layer 308b serves as the gate electrode of the transistor 403. In addition, the conductive layer 313d also serves as a signal line, and a region of the conductive layer 313d that overlaps with the semiconductor layer 308b serves as the source electrode or drain electrode of the transistor 403. Furthermore, in the top view of FIG. 10, an end portion of the scan line is located on the outer side of an end portion of the semiconductor layer 308b. Thus, the scan line functions as a light-blocking film for blocking light from a light source such as a backlight. For this reason, the semiconductor layer 308b included in the transistor is not subjected to light, so that a variation in the electrical characteristics of the transistor can be suppressed.

The conductive layer 313e is electrically connected to a light-transmitting conductive layer 320b that serves as a pixel electrode, through an opening 362c.

A capacitor 405 is connected to the conductive layer 313f serving as a capacitor line through an opening 362. The capacitor 405 includes a film 308c having conductivity formed over the gate insulating film, a dielectric film formed of a nitride insulating film formed over the transistor 403, and the light-transmitting conductive layer 320b that serves as the pixel electrode. The conductive layer 308c formed over the gate insulating film has a light-transmitting property. That is, the capacitor 405 transmits light.

Owing to the light-transmitting property of the capacitor 405, the capacitor 405 can be formed large (in a large area) in the pixel 301. Thus, a semiconductor device having increased charge capacity while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the charge capacity of the capacitor is small in a semiconductor device with a high, resolution. However, since the capacitor 405 of this embodiment transmits light, when it is provided in a pixel, enough charge capacity can be obtained in the pixel and the aperture ratio can be improved. Typically, the capacitor 405 can be favorably used in a high-resolution semiconductor device with a pixel density of 200 ppi or more, or furthermore, 300 ppi or more.

The pixel 301 illustrated in FIG. 10 has a shape in which a side parallel to the conductive layer 304c serving as a scan line is longer than a side parallel to the conductive layer 313d serving as a signal line and the conductive layer 313f serving as a capacitor line extends in parallel to the conductive layer 313d serving as a signal line. As a result, the area where the conductive layer 313f occupies in the pixel 301 can be decreased, thereby increasing the aperture ratio. In addition, the conductive layer 313f serving as a capacitor line does not use a connection electrode and is in direct contact with the conductive layer 308c, and thus the aperture ratio can be further increased.

Furthermore, according to one embodiment of the present invention, the aperture ratio can be improved even in a display device with a high resolution, which makes it possible to use light from a light source such as a backlight efficiently, so that power consumption of the display device can be reduced.

Figure 11:
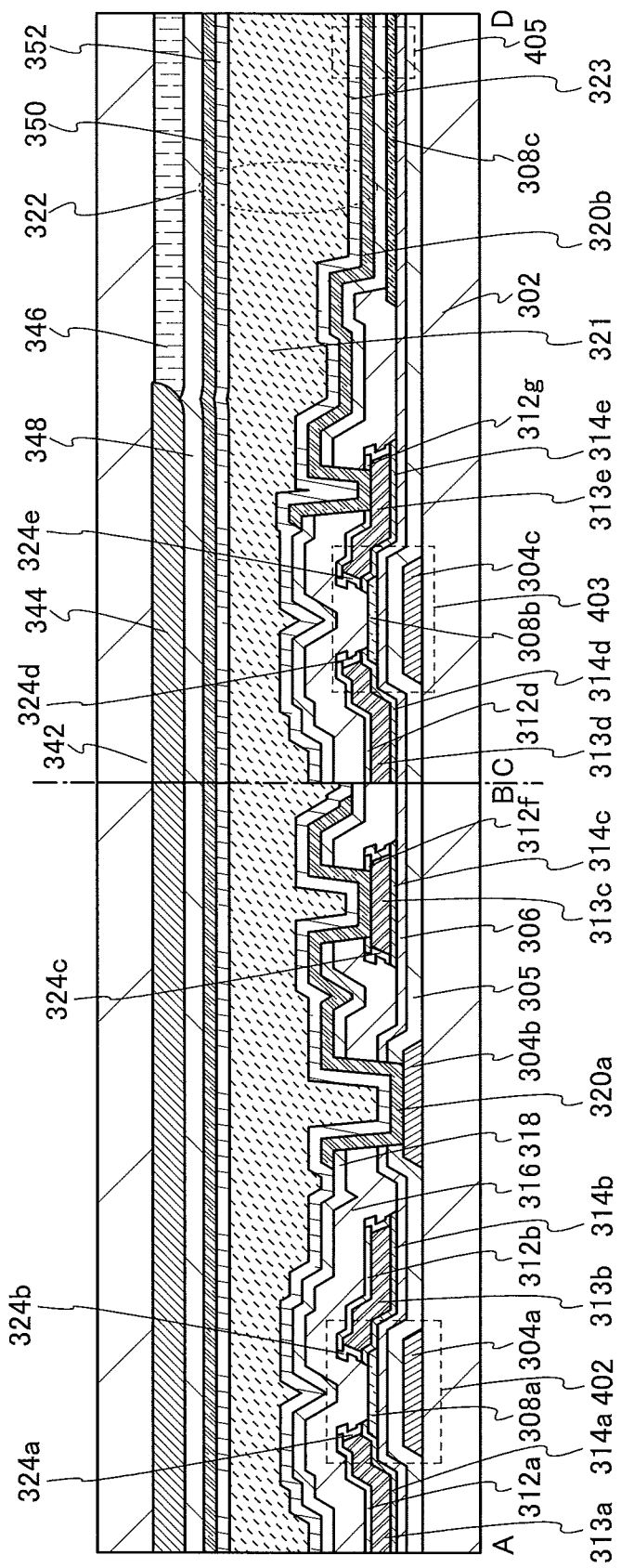
FIG. 11 is a cross-sectional view illustrating a semiconductor device of one embodiment of the present invention.

FIG. 11 shows a cross section taken along dashed-dotted line C-D in FIG. 10. Note that a cross section A-B in FIG. 11 is a cross-sectional view of a driver circuit portion (a top view thereof is omitted) including the scan line driver circuit 404 and the signal line driver circuit 406. In this embodiment, as an example of a semiconductor device having a display function, a liquid crystal display device of a vertical electric field mode is described.

In the display device described in this embodiment, a liquid crystal element 322 is provided between a pair of substrates (a substrate 302 and a substrate 342).

The liquid crystal element 322 includes the light-transmitting conductive layer 320b over the substrate 302, films controlling alignment (hereinafter referred to as alignment films 323 and 352), a liquid crystal layer 321, and a conductive layer 350. Note that the light-transmitting conductive layer 320b functions as one electrode of the liquid crystal element 322, and the conductive layer 350 functions as the other electrode of the liquid crystal element 322.

Thus, "liquid crystal display device" refers to a device including a liquid crystal element. The liquid crystal display device includes a driver circuit for driving a plurality of pixels, for example. The liquid crystal display device may also be referred to as a liquid crystal module including a control circuit, a power supply circuit, a signal generation circuit, a backlight module, and the like provided over another substrate.

In the driver circuit portion, a transistor 402 includes a conductive layer 304a functioning as a gate electrode, insulating films 305 and 306 functioning as a gate insulating film, a semiconductor layer 308a in which a channel region is formed, and conductive layers 313a and 313b and first protective layers 314a and 314b functioning as a source electrode and a drain electrode. The semiconductor layer 308a is formed over the gate insulating film. Second protective layers 312a and 312b are provided over the top surfaces of the conductive layers 313a and 313b. Third protective layers 324a and 324b are provided on the side surfaces of the conductive layers 313a and 313b. Note that when the second protective layers 312a and 312b and/or the third protective layers 324a and 324b are formed using light-transmitting conductive layers, the second protective layers 312a and 312b and/or the third protective layers 324a and 324b function as the source electrode and the drain electrode and are included in the transistor 402.

In the pixel portion, the transistor 403 includes the conductive layer 304c functioning as a gate electrode, the insulating films 305 and 306 collectively functioning as a gate insulating film, the semiconductor layer 308b which is formed over the gate insulating film and in which a channel region is formed, and the conductive layers 313d and 313e and the first protective layers 314d and 314e functioning as a source electrode and a drain electrode. The semiconductor layer 308b is provided over the gate insulating film. Second protective layers 312d and 312g are provided on the top surfaces of the conductive layers 313d and 313e, respectively. Third protective layers 324d and 324e are provided on the side surfaces of the conductive layers 313d and 313e, respectively. Insulating films 316 and 318 are provided as protective layers over the second protective layers 312d and 312g. Note that when the second protective layers 312d and 312g and/or the third protective layers 324d and 324e are formed using light-transmitting conductive layers, the second protective layers 312d and 312g and/or the third protective layers 324d and 324e function as the source electrode and the drain electrode and are included in the transistor 403.

The light-transmitting conductive layer 320b functioning as a pixel electrode is connected to the conductive layer 313e through an opening provided in the second protective layer 312g, the insulating film 316, and the insulating film 318.

Furthermore, the capacitor 405 includes the conductive layer 308c functioning as one electrode of the capacitor 405, the insulating film 318 functioning as a dielectric film, and the light-transmitting conductive layer 320b functioning as the other electrode of the capacitor 405. The conductive layer 308c is provided over the gate insulating film.

In the driver circuit portion, a conductive layer 304b formed at the same time as the conductive layers 304a and 304c and a conductive layer 313c formed at the same time as the conductive layers 313a, 313b, 313d, and 313e are connected to each other via a light-transmitting conductive layer 320a formed at the same time as the light-transmitting conductive layer 320b.

The conductive layer 304b and the light-transmitting conductive layer 320a are connected to each other through an opening provided in the insulating film 306 and the insulating film 316. Furthermore, the conductive layer 313c and the light-transmitting conductive layer 320a are connected to each other through an opening provided in a second protective layer 312f, the insulating film 316, and the insulating film 318. Note that the side surface of the conductive layer 313c is covered with the third protective layer 324c.

Here, components of the display device illustrated in FIG. 11 are described below.

The conductive layers 304a, 304b, and 304c are formed over the substrate 302. The conductive layer 304a functions as a gate electrode of the transistor in the driver circuit portion. The conductive layer 304c is formed in the pixel portion 401 and functions as a gate electrode of the transistor in the pixel portion. The conductive layer 304b is formed in the scan line driver circuit 404 and connected to the conductive layer 313c.

The substrate 302 can be formed using the material of the substrate 102 described in Embodiment 1, as appropriate.

The conductive layers 304a, 304b, and 304c can be formed using the material and the formation method of the gate electrode 104 which are described in Embodiment 1, as appropriate.

The insulating films 305 and 306 are formed over the substrate 302 and the conductive layers 304a, 304c, and 304b. The insulating films 305 and 306 function as a gate insulating film of the transistor in the driver circuit portion and a gate insulating film of the transistor in the pixel portion 401.

The insulating film 305 is preferably formed using the nitride insulating film which is described as the gate insulating film 106 in Embodiment 1. The insulating film 306 is preferably formed using the oxide insulating film which is described as the gate insulating film 108 in Embodiment 1.

The semiconductor layers 308a and 308b and the conductive layer 308c are formed over the insulating film 306. The semiconductor layer 308a is formed in a position overlapping with the conductive layer 304a and functions as a channel region of the transistor in the driver circuit portion. The semiconductor layer 308b is formed in a position overlapping with the conductive layer 304c and functions as a channel region of the transistor in the pixel portion. The conductive layer 308c functions as one electrode of the capacitor 405.

The semiconductor layers 308a and 308b and the conductive layer 308c can be formed using the material and the formation method of the semiconductor layer 110 which are described in Embodiment 1, as appropriate.

The conductive layer 308c is a layer containing a metal element similar to the semiconductor layers 308a and 308b and contains impurities. An example of the impurities is hydrogen. Instead of hydrogen, as the impurity, boron, phosphorus, tin, antimony, a rare gas element, an alkali metal, an alkaline earth metal, or the like may be included.

Both the semiconductor layers 308a and 308b and the conductive layer 308c are formed over the gate insulating film but differ in impurity concentration. Specifically, the conductive film 308c has a higher impurity concentration than the semiconductor layers 308a and 308b. For example, the concentration of hydrogen contained in each of the oxide semiconductor layers 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive layer 308c is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the conductive layer 308c is greater than or equal to 2 times, preferably greater than or equal to 10 times those in the semiconductor layers 308a and 308b.

The conductive layer 308c has lower resistivity than the semiconductor layers 308a and 308b. The resistivity of the conductive layer 308c is preferably greater than or equal to $1 \times 10^{-8}$ times and less than or equal to $1 \times 10^{-1}$ times the resistivity of the oxide semiconductor layers 308a and 308b. The resistivity of the conductive layer 308c is typically greater than or equal to $1 \times 10^{-3}$ Ωcm and less than $1 \times 10^{4}$ Ωcm, preferably greater than or equal to $1 \times 10^{-3}$ Ωcm and less than $1 \times 10^{-1}$ Ωcm.

The semiconductor layers 308a and 308b are in contact with the films each formed using a material which can improve characteristics of the interface with the semiconductor layer, such as the insulating film 306 and the insulating film 316. Thus, the semiconductor layers 308a and 308b function as semiconductors, so that the transistors including the semiconductor layers 308a and 308b have excellent electrical characteristics.

Figure 14A:
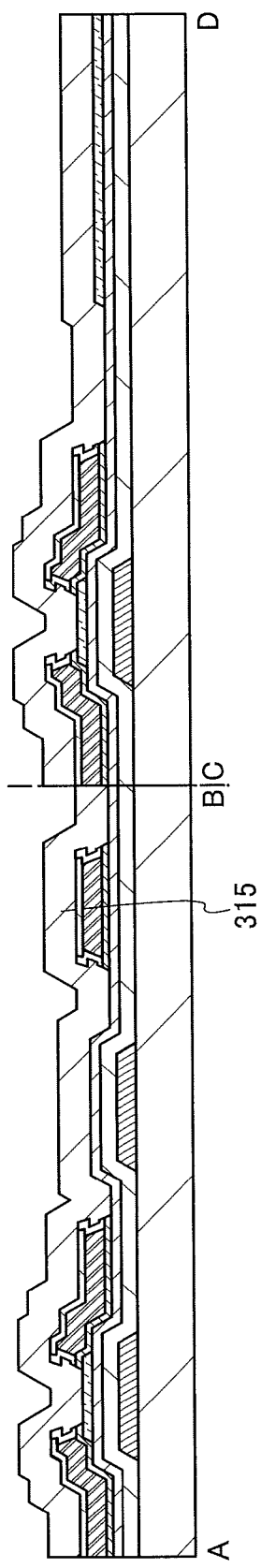
FIGS. 14A to 14C are cross-sectional views illustrating one embodiment of a method of manufacturing a semiconductor device.
Figure 14B:
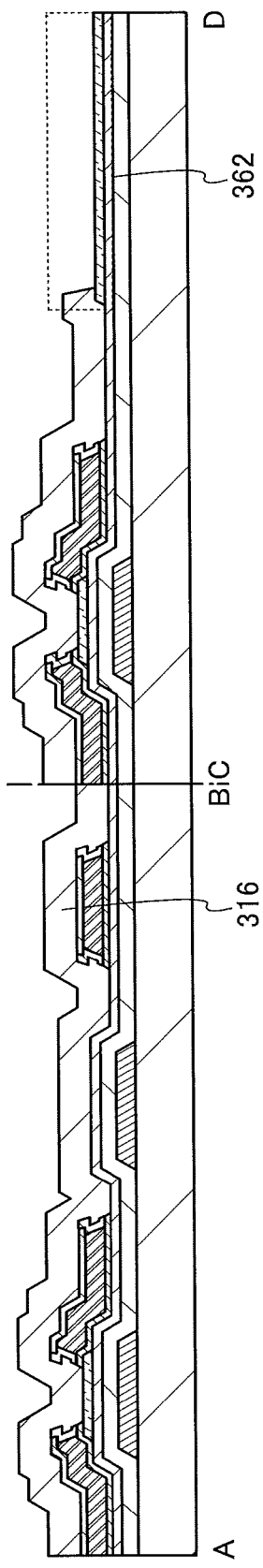

The conductive layer 308c is in contact with the insulating film 318 in the opening 362 (see FIG. 14A). The insulating film 318 is formed using a material which prevents diffusion of impurities from the outside, such as water, alkali metal, and alkaline earth metal, into the semiconductor layer, and the material further includes hydrogen. Thus, when hydrogen in the insulating film 318 is diffused into the semiconductor layer formed at the same time as the semiconductor layers 308a and 308b, hydrogen is bonded to oxygen and electrons serving as carriers are generated in the semiconductor layer. Furthermore, when the insulating film 318 is formed by a plasma CVD method or a sputtering method, the semiconductor layers 308a and 308b are exposed to plasma, so that oxygen vacancies are formed. When hydrogen contained in the insulating film 318 enters the oxygen vacancies, electrons serving as carriers are formed. As a result, the conductivity of the semiconductor layer is increased, so that the semiconductor layer becomes the conductive layer 308c. In other words, the conductive layer 308c can be referred to as an oxide semiconductor layer with high conductivity or a metal oxide film with high conductivity.

Note that one embodiment of the present invention is not limited thereto, and it is possible that the conductive layer 308c be not in contact with the insulating film 318 depending on circumstances.

One embodiment of the present invention is not limited thereto, and the conductive layer 308c may be formed by a different process from that of the semiconductor layer 308a or the semiconductor layer 308b depending on circumstances. In that case, the conductive layer 308c may include a different material from that of the semiconductor layers 308a and 308b. For example, the conductive layer 308c may be formed using indium oxide containing tungsten oxide, indium zinc oxide containing tungsten oxide, indium oxide containing titanium oxide, indium tin oxide containing titanium oxide, indium tin oxide, indium zinc oxide, indium tin oxide containing silicon oxide, or the like.

In the semiconductor device shown in this embodiment, one electrode of the capacitor is formed at the same time as the semiconductor layer of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced. Furthermore, because the pair of electrodes has a light-transmitting property, the capacitor has a light-transmitting property. As a result, the area occupied by the capacitor can be increased and the aperture ratio in a pixel can be increased.

The first protective layers 314a, 314b, 314d, and 314e and a first protective layer 314c can be formed using the material and the formation method of the first protective layers 112a and 112b which are described in Embodiment 1, as appropriate.

The conductive layers 313a, 313b, 313c, 313d, and 313e can be formed using the material and the formation method of the conductive layers 114a and 114b constituting the pair of electrodes 116a and 116b which are described in Embodiment 1, as appropriate.

The second protective layers 312a, 312b, 312f, 312d, and 312g can be formed using the material and the formation method of the second protective layers 118a and 118b which are described in Embodiment 1, as appropriate.

The third protective layers 324a, 324b, 324c, 324d, and 324e can be formed using the material and the formation method of the third protective layers 120a and 120b which are described in Embodiment 1, as appropriate.

The insulating films 316 and 318 are framed over the insulating film 306, the semiconductor layers 308a and 308b, the conductive layer 308c, the first protective layers 314a, 314b, 314c, 314d, and 314e, the conductive layers 313a, 313b, 313c, 313d, and 313e, the second protective layers 312a, 312b, 312f, 312d, and 312g, and the third protective layers 324a, 324b, 324c, 324d, and 324e. For the insulating film 316, as the insulating film 306, a material which can improve characteristics of the interface with the semiconductor layers 308a and 308b is preferably used. The insulating film 316 can be formed using a material and a formation method which are similar to those of the oxide insulating film which are described in at least Embodiment 1, as appropriate.

For the insulating film 318, as the insulating film 305, a material which prevents diffusion of impurities from the outside, such as water, alkali metal, and alkaline earth metal, into the semiconductor layer is preferably used. A nitride insulating film of silicon nitride, silicon nitride oxide, aluminum nitride, aluminum nitride oxide, or the like can be used as appropriate. The thickness of the insulating film 318 is greater than or equal to 30 nm and less than or equal to 200 nm, preferably greater than or equal to 50 nm and less than or equal to 150 nm. The insulating film 318 can be formed as appropriate by a sputtering method, a CVD method, or the like.

Furthermore, the light-transmitting conductive layers 320a and 320b are provided over the insulating film 318. The light-transmitting conductive layer 320a is electrically connected to the conductive layer 313a through an opening 364a (see FIG. 15A) and electrically connected to the conductive layer 313c through an opening 364b (see FIG. 15A). That is, the light-transmitting conductive layer 320a functions as a connection electrode which connects the conductive layer 304a and the conductive layer 313c. The light-transmitting conductive layer 320b is electrically connected to the conductive layer 313e through an opening 364c (see FIG. 15A) and functions as the pixel electrode of a pixel. Furthermore, the light-transmitting conductive layer 320b can function as one of the pair of electrodes of the capacitor.

In order to form a connection structure in which the conductive layer 304a is in direct contact with the conductive layer 313c, it is necessary to form a mask by patterning for forming an opening in the insulating films 305 and 306 before the conductive layer 313c is formed. However, the photomask is not needed to obtain the connection structure in FIG. 11. When the conductive layer 304a is connected to the conductive layer 313c with the light-transmitting conductive layer 320a as shown in FIG. 11, a connection portion where the conductive layer 304b is in direct contact with the conductive layer 313c is unnecessary. Consequently, the number of photomasks can be reduced by one. That is, steps of forming a semiconductor device can be reduced.

For the light-transmitting conductive layers 320a and 320b, a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide containing silicon oxide can be used.

A film having a colored property (hereinafter referred to as a colored film 346) is formed on the substrate 342. The colored film 346 functions as a color filter. Furthermore, a light-blocking film 344 adjacent to the colored film 346 is formed on the substrate 342. The light-blocking film 344 functions as a black matrix. The colored film 346 is not necessarily provided in the case where the display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive layer 350 is formed on the insulating film 348. The conductive layer 350 functions as the other of the pair of electrodes of the liquid crystal element in the pixel portion. Note that an insulating film that functions as an alignment film may be additionally formed on the light-transmitting conductive layers 320a and 320b and the conductive layer 350.

The liquid crystal layer 321 is formed between the light-transmitting conductive layers 320a and 320b and the conductive layer 350. The liquid crystal layer 321 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive layers 320a and 320b and the conductive layer 350 to maintain the thickness of the liquid crystal layer 321 (also referred to as a cell gap).

A method of manufacturing an element portion over the substrate 302 in the semiconductor device illustrated in FIG. 11 is described with reference to FIGS. 12A to 12C, FIGS. 13A to 13C, FIGS. 14A to 14C, and FIGS. 15A to 15C.

First, the substrate 302 is prepared. Here, a glass substrate is used as the substrate 302.

Then, a conductive film is formed over the substrate 302 and processed into a desired shape to form the conductive layers 304a, 304b, and 304c. The conductive layers 304a, 304b, and 304c can be formed in such a manner that a mask is formed in the desired regions by first patterning and regions not covered with the mask are etched (see FIG. 12A).

The conductive layers 304a, 304b, and 304c can be typically formed by an evaporation method, a CVD method, a sputtering method, a spin coating method, or the like.

Next, the insulating film 305 is formed over the substrate 302 and the conductive layers 304a, 304b, and 304c, and then the insulating film 306 is formed over the insulating film 305 (see FIG. 12A).

The insulating films 305 and 306 can be formed by a sputtering method, a CVD method, or the like. Note that it is preferable that the insulating films 305 and 306 be formed in succession in a vacuum, in which case entry of impurities is suppressed.

Next, a semiconductor film 307 is formed over the insulating film 306 (see FIG. 12B).

The semiconductor film 307 can be formed by a sputtering method, a coating method, a pulsed laser deposition method, a laser ablation method, or the like.

Next, the semiconductor film 307 is processed into a desired shape to form the island-shaped semiconductor films 308a, 308b, and 308d. The semiconductor layers 308a, 308b, and 308d can be formed in such a manner that a mask is formed in a desired region by second patterning and regions not covered with the mask are etched. For the etching, dry etching, wet etching, or a combination of both can be employed (see FIG. 12C).

First heat treatment may be performed next. For the first heat treatment, conditions similar to those for the first heat treatment described in Embodiment 1 are used. Impurities such as hydrogen and water can be removed from the insulating film 306 and the semiconductor layers 308a, 308b, and 308d. The first heat treatment may be performed before the semiconductor film is etched.

Next, a first protective film 309, a conductive film 310, and a second protective film 311 are sequentially formed over the insulating film 306 and the semiconductor layers 308a, 308b, and 308d (see FIG. 13A).

The first protective film 309 and the conductive film 310 can be formed by a sputtering method, for example. The second protective film 311 can be formed by a CVD method, a sputtering method, or the like, for example.

Next, the second protective film 311 is processed into a desired shape to form the second protective layers 312a, 312b, 312c, 312d, and 312e. The second protective layers 312a, 312b, 312c, 312d, and 312e can be formed in such a manner that a mask is formed in the desired regions by third patterning and regions not covered with the mask are etched. After that, the mask is removed (see FIG. 13B).

Next, the conductive film 310 is processed into a desired shape to form the conductive layers 313a, 313b, 313c, 313d, and 313e by using the second protective layers 312a, 312b, 312c, 312d, and 312e as masks to etch regions not covered with the masks.

Then, a third protective film (not shown) is formed over the second protective layers 312a, 312b, 312c, 312d, and 312e so as to cover the side surfaces of the conductive layers 313a, 313b, 313c, 313d, and 313e. The third protective film and the first protective film 309 are processed by anisotropic etching into the third protective layers 324a, 324b, 324c, 324d, and 324e and the first protective layers 314a, 314b, 314c, 314d, and 314e (see FIG. 13C). Note that the surfaces of the second protective layers 312a, 312b, 312c, 312d, and 312e are etched by the anisotropic etching and the thicknesses are thus reduced.

The third protective film can be formed by a CVD method, a sputtering method, or the like, for example.

Then, an insulating film 315 is formed so as to cover the insulating film 306, the semiconductor layers 308a, 308b, and 308d, the first protective layers 314a, 314b, 314c, 314d, and 314e, the conductive layers 313a, 313b, 313c, 313d, and 313e, the second protective layers 312a, 312b, 312c, 312d, and 312e, and the third protective layers 324a, 324b, 324c, 324d, and 324e (see FIG. 14A).

The insulating film 315 can be formed with a structure similar to the structure of the insulating film 122 in Embodiment 1, and an oxide insulating film is preferably used.

Next, the insulating film 315 is processed into desired regions, so that the insulating film 316 and the opening 362 are formed. The insulating film 315 and the opening 362 can be formed in such a manner that a mask is formed in a desired region by fourth patterning and regions not covered with the mask are etched (see FIG. 14B).

The opening 362 is formed so as to expose the surface of the semiconductor layer 308d. An example of a formation method of the opening 362 includes, but not limited to, a dry etching method. Alternatively, a wet etching method or a combination of dry etching and wet etching can be employed for formation of the opening 362.

After that, second heat treatment may be performed. Part of oxygen contained in the insulating film 315 can be moved to the semiconductor layers 308a and 308b, so that oxygen vacancies in the semiconductor layers 308a and 308b can be reduced. Consequently, the amount of oxygen vacancies in the semiconductor layers 308a and 308b can be reduced.

Figure 14C:
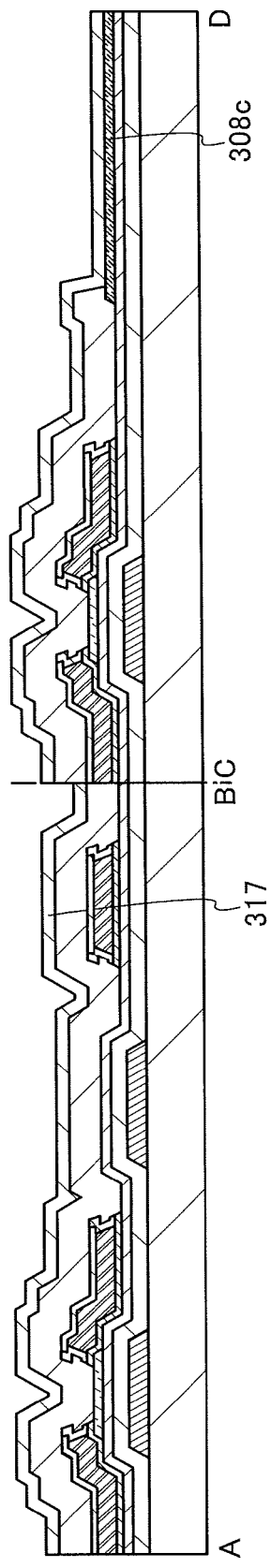

Next, an insulating film 317 is formed over the insulating film 316 and the semiconductor film 308d (see FIG. 14C).

The insulating film 317 is preferably formed using a material that can prevent an external impurity such as oxygen, hydrogen, water, alkali metal, or alkaline earth metal, from diffusing into the multilayer film, more preferably formed using the material including hydrogen, and typically an inorganic insulating material containing nitrogen, such as a nitride insulating film, can be used. The insulating film 317 can be formed by a CVD method, a sputtering method, or the like.

When the insulating film 317 is formed by a CVD method, a sputtering method, or the like, the semiconductor layer 308d is exposed to plasma, so that oxygen vacancies are generated in the semiconductor layer 308d. The insulating film 317 is a film formed using a material that prevents diffusion of impurities from the outside, such as water, alkali metal, and alkaline earth metal, into the semiconductor layer, and the material further includes hydrogen. Thus, when hydrogen in the insulating film 317 is diffused into the semiconductor layer 308d, hydrogen is bonded to oxygen vacancies and electrons serving as carriers are generated in the semiconductor layer 308d. Alternatively, when hydrogen in the insulating film 317 is diffused into the semiconductor layer 308d, hydrogen is bonded to oxygen and electrons serving as carriers are formed in the semiconductor layer 308d. As a result, the conductivity of the semiconductor layer 308d is increased, so that the semiconductor layer 308d becomes the conductive layer 308c.

The insulating film 317 is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the insulating film 317 is formed at a high temperature, a phenomenon in which oxygen is released from the semiconductor layers 308a and 308b and the carrier concentration is increased is caused in some cases; therefore, the upper limit of the temperature is a temperature at which the phenomenon is not caused.

Note that when the semiconductor layer 308d is exposed to plasma containing a rare gas and hydrogen before the insulating film 317 is formed, oxygen vacancies can be formed in the semiconductor layer 308d and hydrogen can be added to the semiconductor layer 308d. As a result, electrons serving as carriers can be further increased in the semiconductor layer 308d, and the conductivity of the conductive layer 308c can be further increased.

Next, the insulating film 317 and the second protective layers 312c and 312e are processed to form the insulating film 318, the second protective layers 312f and 312g, and the openings 364a, 364b, and 364c. Note that the insulating film 318 and the openings 364a, 364b, and 364c can be formed in such a manner that a mask is formed in a desired region by fifth patterning and regions not covered with the mask are etched (see FIG. 15A). When the second protective layers 312c and 312e are formed using a light-transmitting conductive film, the second protective layers 312c and 312e are not necessarily etched in the step.

The opening 364a is formed to expose the surfaces of the conductive layer 304a. The opening 364b is formed so as to expose the conductive layer 313c. The opening 364c is formed so as to expose the conductive layer 313e.

An example of a formation method of the openings 364a, 364b, and 364c includes, but not limited to, a dry etching method. Alternatively, a wet etching method or a combination of a dry etching method and a wet etching method can be employed for the formation method of the opening 364a, 364b, and 364c.

Then, a conductive film 319 is formed over the insulating film 318 so as to cover the openings 364a, 364b, and 364c (see FIG. 15B).

The conductive film 319 can be formed by a sputtering method, for example.

Then, the conductive film 319 is processed into a desired shape to form the light-transmitting conductive layers 320a and 320b. The light-transmitting conductive layers 320a and 320b can be formed in such a manner that a mask is formed in the desired regions by sixth patterning and regions not covered with the mask are etched (see FIG. 15C).

Through the above process, the pixel portion and the driver circuit portion that include transistors can be formed over the substrate 302. In the fabrication process described in this embodiment, the transistors and the capacitor can be formed at the same time by the first to sixth patterning, that is, with the six masks.

In this embodiment, the conductivity of the semiconductor layer 308d is increased by diffusing hydrogen contained in the insulating film 318 into the semiconductor layer 308d; however, the conductivity of the semiconductor layer 308d may be increased by covering the semiconductor layers 308a and 308b with a mask and adding impurities, typically, hydrogen, boron, phosphorus, tin, antimony, a rare gas element, alkali metal, alkaline earth metal, or the like to the semiconductor layer 308d. Hydrogen, boron, phosphorus, tin, antimony, a rare gas element, or the like is added to the semiconductor layer 308d by an ion doping method, an ion implantation method, or the like. To add alkali metal, alkaline earth metal, or the like to the semiconductor layer 308d, a solution that contains the impurity is added to the semiconductor layer 308d, for example.

Next, a structure that is formed over the substrate 342 provided so as to face the substrate 302 will be described below.

Figure 16A:
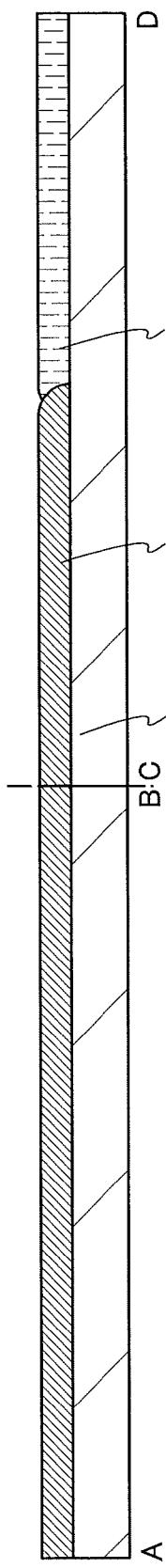
FIGS. 16A to 16C are cross-sectional views illustrating one embodiment of a method of manufacturing a semiconductor device.

First, the substrate 342 is prepared. For materials of the substrate 342, the materials that can be used for the substrate 302 can be referred to. Then, the light-blocking film 344 and the colored film 346 are formed over the substrate 342 (see FIG. 16A).

The light-blocking film 344 and the colored film 346 each are formed in a desired position with any of various materials by a printing method, an inkjet method, an etching method using a photolithography technique, or the like.

Figure 16B:
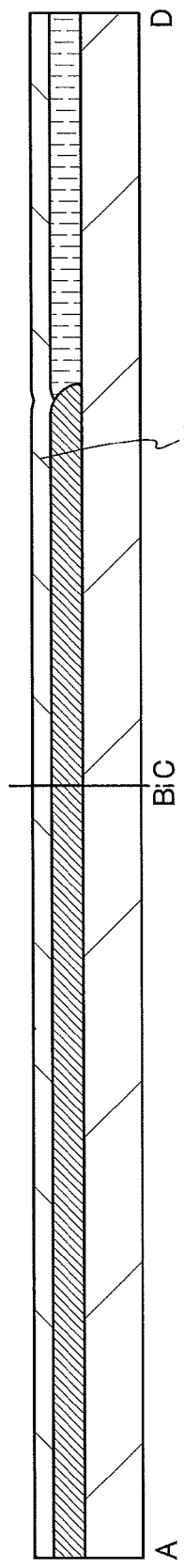

Then, the insulating film 348 is formed over the light-blocking film 344 and the colored film 346 (see FIG. 16B).

For the insulating film 348, an organic insulating film of an acrylic resin, an epoxy resin, polyimide, or the like can be used. With the insulating film 348, an impurity or the like contained in the coloring film 346 can be prevented from diffusing into the liquid crystal layer 321 side, for example. Note that the insulating film 348 is not necessarily formed.

Figure 16C:
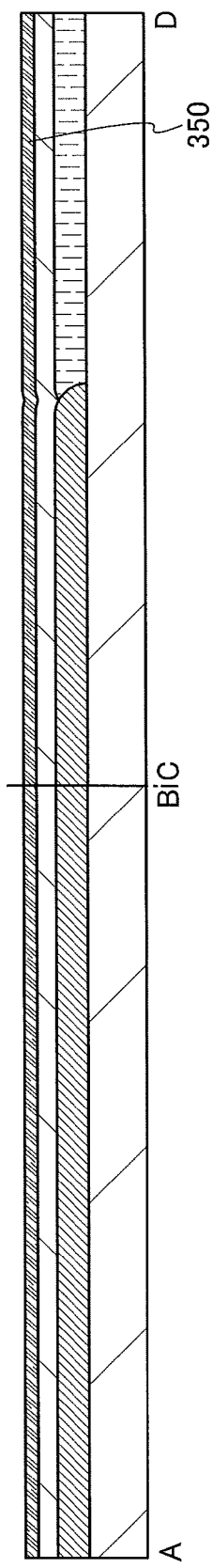

Then, the conductive layer 350 is formed over the insulating film 348 (see FIG. 16C). As the conductive layer 350, a material that can be used for the conductive film 319 can be used.

Through the above process, the structure formed over the substrate 342 can be formed.

Next, the alignment film 323 and the alignment film 352 are formed over the substrate 302 and the substrate 342 respectively, specifically, over the insulating film 318 and the light-transmitting conductive layers 320a and 320b formed over the substrate 302 and over the conductive layer 350 formed over the substrate 342. The alignment films 323 and 352 can be formed by a rubbing method, an optical alignment method, or the like. After that, the liquid crystal layer 321 is formed between the substrate 302 and the substrate 342. The liquid crystal layer 321 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 11 can be fabricated.

This embodiment can be combined with any of the other embodiments in this specification as appropriate.

Embodiment 6

In this embodiment, electronic devices in which a semiconductor device of one embodiment of the present invention can be incorporated will be described.

Examples of an electronic device using a semiconductor device of one embodiment of the present invention include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. Specific examples for such electronic appliances are illustrated in FIGS. 17A to 17E.

Figure 17A:
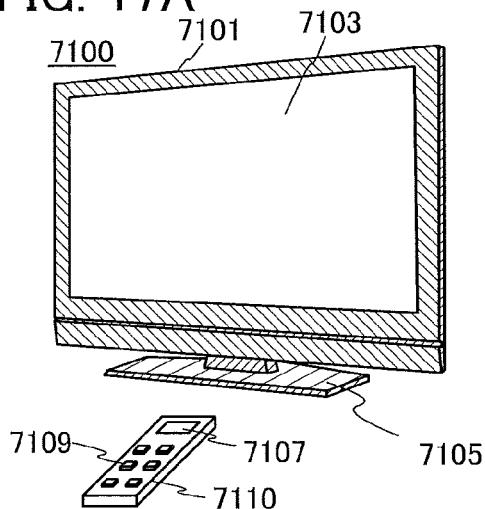
FIGS. 17A to 17E illustrates examples of an electronic device.

FIG. 17A illustrates an example of a television set. In a television set 7100, a display portion 7103 is incorporated in a housing 7101. Images can be displayed on the display portion 7103, and a semiconductor device can be used for the display portion 7103. Here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 17B:
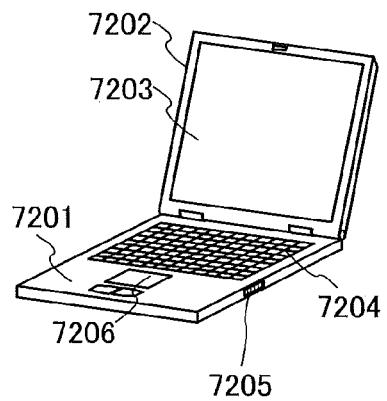

FIG. 17B illustrates a computer having a main body 7201, a housing 7202, a display portion 7203, a keyboard 7204, an external connection port 7205, a pointing device 7206, and the like. Note that this computer is manufactured by using the semiconductor device of one embodiment of the present invention for the display portion 7203.

Figure 17C:
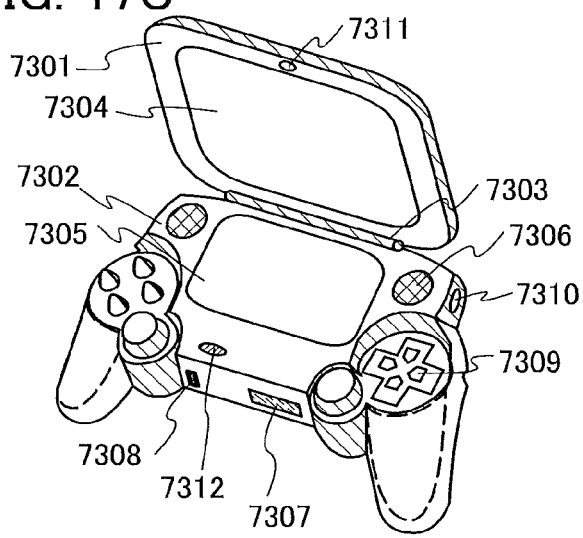

FIG. 17C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. The portable game console in FIG. 17C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game console can include other accessories as appropriate as long as the display device is used for at least one of the display portions 7304 and 7305. The portable game console in FIG. 17C has a function of reading a program or data stored in a recording medium to display it on the display portion, and a function of sharing information with another portable game console by wireless communication. The portable amusement machine illustrated in FIG. 17C can have various functions without limitation to the above.

Figure 17D:
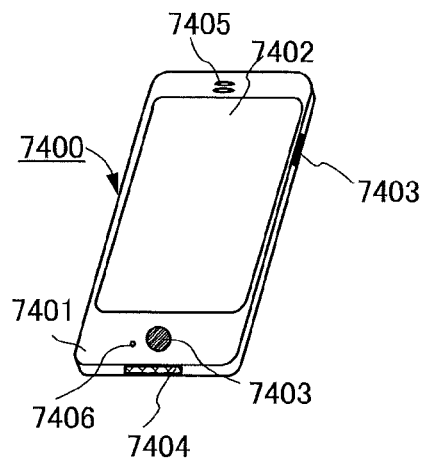

FIG. 17D shows an example of a cellular phone set. A cellular phone 7400 is provided with a display portion 7402 incorporated in a housing 7401, an operation button 7403, an external connection port 7404, a speaker 7405, a microphone 7406, and the like. The cellular phone 7400 is fabricated using the semiconductor device for the display portion 7402.

When the display portion 7402 of the mobile phone 7400 in FIG. 17D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Furthermore, by providing a backlight or a sensing light source which emits a near-infrared light in the display portion, an image of a finger vein, a palm vein, or the like can be taken.

Figure 17E:
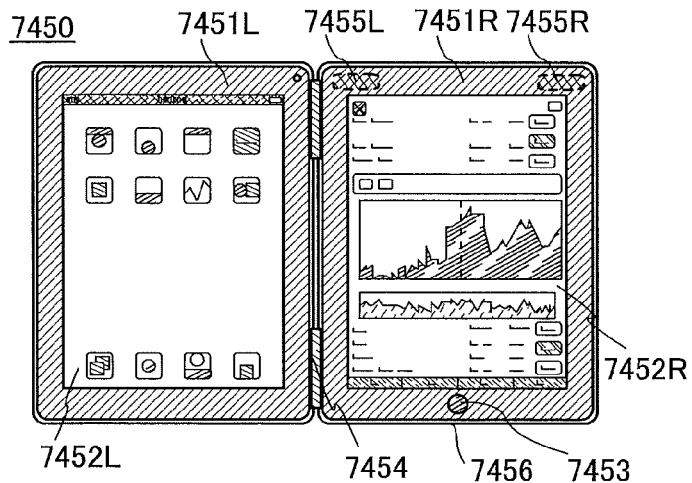

FIG. 17E illustrates an example of a folding computer. A folding computer 7450 includes a housing 7451L and a housing 7451R connected by hinges 7454. A folding computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for the installed program is selected by touch with a finger, so that the program can be started. Furthermore, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Furthermore, the computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, the orientation of the display screen can be automatically changed by determining the orientation of the computer 7450 (whether the computer 7450 is placed horizontally or vertically).

Furthermore, the computer 7450 can be connected to a network. The computer 7450 not only can display data on the Internet but also can be used as a terminal which controls another electronic device connected to the network from a distant place.

This embodiment can be combined with any of the other embodiments in this specification as appropriate.

EXAMPLE

In this example, a conductive layer covered with a first protective layer, a second protective layer, and a third protective layer is formed by the manufacturing method described in Embodiment 1.

In this example, according to the steps shown in FIGS. 2C and 2D and FIGS. 3A to 3C, over a semiconductor film over a substrate, an electrode composed of a first protective layer and a conductive layer, a second protective layer covering the top surface of the conductive layer, a third protective layer covering the side surfaces of the second protective layer and the conductive layer and the top surface of the first protective layer which is exposed from the conductive layer were formed. Details of a manufacturing method of a sample formed in this example will be described.

First, as the semiconductor film, a 100-nm-thick In—Ga—Zn oxide film was formed over the substrate. The In—Ga—Zn oxide film was formed by sputtering using an oxide target with an atomic ratio of In:Ga:Zn=1:1:1. The deposition conditions were as follows: atmosphere was oxygen (partial pressure: 50%); pressure, 0.6 Pa; electric power (AC), 2.5 kW; and substrate temperature, 170° C.

Then, as the first protective film, a 35-nm-thick titanium film was formed by sputtering. The deposition conditions were as follows: atmosphere was argon (flow rate: 100 sccm); pressure, 0.3 Pa; electric power (DC), 58 kW; and substrate temperature, 100° C.

Over the first protective film, as the conductive film, a 200-nm-thick copper film was formed by sputtering. The deposition conditions were as follows: atmosphere was argon (flow rate: 150 sccm); pressure, 0.9 Pa; electric power (DC), 20 kW; and substrate temperature, 80° C.

Then, over the conductive film, as the second protective film, a silicon nitride film was formed by CVD. The deposition conditions of the silicon nitride film were as follows: pressure was 200 Pa; electric power, 1000 W; and supply gas, mixed gas of silane (flow rate: 50 sccm), nitrogen (flow rate: 5000 sccm), and ammonia (flow rate: 100 sccm).

Figure 2D:
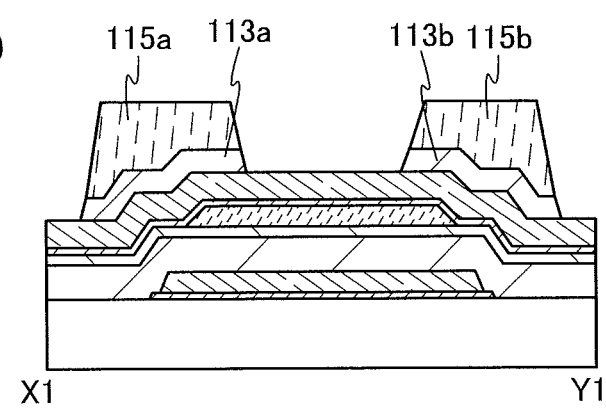

As in the step shown in FIG. 2D, a resist mask was formed over the second protective film and part of the second protective film was selectively etched using the resist mask, and consequently the second protective layer was formed. As in the step shown in FIG. 3A, part of the copper film, which is the conductive film, was selectively etched using the second protective layer as a mask to form the conductive layer (copper layer, in this example). The conductive film was etched by wet etching.

FIGS. 18A1 and 18A2 are cross-sectional images of the sample in this example obtained through the above steps.

Note that the cross-sectional images of FIGS. 18A1 and 18A2 are images taken with a scanning transmission electron microscope (STEM). FIGS. 18A1, 18B1, and 18C1 are phase contrast images (TE images). FIG. 18A2 is a Z contrast image (ZC image) of FIG. 18A1. FIG. 18B2 is a Z contrast image (ZC image) of FIG. 18B1. FIG. 18C2 is a Z contrast image (ZC image) of FIG. 18C1.

As seen from FIG. 18A2, the thickness of the silicon nitride layer (the second protective layer) formed over the copper layer (the conductive layer) was 198 nm, and the distance between the side surface of the copper layer and the side surface of the silicon nitride layer was 217 nm.

Next, as in the step shown in FIG. 3B, as the third protective film covering the top surface of the first protective film, the side surface of the conductive layer, and the top and side surfaces of the second protective layer, a silicon nitride film was formed by CVD. The deposition conditions of the silicon nitride film were as follows: pressure, 200 Pa; electric power, 1000 W; and supply gas, mixed gas of silane (flow rate: 50 sccm), nitrogen (flow rate: 5000 sccm), and ammonia (flow rate: 100 sccm).

FIGS. 18B1 and 18B2 are cross-sectional images of the sample in this example after the silicon nitride film used as the third protective film was formed.

In FIGS. 18B1 and 18B2, the boundary between the second and third protective films was unclear because the silicon nitride films as the second and third protective films were formed under the same deposition conditions in this example. However, as shown in FIG. 18B2, the thickness of the silicon nitride layer (the second protective layer and the third protective film) over the copper layer was 288 nm, and the distance between the side surface of the copper layer and the side surface of the silicon nitride layer was 266 nm. From this, as compared to FIG. 18A2, the third protective film was formed with high coverage, covering the side surface of the copper layer which was provided as the conductive layer and the top and side surfaces of the second protective layer.

Next, as in the step in FIG. 3C, the first and third protective films were etched in a self-aligned manner by anisotropic etching to form the first and third protective layers.

For this etching, dry etching using an inductively coupled plasma (ICP) etching method was employed. The etching conditions were as follows: etching gas was a mixed gas of boron trichloride and chlorine ($BCl_3$: $Cl_2$=750 sccm: 150 sccm); electric power, 0 W; bias power, 1500 W; pressure, 2.0 Pa; lower electrode temperature, 20° C.; and process time, 270 seconds. The etching rate in the etching conditions were 86.1 nm/min and 31.4 nm/min for a titanium film used as the first protective film and for a silicon nitride film used as the third protective film.

FIGS. 18C1 and 18C2 are cross-sectional images of the sample in this example.

As seen from FIGS. 18C1 and 18C2, a silicon nitride layer used as the second and third protective layers was formed so as to cover the side and top surfaces of the copper layer used as the conductive layer, and a titanium layer used as the first protective layer was formed on the bottom surface of the copper layer. As a result, the electrode structure of one embodiment of the present invention was obtained. The top surface of the titanium layer which is exposed from the copper layer was covered with the silicon nitride layer.

In FIG. 18C2, the thickness of the silicon nitride layer (the second and third protective layers) over the copper layer was 129 nm, and the distance between the side surface of the copper layer and the side surface of the silicon nitride layer was 260 nm.

When the electrode structure in this example is used as a pair of electrodes in contact with a semiconductor layer in a transistor, a highly reliable transistor can be manufactured.

This application is based on Japanese Patent Application serial no. 2013-130477 filed with Japan Patent Office on Jun. 21, 2013, the entire contents of which are hereby incorporated by reference.

What is claimed is:

1. A semiconductor device comprising:
a semiconductor layer;
a first protective layer;
a conductive layer;
a second protective layer; and
a third protective layer,
wherein a bottom surface of the first protective layer is in contact with the semiconductor layer,
wherein a bottom surface of the conductive layer is in contact with the first protective layer,
wherein a top surface of the conductive layer is in contact with the second protective layer,
wherein a side surface of the conductive layer is in contact with the third protective layer,
wherein the first protective layer has conductivity,
wherein the conductive layer contains copper, aluminum, gold, or silver, and
wherein a bottom edge of the third protective layer is in contact with an top edge of the first protective layer.

2. The semiconductor device according to claim 1, wherein a side surface of the second protective layer is in contact with the third protective layer.

3. The semiconductor device according to claim 1, wherein the side surface of the conductive layer is curved.

4. The semiconductor device according to claim 1, wherein the bottom surface of the conductive layer is entirely in contact with the first protective layer.

5. The semiconductor device according to claim 1, wherein the top surface of the conductive layer is entirely in contact with the second protective layer.

6. The semiconductor device according to claim 1, wherein the side surface of the conductive layer is entirely in contact with the third protective layer.

7. The semiconductor device according to claim 1, wherein the second protective layer and the third protective layer each are an insulator.

8. The semiconductor device according to claim 1, wherein a thickness of a region of the semiconductor layer in contact with the first protective layer is larger than a thickness of the other region of the semiconductor layer.

9. A semiconductor device comprising:
- a semiconductor layer;
- a first protective layer;
- a conductive layer;
- a second protective layer; and
- a third protective layer,
- wherein a bottom surface of the first protective layer is in contact with the semiconductor layer,
- wherein a top surface of the first protective layer is in contact with the conductive layer and the third protective layer,
- wherein a side surface of the conductive layer is in contact with the third protective layer,
- wherein a bottom surface of the second protective layer is in contact with the conductive layer and the third protective layer,
- wherein the first protective layer has conductivity,
- wherein the conductive layer contains copper, aluminum, gold, or silver, and
- wherein a bottom edge of the third protective layer is in contact with an top edge of the first protective layer.

10. The semiconductor device according to claim 9, wherein a side surface of the second protective layer is in contact with the third protective layer.

11. The semiconductor device according to claim 9, wherein the side surface of the conductive layer is curved.

12. The semiconductor device according to claim 9, wherein the bottom surface of the conductive layer is entirely in contact with the first protective layer.

13. The semiconductor device according to claim 9, wherein the top surface of the conductive layer is entirely in contact with the second protective layer.

14. The semiconductor device according to claim 9, wherein the side surface of the conductive layer is entirely in contact with the third protective layer.

15. The semiconductor device according to claim 9, wherein the second protective layer and the third protective layer each are an insulator.

16. The semiconductor device according to claim 9, wherein a thickness of a region of the semiconductor layer in contact with the first protective layer is larger than a thickness of the other region of the semiconductor layer.

* * * * *